United States Patent [19]

Takahashi et al.

[11] Patent Number: 5,059,559
[45] Date of Patent: Oct. 22, 1991

[54] METHOD OF ALIGNING AND BONDING TAB INNER LEADS

[75] Inventors: Michio Takahashi; Tooru Mita, both of Yokohama; Yasuo Nakagawa, Chigasaki; Toshimitsu Hamada, Yokohama; Hisafumi Iwata, Yokohama; Aizo Kaneda, Yokohama; Kouji Serizawa, Fujisawa; Hiroyuki Tanaka, Yokohama; Koichi Sugimoto, Hiratsuka; Toshihiko Sakai, Yokohama; Keizo Matsukawa, Kokubunji; Tsutomu Mimata, Akikawa, all of Japan

[73] Assignee: Hitachi, Ltd., Tokyo, Japan

[21] Appl. No.: 265,704

[22] Filed: Nov. 1, 1988

[30] Foreign Application Priority Data

Nov. 2, 1987 [JP] Japan .............................. 62-275799
Feb. 29, 1988 [JP] Japan ................................ 63-44416

[51] Int. Cl.$^5$ ......................................... H01L 21/603
[52] U.S. Cl. .................................. 437/220; 364/477; 219/56.1; 219/85.18
[58] Field of Search ................. 228/9, 6.2, 180.2, 4.5, 228/5.2, 103, 110; 358/101, 107; 364/477; 219/85.18; 437/206, 220

[56] References Cited

U.S. PATENT DOCUMENTS

| | | | |
|---|---|---|---|
| 3,891,822 | 6/1975 | Laub et al. | 219/85.18 |
| 3,920,949 | 11/1975 | Clawson et al. | 219/85.18 |
| 3,946,931 | 3/1976 | Bahnck et al. | 228/180.2 |
| 3,949,925 | 4/1976 | Keizer et al. | 228/180.2 |
| 3,958,740 | 5/1976 | Dixon | 228/180.2 |
| 4,010,885 | 3/1977 | Keizer et al. | 228/6.2 |
| 4,013,209 | 3/1977 | Angelucci et al. | 228/6.2 |
| 4,050,618 | 9/1977 | Angelucci et al. | 228/180.2 |
| 4,103,814 | 8/1978 | Nishioka | 228/9 |
| 4,140,265 | 2/1979 | Morino | 219/85.18 |
| 4,291,334 | 9/1981 | Mese et al. | 358/101 |
| 4,359,623 | 11/1982 | Fanning | 219/85.18 |
| 4,407,440 | 8/1983 | Manning | 228/6.2 |
| 4,434,347 | 2/1984 | Kurtz et al. | 219/85.18 |
| 4,605,833 | 8/1986 | Lindberg et al. | 219/85.18 |
| 4,815,001 | 3/1989 | Uthe et al. | 364/477 |
| 4,899,921 | 2/1990 | Bendat et al. | 358/101 |

FOREIGN PATENT DOCUMENTS

| | | |
|---|---|---|
| 58141 | of 0000 | Japan . |
| 57-160135 | 2/1982 | Japan . |
| 61-67925 | 5/1986 | Japan .................... 228/6.2 |
| 62-97341 | 6/1987 | Japan . |

Primary Examiner—Olik Chaudhuri
Assistant Examiner—David E. Graybill
Attorney, Agent, or Firm—Antonelli, Terry, Stout & Kraus

[57] ABSTRACT

The present invention relates to a multi-pin chip mounting method and apparatus based on a TAB (Tape Automated Bonding) system in which leads formed on a tape and bumps formed an IC chip are aligned with each other and compress-bonded to each other. An IC chip having bumps formed on a surface thereof and inner leads formed on a carrier tape are disposed opposite to each other at a bonding station. A position of the IC chip on a stage is detected through the inner leads at the bonding station to determine the amount of correction of position of the stage. The inner leads and the IC chip are aligned with each other on the basis of the determined correction amount and are thereafter bonded to each other.

21 Claims, 38 Drawing Sheets

FIG. 19a
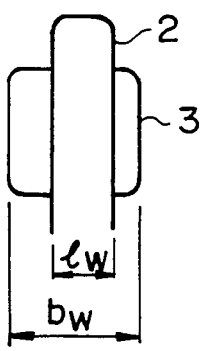
FIG. 19b-1
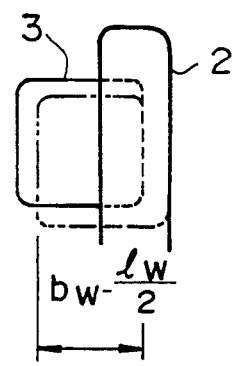
FIG. 19b-2
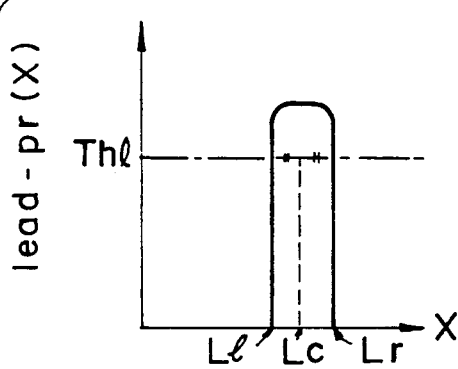
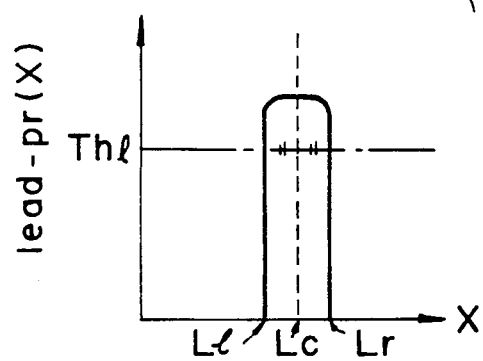
FIG. 19b-3
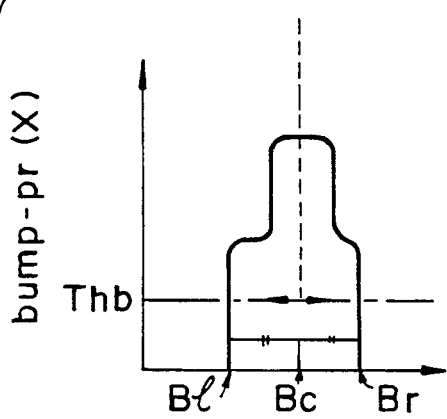
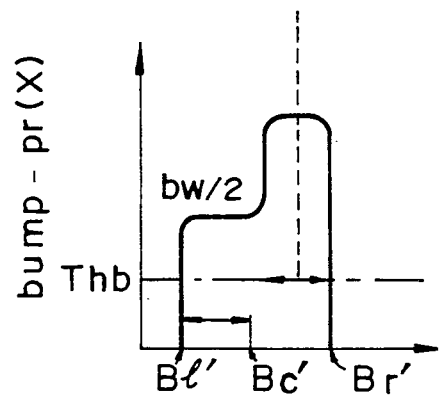

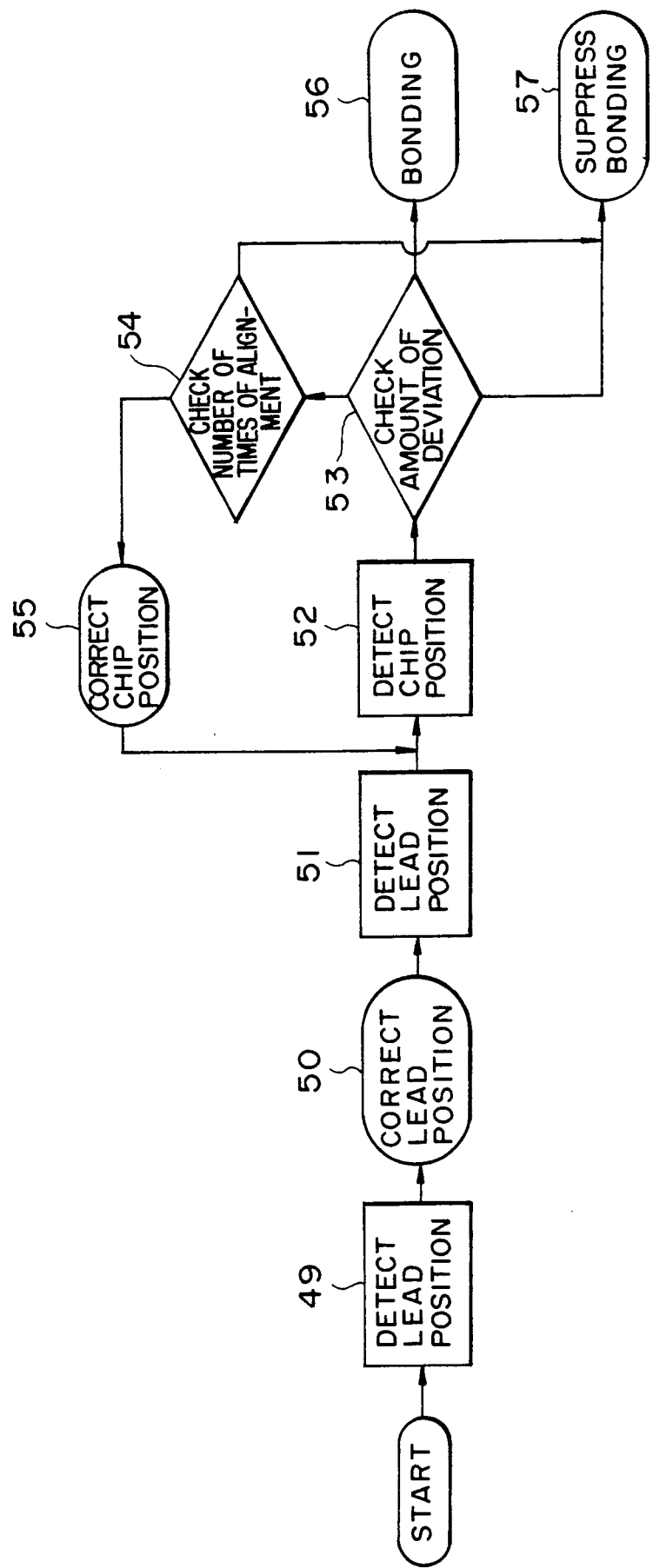

FIG. 24a
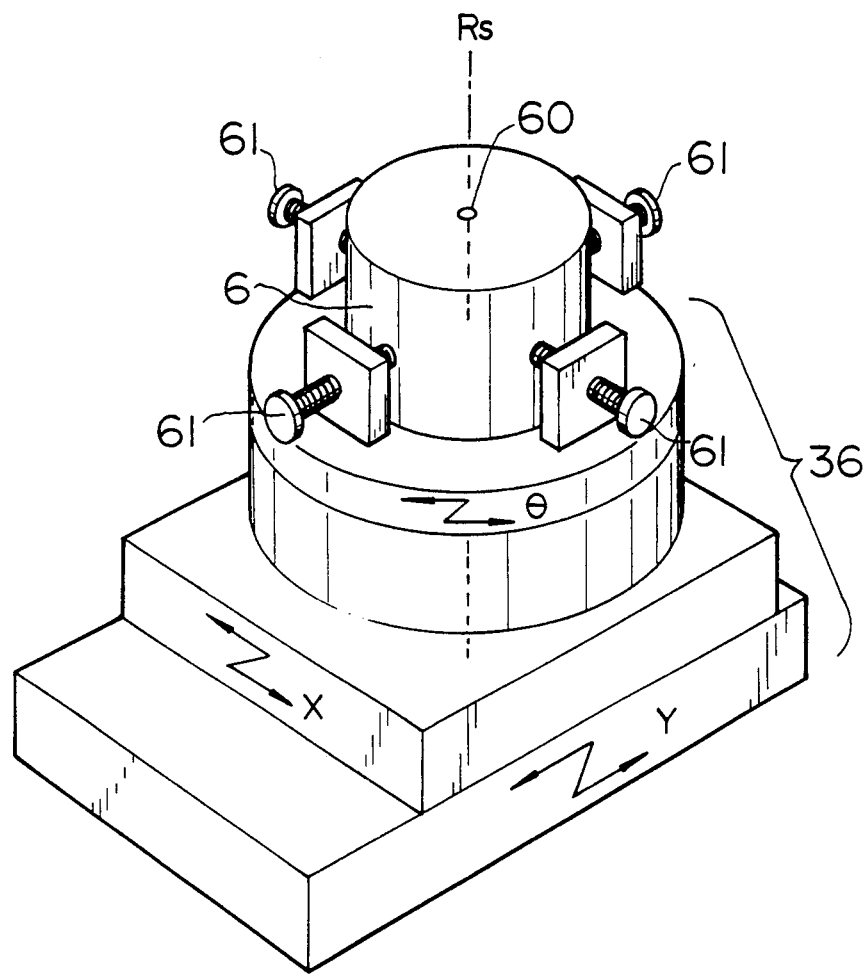
FIG. 24b
FIG. 24c
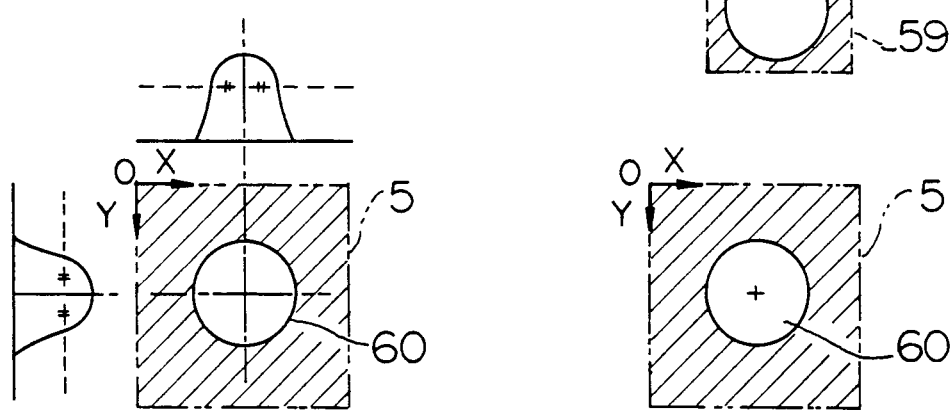

BEFORE BONDING

UPON BONDING

METHOD OF ALIGNING AND BONDING TAB INNER LEADS

BACKGROUND OF THE INVENTION

1. Field of the Invention

The present invention generally relates to a multi-pin chip mounting method and apparatus based on a TAB (Tape Automated Bonding) system in which leads formed on a tape and bumps formed on an IC chip are compress-bonded after alignment thereof with each other. More particularly, the present invention relates to a TAB inner lead bonding method and apparatus capable of aligning inner leads on a tape and bumps on a pellet (IC chip) with each other with high precision even in a state in which the inner leads and the bumps overlap each other. The present invention also relates to an alignment method, a bonding tool and a bonding stage which are used in such a bonding method or apparatus, and further relates to an IC which is manufactured by use of such a bonding method or apparatus.

2. Description of the Prior Art

The TAB system is a connection method in which inner leads 2 formed on a tape 1 and bumps 3 formed on an IC chip 4 are aligned with each other and thereafter compress-bonded collectively or en bloc.

Conventionally, a wire bonding system has been widely used as a connection method for IC chips. The minimum pitch between electrodes available in the wire bonding system is about 160 $\mu$m because of restriction in dimension of a bonding tool which effects thermocompression bonding of wires.

On the other hand, in IC chips such as LSI's for computers or driver IC's for liquid crystal displays having a multiplicity of input/output pins, demands for low chip cost and high packing density require the connection of 200 or more pins at a small pitch which is smaller than 160 $\mu$m. The wire bonding system cannot cope with such a requirement. To contrary, in the TAB system, since the leads are connected collectively, the above-mentioned limitation imposed for the dimentional restriction of the bonding tool does not exit, which makes it possible to connect a multiplicity of pins at a very small pitch.

In a general alignment method which has hitherto been employed in the TAB system, a position of the tape 1 and a position of the IC chip 4 are individually detected and the tape 1 and the IC chip 4 are thereafter moved to predetermined positions, respectively. The prior art disclosed by JP-B-62-27735 or JP-A-58-141 employs a method in which alignment is carried out by use of an alignment mark 65 provided at any one point on the tape 1 distanced from a bonding position or a method in which a specific form of an inner lead pattern is stored and the specific pattern is detected each time a new tape is supplied, to determine the amount of deviation of the position of the tape from a predetermined position, thereby correcting the position of the tape. Also for the alignment of the IC chip 4, a pattern in the IC chip 4 having a specific form is stored and the amount of deviation of the position of the IC chip 4 from a predetermined position is determined for every IC chip 4 to correct the position of the IC chip 4.

As for the alignment of the tape 1 and the chip 4 in a direction of rotation, there has been employed a method in which a station for mechanically correcting the direction of rotation of the IC chip 4 to effect correction for the amount of rotational deviation is interposed between a tray having the IC chip 4 before bonding which is mounted thereon and a position at which bonding is to be made.

In the conventional tape bonding apparatus, an impact load imposed on the IC chip upon bonding is suppressed by lowering a bonding tool with a low air pressure applied to the tool and changing the air pressure to a high value upon start of bonding, as has been disclosed by JP-A-53-105972. The change-over of the air pressure is synchronized with a bonding start position by means of a timing cam provided in a tool driving mechanism.

In the conventional bonding tool and stage, the thermocompression bonding of leads on a tape and bumps on an IC chip is effected by use of a bonding tool having a heater. The stage having the IC chip mounted thereon has a heater just below the IC chip in order to reduce the temperature upon thermocompression bonding.

In the above-mentioned TAB system, an advanced tendency to increase of the number of pins requires more minute bumps 3 and leads 2. Therefore, alignment with much higher precision is required. However, in the above-mentioned prior art, the positions of the tape 1 and the IC chip 4 are corrected in dependence upon a mechanical precision in response to the detection of the alignment mark 65 or the like existing at a position distanced from the bonding position, and the bonding is thereafter made immediately. Thus, the accuracy or precision of alignment includes the mechanical precision in addition to the precision of detection of the alignment mark or the like. Accordingly, there is a problem that no sufficient precision of alignment is obtainable for minute leads 2 and bumps 3 for multi-pin TAB.

Also, in the above-mentioned prior art, no consideration is paid to the fact that any variation or difference in hight of bumps to which bonding is to be made exists between individual IC chips. Therefore, in the case of an IC chip having low bumps, there is a large possibility that the change-over of the air pressure to its high value occurs before the tool is brought into contact with the bumps through leads, so that an impact pressure or force is imposed on the leads and bumps by the tool. As a result, there is a problem that the concentration of stress onto the leads and/or bumps takes place so that so-called bonding damages including the breakage of leads, the peeling-off of bumps and the wallop at lower layers of bumps are liable to generate.

Further, in the collective bonding, there is an unavoidable fear that a pressure is applied to only a small number of bumps upon start of pressure application because of the presence of a difference in height between bumps in an IC chip resulting from the precision of formation of the bumps. In the above-mentioned prior art, the use of the two-level air pressure intends to cause the tool to contact many bumps at a low pressure level. However, the larger the number of leads and bumps to be bonded to each other, the lower the resistance of each bump against a pressure required during application of the pressure. Therefore, also in the collective bonding, the above-mentioned bonding damages are liable to generate.

Furthermore, in the above-mentioned prior art, no consideration is paid to the presence of fluctuation or non-uniformity of the distribution of temperatures on the IC chip, especially, between at corner portions thereof and central portions of the sides thereof to be subjected to bonding. Moreover, there is a problem that Sn or solder applied on the surfaces of the leads on the tape adheres to the bottom surface of the bonding tool to cause a one-side contact phenomenon in which only one side of the bottom surface of the tool is brought into contact with the inner leads and the IC ship, thereby making it difficult to obtain a satisfactory connection state.

SUMMARY OF THE INVENTION

An object of the present invention is to provide a TAB inner lead bonding method and apparatus which can cope with multi-pin TAB and can attain high precision and high reliability and to provide an alignment method which is used in such a method and apparatus.

Another object of the present invention is to provide a bonding method and apparatus in which satisfactory bonding can be made even for an IC chip having insufficient precision of bump height without imposing an impact force and any excess pressure on the IC chip.

Still another object of the present invention is to provide a bonding tool and stage which has a uniform temperature distribution and to provide a bonding apparatus which can perform satisfactory bonding by use of such a bonding tool and stage.

A further object of the present invention is to provide an IC free of the cracking of chip and/or the breakage of leads.

According to one aspect of the present invention, an IC chip having bumps formed on a surface thereof and inner leads formed on a carrier tape are disposed opposite to each other at a bonding station, and a position of the IC chip on a stage is detected through the leads at the bonding station to calculate or determine the amount of correction for position of the stage so that the leads and the IC chip are aligned with each other. Thereafter, bonding is carried out.

According to another aspect of the present invention, an IC chip having bumps formed on a surface thereof and inner leads formed on a tape are disposed opposite to each other at a bonding position, and an overlapping state of the IC chip and the inner leads is optically enlarged. The enlarged image is detected by an imaging or image pickup element and the detected image is processed to determine the amount of deviation. A fine movement is given to an XYθ stage having the IC chip mounted thereon so that the inner leads and the IC chip are aligned with each other. After the alignment, while a positional relationship between the inner leads and the IC chip in X, Y and θ directions is fixed, the inner leads and the IC chip are compress-bonded to each other by a bonding tool.

According to still another aspect of the present invention, an IC chip having bumps formed on a surface thereof and inner leads formed on a tape are disposed opposite to each other at a bonding position, and the inner leads are made bright or conspicuous by oblique illumination obliquely intersecting the surfaces of the IC chip and the inner leads so that an inner lead position is determined from the bright or conspicuous pattern. On the other hand, the inner leads and bumps are detected as a dark pattern by fall-down illumination perpendicular to the surfaces of the IC chip and the inner leads. A position of the IC chip is determined by use of the dark pattern and the inner lead position determined from the bright pattern or image obtained by the oblique illumination.

According to a further aspect of the present invention, there are provided means for detecting a pressure acting between a tool and an IC chip, means for detecting the amount of movement of the tool, and means for changing a force for driving the tool, whereby bonding is carried out while changing the tool driving force on the basis of the results of detection obtained by the two detecting means.

According to a still further aspect of the present invention, a tool structure, a stage structure and a heater arrangement are contrived so that the temperature distribution at the bottom surface of a bonding tool becomes uniform upon thermocompression bonding of leads on a tape and bumps on an IC chip.

According to an additional aspect of the present invention, the bottom surface of a bonding tool is coated with a material which is an excellent thermal conductivity and an excellent abrasion-resistance and is chemically stable. Thermocompression bonding is made by use of such a bonding tool.

According to a still additional aspect of the present invention, a stage is provided with a function of absorbing an impact pressure or force from a bonding tool and a deviation of parallelity between a chip and the bottom surface of a bonding tool.

With the construction according to the one aspect of the present invention, the alignment of the tape, chip, tool and stage can be made by taking the optical axis of a lens or the like as a reference position. Therefore, bonding can be performed with high precision, thereby making it possible to cope with the increase in the number of pins of the IC.

In the construction according to the other aspect of the present invention, the fine movement of the stage in X, Y and θ directions enables the alignment of the leads and chip with high precision.

In the construction according to the still other aspect of the present invention, the use of the oblique illumination and the fall-down illumination allows alignment in a state in which the leads and the bumps overlap each other at the bonding position. Therefore, the precision upon alignment can be maintained also upon bonding as it is, thereby permitting highly precise alignment of the leads and the IC chip.

With the construction according to the further aspect of the present invention, the pressure acting between the tool and the IC chip upon bonding can be always detected and controlled. Also, the setting of the pressure in accordance to the state of contact of the tool with the bumps and the crushed state of the bumps during bonding is possible.

With the construction according to the still further aspect of the present invention, the distribution of temperatures at portions to be connected upon bonding can be made uniform. Therefore, any difference in connection states can be reduced so that highly reliable bonding can be made.

With the construction according to the additional aspect of the present invention, it is possible to prevent Sn or solder from adhering to the bottom surface of the bonding tool. Therefore, the inferiority of connection which may be caused by the contact of only one side of the bottom surface of the tool with the inner leads and the IC chip can be reduced, thereby improving the bonding yield.

With the construction according to the still additional aspect of the present invention, since the impact pressure from the tool upon bonding can be absorbed, any damage to the chip can be reduced, thereby allowing highly reliable bonding. Also, since the difference in parallelity (or degree of parallelism) between the chip and the bottom surface of the tool can be absorbed, a time required for adjustment can be shortened, thereby improving the through-put.

BRIEF DESCRIPTION OF THE DRAWINGS

FIGS. 18, 19a and 19b-1 to 19b-3 are views for explaining a bump position detecting method;

FIG. 20 is a block diagram showing the flow of an alignment operation;

FIGS. 24a to 24c are views for explaining an alignment mark provided on a chip stage;

DESCRIPTION OF THE PREFERRED EMBODIMENTS

Embodiments of the present invention will now be explained in detail.

First, the whole construction of and the principle of operation of an apparatus to which the present invention is applied, will be explained by virtue of FIGS. 1 and 3–9.

Figure 1:
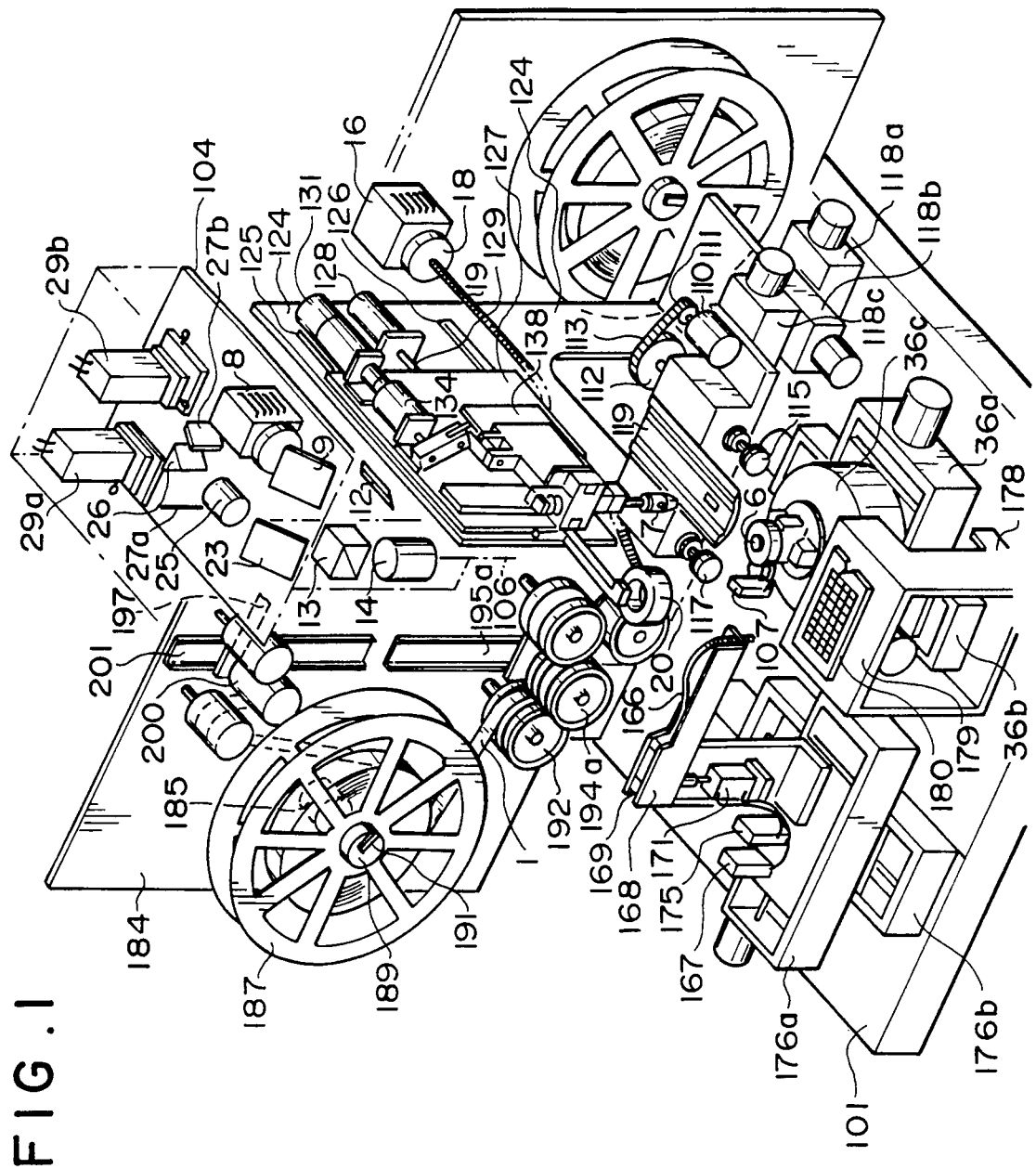
FIG. 1 is a view showing the whole construction of an embodiment of the present invention.
Figure 3:
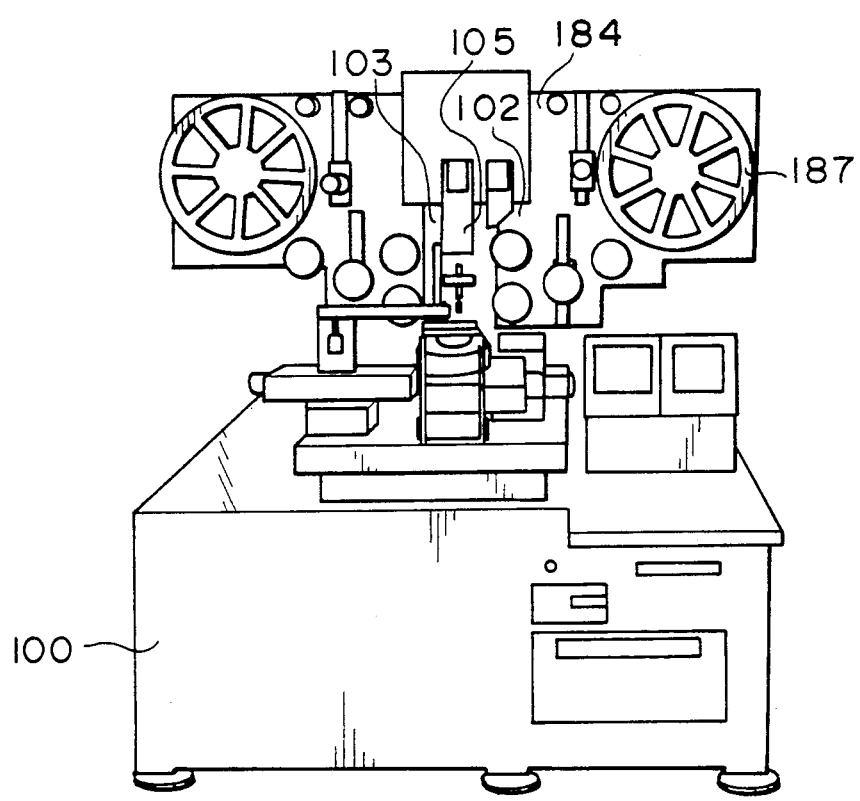
FIG. 3 is a schematic view showing the whole of an apparatus according to the present invention.

As shown in FIGS. 1 and 3, an optical system base 102 is mounted on the upper surface of a base 100 and an optical system plate 104 is fixed on the upper surface 103 of the base 102. An objective lens 14 is placed at one end portion 105 of the optical system plate 104. All of tables are disposed with a reference axis as which an optical axis 106 of the objective lens 14 is selected.

Light emanating from a light source 8 for fall-down illumination is projected onto inner leads 2 on a tape 1 through a mirror 9, a shutter 11, a mirror 12, a half-prism 13 and the objective lens 14. Similarly, light from a light source 16 for oblique illumination is projected onto an IC chip 4 through glass fibers 19 and a ring-like illumination device 20 by driving a rotary solenoid 17 to open a shutter 18. In each case, the reflected light passes through the objective lens 14, the half-prism 13, a mirror 23, a field lens 24 and a relay lens 25. Then, an image of one corner of the IC chip 4 is taken into a TV camera 29b through mirrors 27b and 28b. An image of the other corner of the IC chip 4 is taken into a TV camera 29a through mirrors 27a and 28a.

Figure 7:
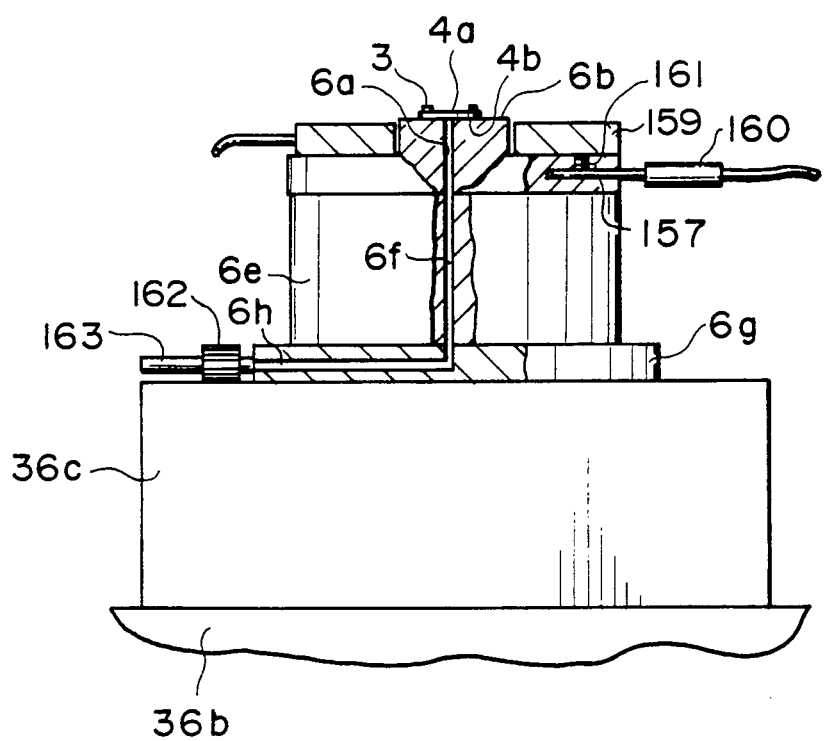
FIG. 7 is a cross section of a chip stage.

As shown in FIGS. 1, 7, etc., an XY$\theta$ stage 36 is mounted on the upper surface 101 of the base 100 and is composed of stages 36a and 36b which are driven by pulse motors to move forward/rearward and rightward/leftward in horizontal planes and a turn or rotary table 36c which makes a turning movement. A chip stage 6 is mounted on the XY$\theta$ stage 36 and has a suction hole 6a which is connected a vacuum pump (not shown) through a solenoid valve 107. A lower surface 4b of the IC chip 4 is held on a central portion 108 of the upper surface 6b of the chip stage 6 by virtue of suction through the hole 6a. In a state in which the IC chip 4 is held, the motor-driven stages 36a and 36b of the XY$\theta$ stage 36 operate such that the center 109 of rotation of the turn table 36c and the optical axis 106 of the objective lens 14 are aligned with each other. A sprocket 115 is mounted to one side of a sprocket base 114 and is held in a rotatable state. By rotating a pulse motor 110 to rotate the sprocket 115 through a pair of timing pulleys 111 and 112 and a timing belt 113, a tape 1 is transported by a constant pitch in a direction of arrow A by virtue of sprocket holes 1b provided in the tape 1. An idle sprocket 117 is rotatably held at the other side of the sprocket base 114.

Figure 4:
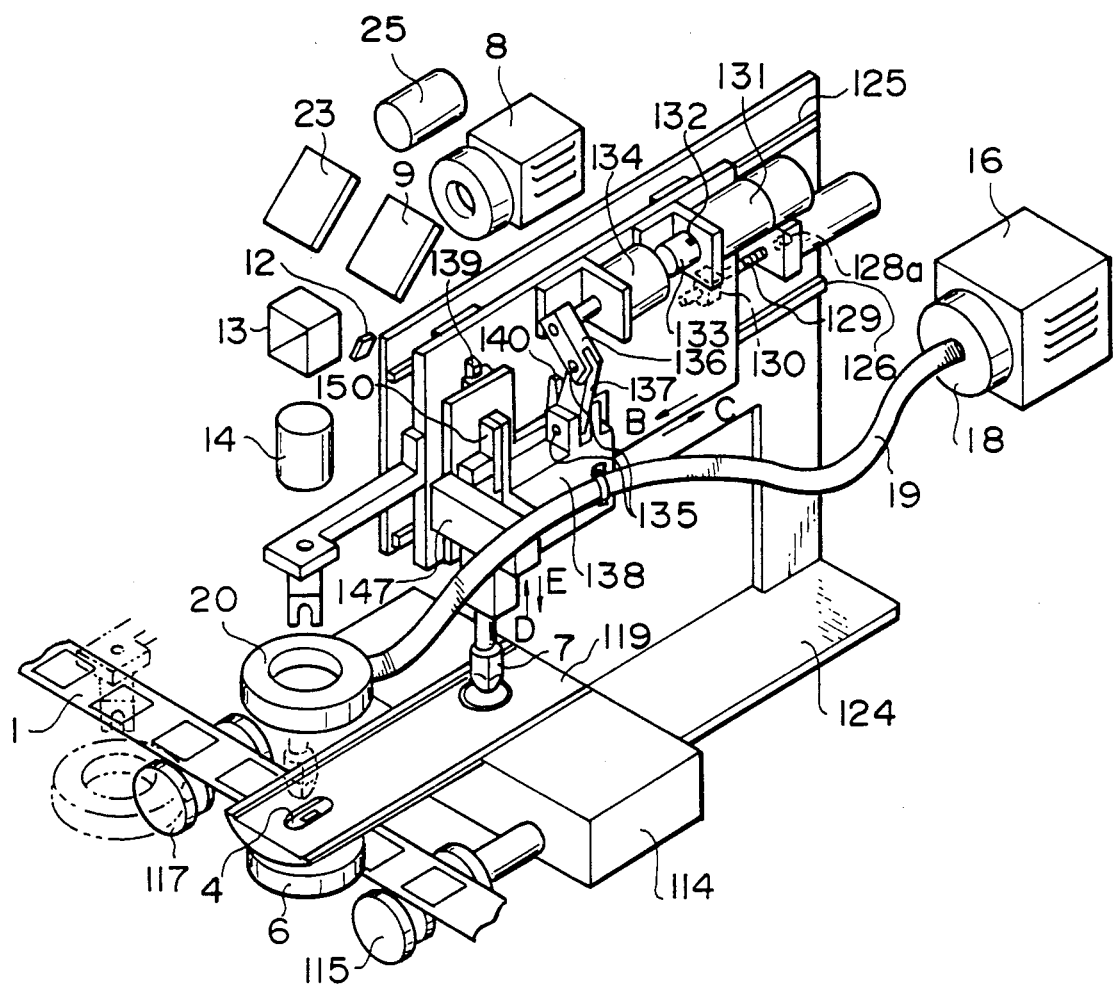
FIG. 4 is a perspective view of operating portions.

As shown in FIGS. 1 and 4, the sprocket base 114 is mounted on an XYZ table 118 which is composed of stages 118a, 118b and 118c driven by pulse motors and can move the sprocket base 114 forward/rearward, rightward/leftward and upward/downward. A tape guide 119 is attached to a central portion of the sprocket base 114 for guiding the tape 1 to a position at which the center 120 of a device hole 1a provided in the tape 1 and the center 122 of a bonding hole 121 provided in the tape guide 119 are aligned with the optical axis 106 (see FIG. 6). A lower surface 123 of the tape guide 119 is shaped into a form of circular arc so that the tape 1 is brought into close contact with the lower surface 123 if a proper tension is applied to the tape 1. As shown in FIG. 4, a forward/rearward sliding plate 127 is coupled to a tool table base 124 through a pair of slide guides 125 and 126, and a motor 128 is attached to the forward-/rearward sliding plate 127 through a motor shaft 128a, a ball screw 129 and a nut 130. The forward/rearward sliding plate 127 can be slid in directions of arrows B and C by rotating the motor 128.

A motor 131 is attached to the forward/rearward sliding plate 127 and is coupled to an upward/downward sliding plate 138 through a motor shaft 132, a coupling 133, a decelerator 134, and links 136 and 137 coupled by a pin 135. A pair of slide guides 139 and 140 are attached to the forward/rearward sliding plate 127 for guiding the upward/downward sliding plate 138 so that the plate 138 can be slid in directions of D and E by rotating the motor 131.

Figure 8:
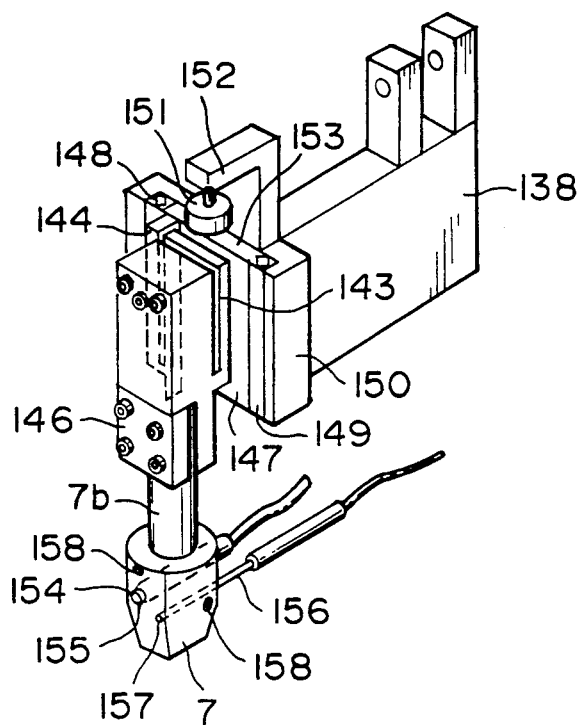
FIG. 8 is a perspective view of a head.

As shown in FIG. 8, a head 147 which for grasping a thermocompression bonding tool 7 is attached to a front face 142 of the upward/rearward sliding plate 138. The head 137 includes a pitching plate 143 for adjusting the inclination of a lower surface 7a of the bonding tool 7, a rolling plate 144, and a groove 145 for grasping a shaft 7b of the bonding tool 7, and a stopper plate 146. To the front surface of the upward/ rearward sliding plate 138 are also attached a pair of slide guides 148 and 149 which hold the head 147 in a upward and downward slidable state and a head base 150 to which the slide guides 148 and 149 are attached. A load cell 151 is provided in a space or gap between an upper part 152 of the head base 150 and an upper face 153 of the head 147. When the head base 150 is lowered to a position at which the lower surface 7a of the bonding tool 7 comes into contact with inner leads 2 and the IC chip 4 on the chip stage 6, the head 147 stops. Subsequently, the head 147 slides through the slide guides 148 and 149 so that the load cell 151 is compressed. In this manner, a bonding load is detected.

The bonding tool 7 is provided with a hole 155 for accommodating a heater 154 and a hole 157 for accommodating a thermocouple 156. The heater 154 and the thermocouple 156 are fixed to the bonding tool 7 by means of screws 158. The bonding tool 7 is kept at a predetermined temperature by a temperature control unit (not shown).

A stage heater 159 is provided for heating an upper part 6c of the chip stage 6. A thermocouple 160 is attached to the upper part 6c of the chip stage 6 through a hole 6d by a fixing screw 161 and the upper part 6c of the chip stage 6 is kept at a predetermined temperature by a temperature control unit (not shown). An adiabatic member 6e having in a central portion a suction hole 6f for vacuum-attraction of the IC chip 4 is attached to an central part of the chip stage 6. A lower part of the chip stage 6 as a chip stage base 6g is mounted on the $XY\theta$ stage 36. The chip stage base 6g is provided with a suction hole 6h which is connected to a vacuum pump (not shown) through a tube jointer 162, a tube 163 and the solenoid valve 107.

A vacuum-attraction pat 164 for transferring the IC chip 4 is connected to a vacuum pump (not shown) through a tube jointer 165, a tube 166 and a solenoid valve 167. The attraction pat 164 is attached to an arm 168. The arm 168 is attached to a hand base 170 and is guided by a pair of slide guides 169a and 169b so that it can be slid upward and downward. A rod 172 of an air cylinder 171 attached to the hand base 170 is connected to the arm 168. The air cylinder 171 is connected to a high pressure pipe (not shown) through a tube jointer 173, a tube 174 and a solenoid valve 175. By driving the solenoid valve 175, the attraction pat 164 is slid upward and downward through the arm 168.

The hand base 170 is mounted on pulse motor-driven stages 176a and 176b of an XY stage 176 which moves forward/rearward and rightward/leftward in a horizontal plane.

Reference numeral 178 designates a tray stand. A tray 180 is placed on an upper surface 179 of the tray stand 178 at a position set by a pair of positioning pins 181 and 182. A plurality of recesses 183 are provided in an upper surface of the tray 180 so that the IC chips 4 are placed at predetermined positions on the tray 180.

Figure 5:
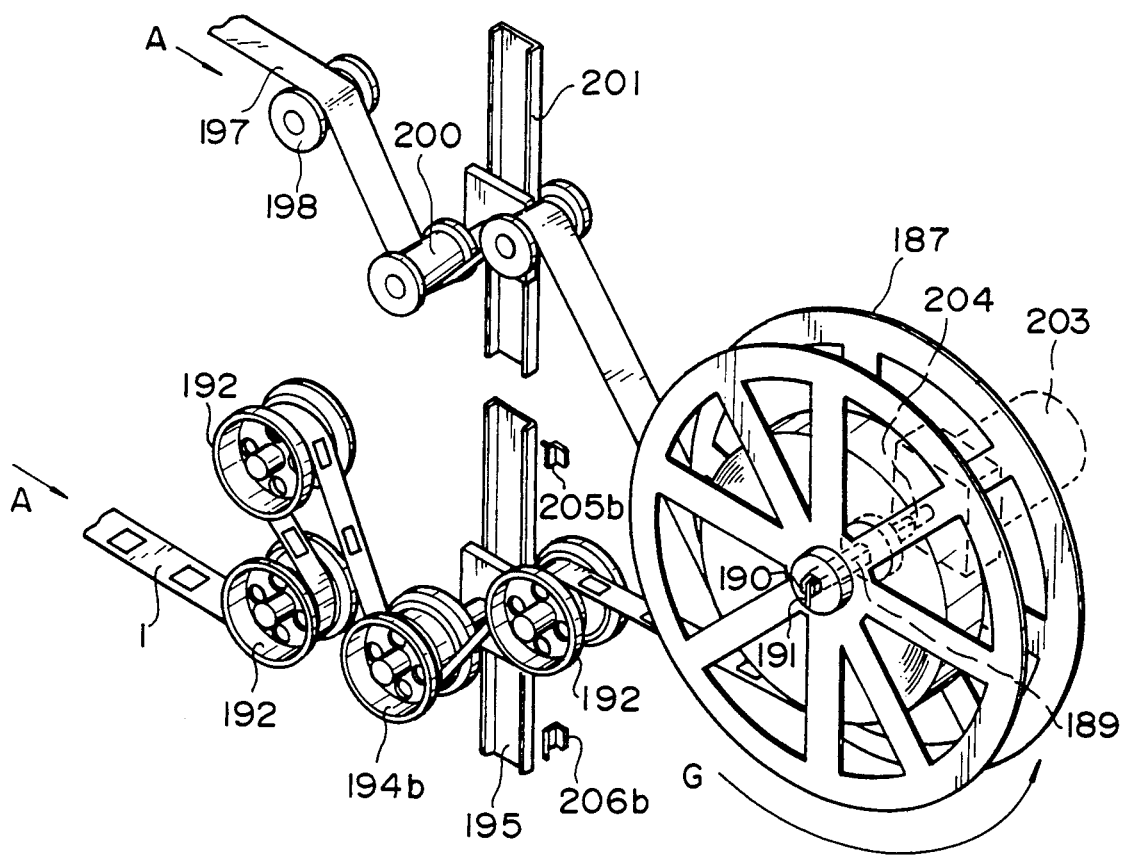
FIG. 5 is a perspective view of a reel and tensioner portion for tape and spacer.

Reference numeral 184 designates a reel plate to which a feed motor 185 is attached. A square shaft 189 engaging with a square hole 188 of a reel 187 is connected to a shaft 186 of the motor 185. As shown in FIG. 5, a stopper lever 191 which can be folded and bent around a pin 190 as a fulcrum is attached to the tip of the square shaft 189 for preventing the reel 187 from falling out. Reference numeral 192 is fixed rollers which have their fulcrum shafts 193 fixed to the reel plate 184 and are held in rotatable states through bearings (not shown). Reference numeral 194 is a tension roller which has a shaft 196 fixed through a slide guide 195 attached to the reel plate 184. The tension roller 194 is held in a rotatable state through a bearing (not shown).

Reference numeral 197 designates a spacer which is wound on the reel 187 together with the tape 1. Reference numeral 198 designates a fixed roller for spacer which has a fulcrum shaft 199 fixed to the reel plate 184 and is held in a rotatable state through a bearing (not shown). Reference numeral 200 designates a tension roller which has a shaft 202 fixed through a slide guide 201 attached to the reel plate 184 and is held in a rotatable state through a bearing (not shown).

Reference numeral 203 designates a reel motor attached to the reel plate 184. Like the feed motor 185, the square shaft 189 is attached to a shaft 204 of the reel motor 203. A pair of limit switches 205 and 206 for detecting a position of the tension roller 194 are attached to the reel plate 184 and are actuated in response to contact with a slide portion 195a of the slide guide 195 to drive the feed motor 185 and the reel motor 203 in a direction of arrow G.

With the above-mentioned construction, the XY stage 176 is driven or moved so that the center 164a of the attraction pat 164 is aligned with the center 4a of the IC chip 4 placed at a predetermined position on the tray 180. Thereafter, the solenoid valve 175 is actuated so that the air cylinder 171 operates to lower the attraction pat 164 through the arm 168. Then, the solenoid valve 167 is actuated to attract the upper surface 4a of the IC chip 4 by suction and the arm 168 is raised again. Thereafter, the XY stage 176 is driven or moved to a position at which the IC chip 4 is to be placed on the chip stage 6. At the same time, the XY$\theta$ stage 36 is driven to move the chip stage 6 to a chip receiving position.

Next, the solenoid valve 175 is actuated so that the air cylinder 171 operates to lower the attraction pat 164. Thereafter, the solenoid valve 167 is actuated to place the IC chip on the chip stage 6. Then, the solenoid valve 175 is actuated so that the air cylinder 171 operates to raise the attraction pat 164.

Figure 6:
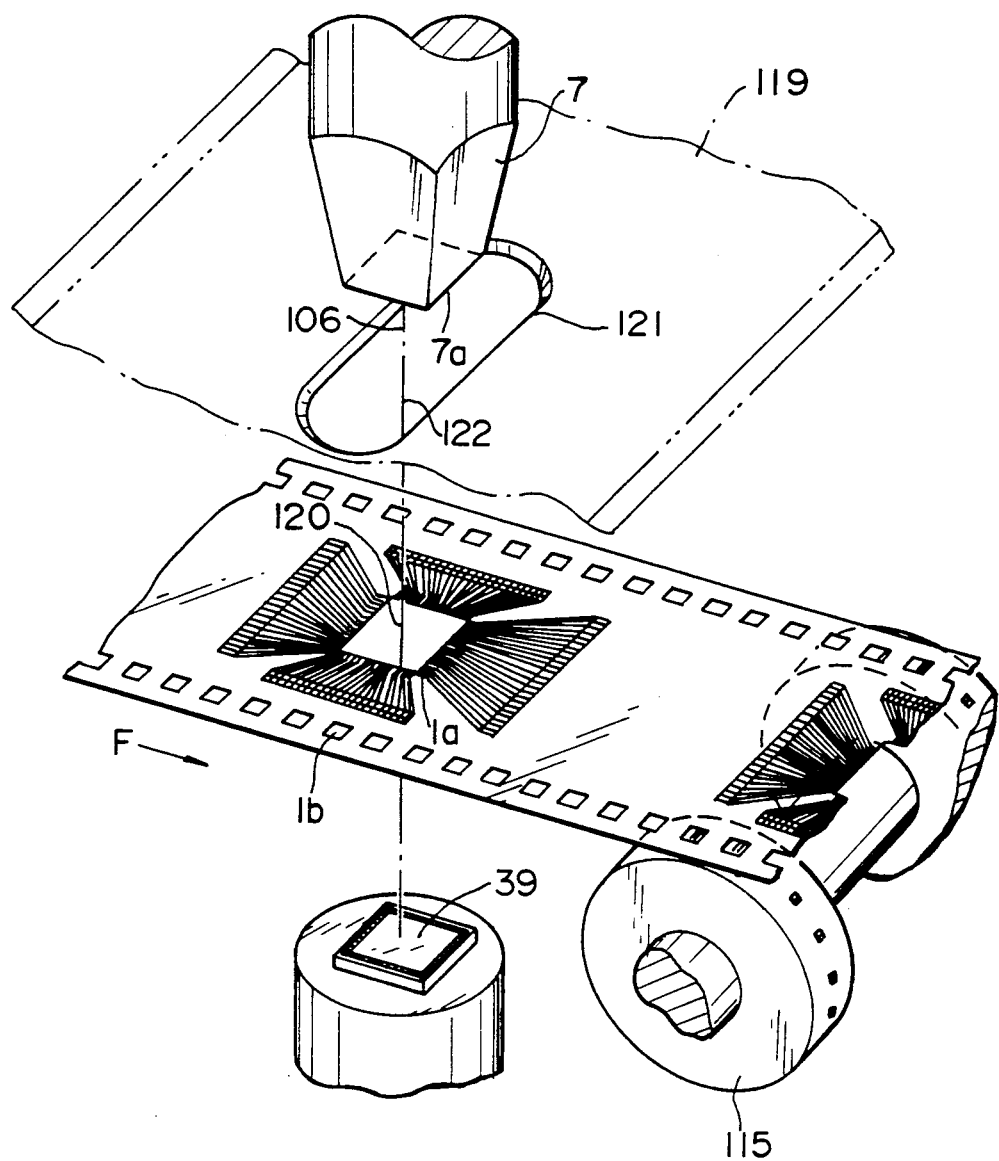
FIG. 6 is an enlarged perspective view of a portion where bonding is to be made.

Next, the XY$\theta$ stage 36 is driven so that it is returned to a position at which the center 109 of rotation of the turn table 36c is aligned with the optical axis 106. At the same time, the pulse motor 110 is driven to rotate the sprocket 115 through the timing pulley 111, the timing belt 113 and the timing pulley 112, thereby transporting the tape 1 by a constant pitch in a direction of arrow F and aligning the center 120 of the tape 1 with the center 122 of the bonding hole 121 of the tape guide 119, as shown in FIG. 6. At this time, the tension roller 194b descends downward by virtue of its own weight owing to the transported length portion of the tape 1 so that the limit switch 206b operates to rotate the reel motor 203, thereby rotating the reel 187b by which the tape 1 and the spacer 197 are reeled. As a result, the tape 1 is pulled to raise the tension roller 194a so that the limit switch 205b operates to stop the reel motor 203. At the same time, the tape 1 is pulled to raise the tension roller 194a so that the limit switch 205a operates to rotate the feed motor 185, thereby rotating the reel 187a which in turn forwards the tape 1 and the spacer 197. Then, the tape 1 loosens and the tension roller 194a descends so that the limit switch 206a operates to stop the feed motor 185. By repeating the above-mentioned consecutive operation for every transportation of the tape 1 through rotation of the sprocket 115, it is possible to apply a constant tension to the tape 1 always.

Figure 9:
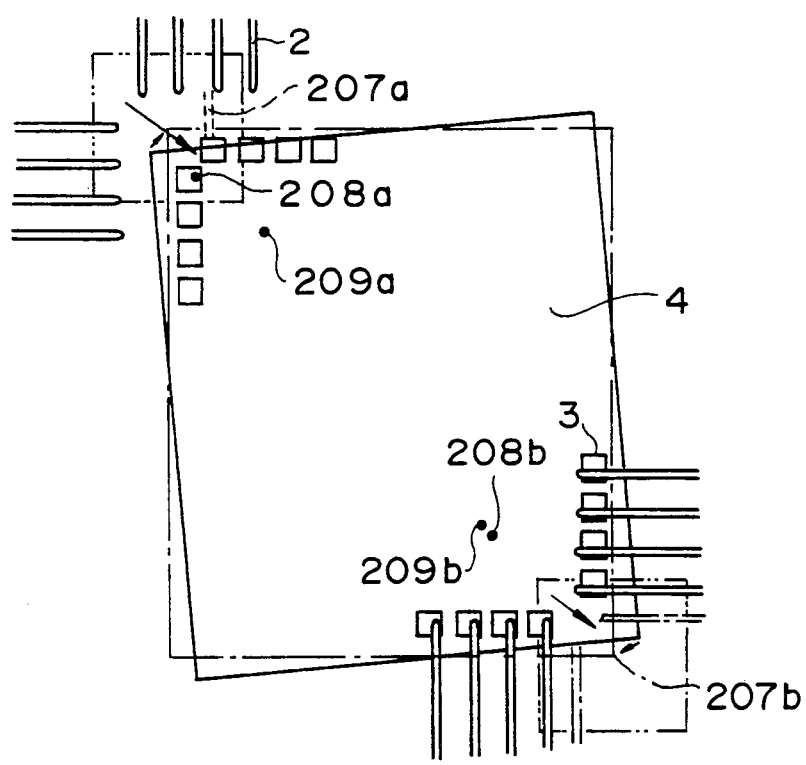
FIG. 9 is a view for explaining a positioning or alignment method.

Next, the shutter 18 is closed while the shutter 11 is opened so that an image by the light source 8 for fall-down illumination is taken into the TV cameras 29a and 29b to detect the positions of inner leads 2 existing nearest to a corner of the IC chip 4 and crossing each other and to determine a difference to which the amount of offset from a predetermined reference position 207a is added, as shown in FIG. 9. The XYZ table 118 is driven in accordance with that difference so as to align the inner lead 2 with the reference position 207a. Next, the shutter 11 is closed while the shutter 18 is opened so that an image by the light source 16 for oblique illumination is taken into the TV cameras 29a and 29b to detect the positions of corners 4c and 4d of the IC chip 4 and to determine differences from reference positions 207a and 207b. Based on those differences, the inclination of the IC chip 4 and differences after correction for inclination in forward/rearward and rightward/leftward directions are determined through calculation to drive the XY$\theta$ stage 36 so that the corners 4c and 4d of the IC chip 4 are aligned with the reference positions 207a and 207b.

After the amount of positional deviation has been reduced to fall within a predetermined range by repeating the above-mentioned operation, the light source 8 for fall-down illumination is used again to determine average positions 208a and 20b of plural inner leads 2 in a manner similar to that mentioned above while the light source 16 for oblique illumination is used to determine average positions of plural bumps 3. Then, the inclination of the IC chip 4 and differences after correction for inclination in forward/rearward and rightward/leftward directions are calculated to drive the XY$\theta$ stage 36 so that the average positions 209a and 209b of bumps 3 are aligned with the average positions 208a and 208b of inner leads 2. This operation is repeated to reduce the amount of positional deviation until it falls within a predetermined range, thereby terminating the alignment operation.

In the case where the presence of any defect in the IC chip 4 has been revealed by image processing, the XY$\theta$ stage 36 is returned to the position onto which the IC chip 4 was placed prior to the alignment. Then, the XY stage 176 and the solenoid valves 167 and 175 are driven to return the IC chip 4 into an idle recess 183 of the tray 180 by means of the attraction pat 164. Thereafter, another chip 4 is placed on the chip stage 6 and an alignment operation is carried out in a manner similar to that mentioned above.

On the other hand, in the case where the presence of any defect in the inner leads 2 of the tape 1 has been found out, the sprocket 115 is rotated to transport the tape 1 by a constant pitch so that new inner leads 2 are brought into a predetermined position. Thereafter, an alignment operation is performed again in a manner similar to that mentioned above.

After the alignment operation has been completed, the motor 128 is driven to move the forward/rearward sliding plate 127 in a direction of arrow B as shown in FIG. 4 so that the bonding tool 7 is aligned with a bonding position 39. Next, while driving the motor 131 to lower the head base 150 in a direction of arrow E through the coupling 133, the decelerator 134, the pin 135, the links 136 and 137, and the upward/downward sliding plate 138, a repulsive force of the load cell 151 is detected through the bonding tool 7 and the head 147. After the lower surface 7a of the bonding tool 7 contacts the IC chip 4 on the chip stage 6 through the inner leads 2 and a predetermined load is detected, the bonding tool 7 is depressed and heated for a predetermined time to bond the inner leads 2 to the bumps 3. Then, the motors 128 and 131 are driven again to return the bonding tool 7 to the original or initial position, thereby completing the thermocompression bonding of one IC chip 4 and the inner leads 2 on the tape 1. By repeating all of the above-mentioned operations, the inner lead bonding can be performed continuously.

Next, an alignment method in the inner lead bonding according to an embodiment of the present invention will be explained.

Figure 10:
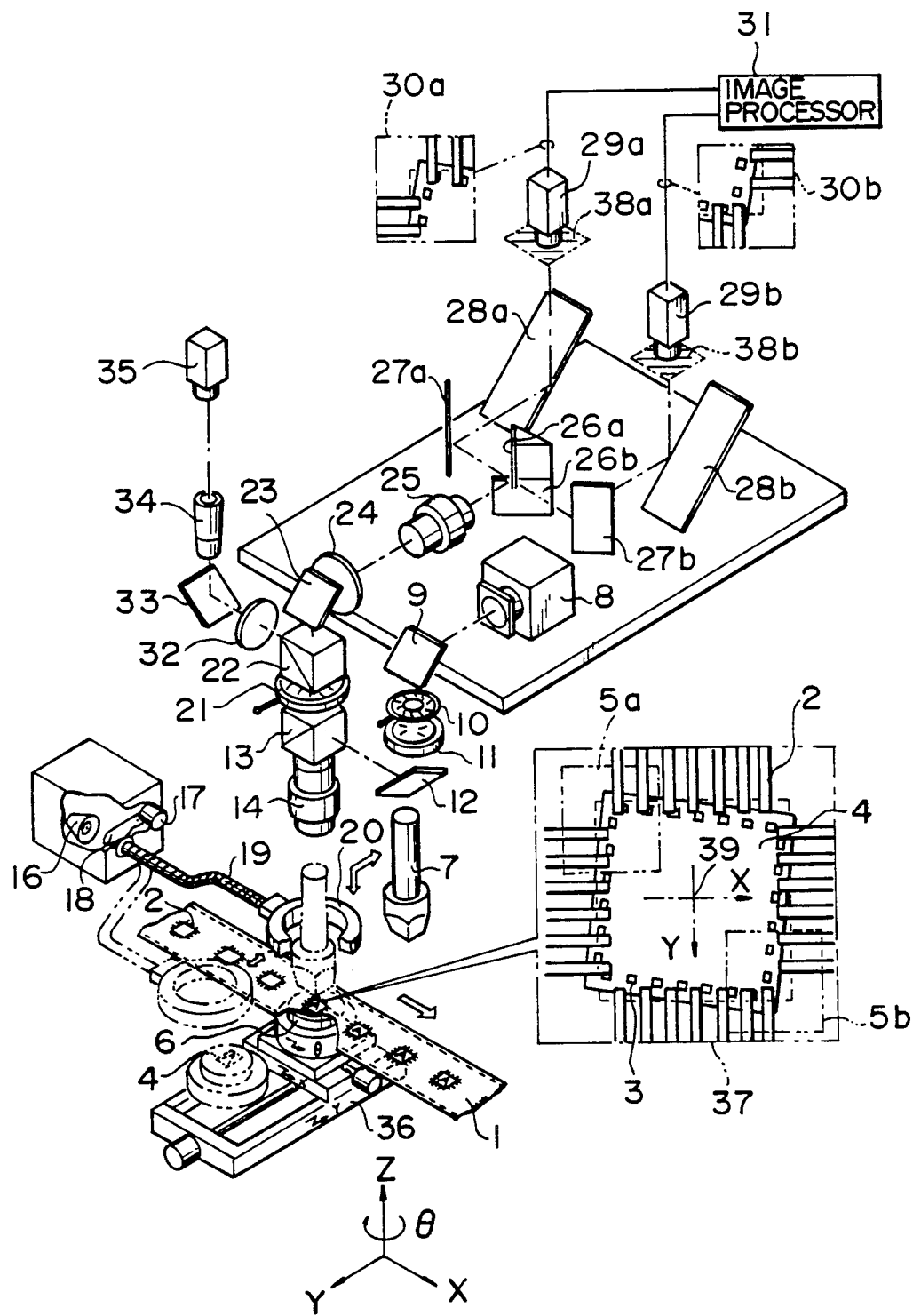
FIG. 10 is a perspective view showing the construction around a bonding position and the construction of an optical detection system for alignment.
Figure 11:
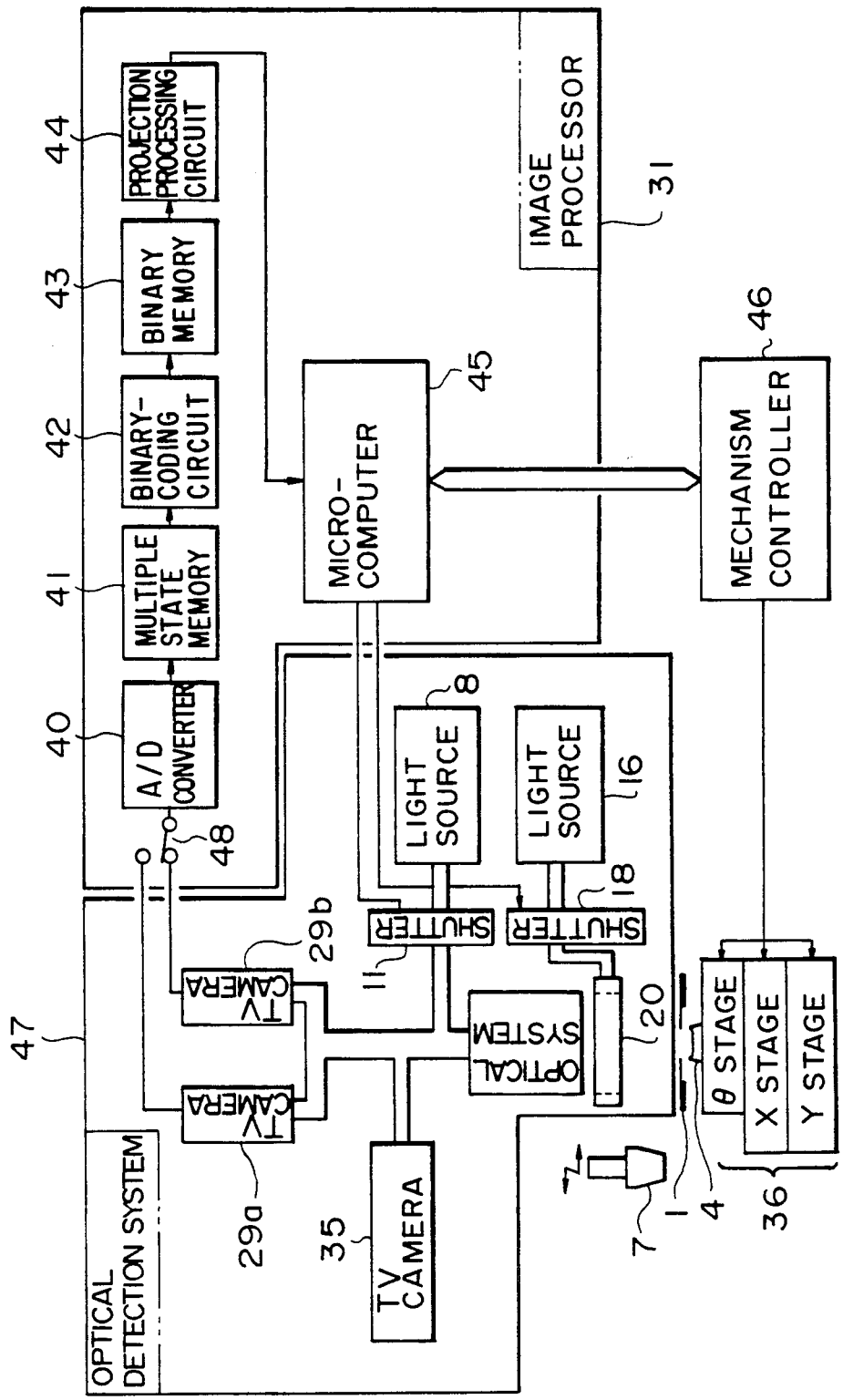
FIG. 11 is a function block diagram showing the whole construction of an alignment system.

FIG. 10 is a perspective view showing the construction of a TAB inner lead bonder around the bonding position and the construction of an optical detection system for alignment, and FIG. 11 is a function block diagram showing the whole construction of an alignment system.

As shown in FIG. 10, the inner leads 2 are successively provided on the tape 1. The tape 1 is transported in a direction of arrow (X direction) by a feed mechanism (not shown) at a predetermined set pitch determined by an interval between successive inner lead groups so that the inner lead groups are successively brought into the bonding position 39. On the other hand, the IC chip 4 is mounted on the XYθ stage 36 and the XYθ stage 36 is mounted on the chip heating stage 6 onto which a heat-resisting or thermostable black coating is applied. The IC chip 4 is also brought into the bonding position 39. Alignment is made for all the inner leads 2 on the tape 1 and the bumps 3 formed on the IC chip 4. Thereafter, the bonding tool 7 is moved in the Y direction to a position shown by broken lines, and all the inner leads 2 and the bumps 3 are bonded through thermocompression en bloc or collectively and at a time.

The optical detection system for alignment shown in FIG. 10 is composed of an optical system the optical axis of which is located at the bonding position 39. The optical detection system detects simultaneously the inner leads 2 and the IC chip 4 which overlap each other. The optical detection system for alignment includes an oblique illumination system, a fall-down illumination system, a pattern detecting system and an observation system. The oblique illumination system is composed of a light source 16, a rotary a shutter 18 actuated by a rotary solenoid 17, light conducting glass fibers 19, and a ring-like illumination device 20 having its circular periphery along which an open end of the fiber 19 is disposed. The fall-down illumination system is composed of a light source 8, a mirror 9, a diaphragm 10, a light shielding shutter 11, a mirror 12, a half-prism 13 and an objective lens 14. The pattern detecting system is composed of the objective lens 14, a diaphragm 21 disposed at a rear focal position of the objective lens 14, a mirror 23, a field lens 24, a relay lens 25, splitter mirrors 26a and 26b, mirrors 27a, 27b, 28a and 28b, and TV cameras 29a and 29b. The observation system is branched from the optical path behind the diaphragm 21 by the half-prism 22 and is composed of a lens 32, a mirror 33, a zoom lens 34 and a TV camera 35.

An alignment method according to the present invention, that is, the positioning or alignment of all the inner leads 2 and the bumps 3 are performed in a state in which the inner leads 2 and the IC chip 4 overlap each other at the bonding position 39, as shown by an enlarged illustration 37 in FIG. 10. Patterns in two fields of view 5a and 5b at diagonal corner portions of the IC chip 4 are detected. Further, the positions of the inner leads 2 and IC chip 4 are determined within the detected image in each of the two fields of view. By using those position data, the amount of correction for position of XYθ stage having the IC chip 4 mounted thereon is calculated and the alignment is effected by correcting the position of the IC chip 4 in a state in which the inner leads 2 remain fixed. After the completion of alignment, bonding by the tool 7 is performed in a state in which the inner leads 2 and the IC chip 4 remain fixed. Accordingly, the bonding can be made without deteriorating the precision of alignment due to the precision of mechanical parts, etc.

In order to surely determine the positions of the inner leads 2 and IC chip 4 which overlap each other, there are used images obtained under two illumination conditions or fall-down illumination and oblique illumination. For that purpose, the ring-like illumination devide 20 for oblique illumination is placed above the bonding position 39. The selection of one of the oblique illumination and the fall-down illumination is made by controlling the opening/closing of the shutter 18 of the oblique illumination system and the shutter 11 of the fall-down illumination system. An image of the inner leads 2 and the IC chip 4 subjected to either the oblique illumination or the fall-down illumination is formed in the vicinity of the field lens 24 by the objective lens 14 and is enlarged by the relay lens 25. In order to detect the diagonal corner portions of the IC chip 4 through two fields of view, the detection light passed through the relay lens 25 is split or branched left and right by the mirrors 26a and 26b. Light reflected by the mirror 26a is further reflected by the mirrors 27a and 28a and is focused on an imaging plane of the TV camera 29a. Thus, the TV camera 29a detects an enlarged image in a quarter circle 38a centering at the bonding position 39 and corresponding to the left and upper portion therearound. Similarly, the TV camera 29b detects an enlarged image in a quarter circle 38b centering at the bonding position 39 and corresponding to the right and lower portion therearound. The TV cameras 29a and 29b are held on respective XY stages (not shown). The TV camera 29a or 29b detects the pattern in one of the diagonal corner portions of the IC chip 4 in such a manner that the associated XY stage is moved to adjust a position of the field of view 5a or 5b in conformity with the dimension of the IC chip 4. Blocks 30a and 30b shown in FIG. 10 represent images of the patterns in the fields of view 5a and 5b detected by the TV cameras 29a and 29b, respectively, and these images are inputted to an image processor 31 and are processed therein.

When alignment is to be made, the inner leads 2 and the bumps 3 are held with a small space or gap therebetween in order to correct the position of the IC chip 4. In order to simultaneously detect the overlapping inner leads 2 and IC chip 4 (see the enlarged illustration 37 in FIG. 10) by one imaging system, it is required that the optical detecting system has a wide in-focus range. In the shown embodiment of the present invention, the simultaneous detection is made possible by providing a telecentric optical system in which the diaphragm 21 is disposed at a rear focal position of the objective lens 14. The telecentric optical system used in a projector for measurement or the like has a merit that even if a specimen moves from a correct in-focus position to some extent in a direction of the optical axis, an influence given on measurement is little since the size of an image formed does not almost change though it becomes blurred slightly. Also, light for fall-down illumination is passed through the half-prism 13 interposed between the objective lens 14 and the diaphragm 21. Therefore, by changing the diameter of the diaphragm 21, the N.A. (numerical aperture) of the detection system can be adjusted without the field of view for fall-down illumination, thereby allowing the adjustment of a focal depth to provide a required in-focus range.

In the present embodiment, an enlarged image is obtained by two imaging stages using the objective lens 14 and the relay lens 25. Therefore, it is possible to make a working distance (or the distance from the tip of the objective lens 14 to the specimen) large by making the magnification of the objective lens 14 small. As a result, a construction can be realized in which the optical detection system and the bonding tool 7 do not interfer with each other. Also, if a lens for photolithography having a large pupil diameter is used as the objective lens, fields of view corresponding to or coping with various IC chip dimensions can be ensured. With the above-mentioned construction, a fixed optical detection system can be realized which detects the diagonal corner portions of the IC chip 4 through two fields of view.

If the ring-like illumination device 20 used in the oblique illumination system is fixed to a tool stage, the device 20 can be retreated to a position shown by broken lines upon bonding without requiring any exclusive mechanism.

In the observation system, light split from the focused light of the objective lens 14 by the half-prism 22 is focused once in the vicinity of the lens 32 and is reflected by the mirror 33. Thereafter, the light is enlarged with a proper magnification by the zoom lens 34 and is detected by the TV camera 35. The zoom lens 34 and the TV camera 35 are constructed into a unitary structure. Therefore, if the unitary structure is moved by an XYZ movement mechanism, the pattern of the inner leads 2 and the IC chip 4 (shown by the enlarged illustration 37 in FIG. 10) at any position can be observed from a position just above the inner leads 2 and the IC chip 4 at a proper magnification.

FIG. 11 shows in function block the whole construction of the alignment system. The alignment system includes an optical detection system 47 for simultaneously detecting the inner leads 2 on the tape 1 and the IC chip 4 which overlap each other at the bonding position, the image processor 31 for determining an inner lead position (hereinafter abbreviated to lead positions) and an IC chip position (hereinafter abbreviated to chip position) in each of two fields of view through image processing on the basis of patterns of diagonal corner portions of the IC chip 4 in the two fields of view, a mechanism controller 46 for calculating the amount of correction for position of the $XY\theta$ stage 36 having the IC chip 4 mounted thereon on the basis of position data in the two fields of view and for performing a control based on the results of calculation, the $XY\theta$ stage 36 for moving the IC chip 4, and an XYZ movement mechanism (not shown) for the tape 1.

Figure 12:
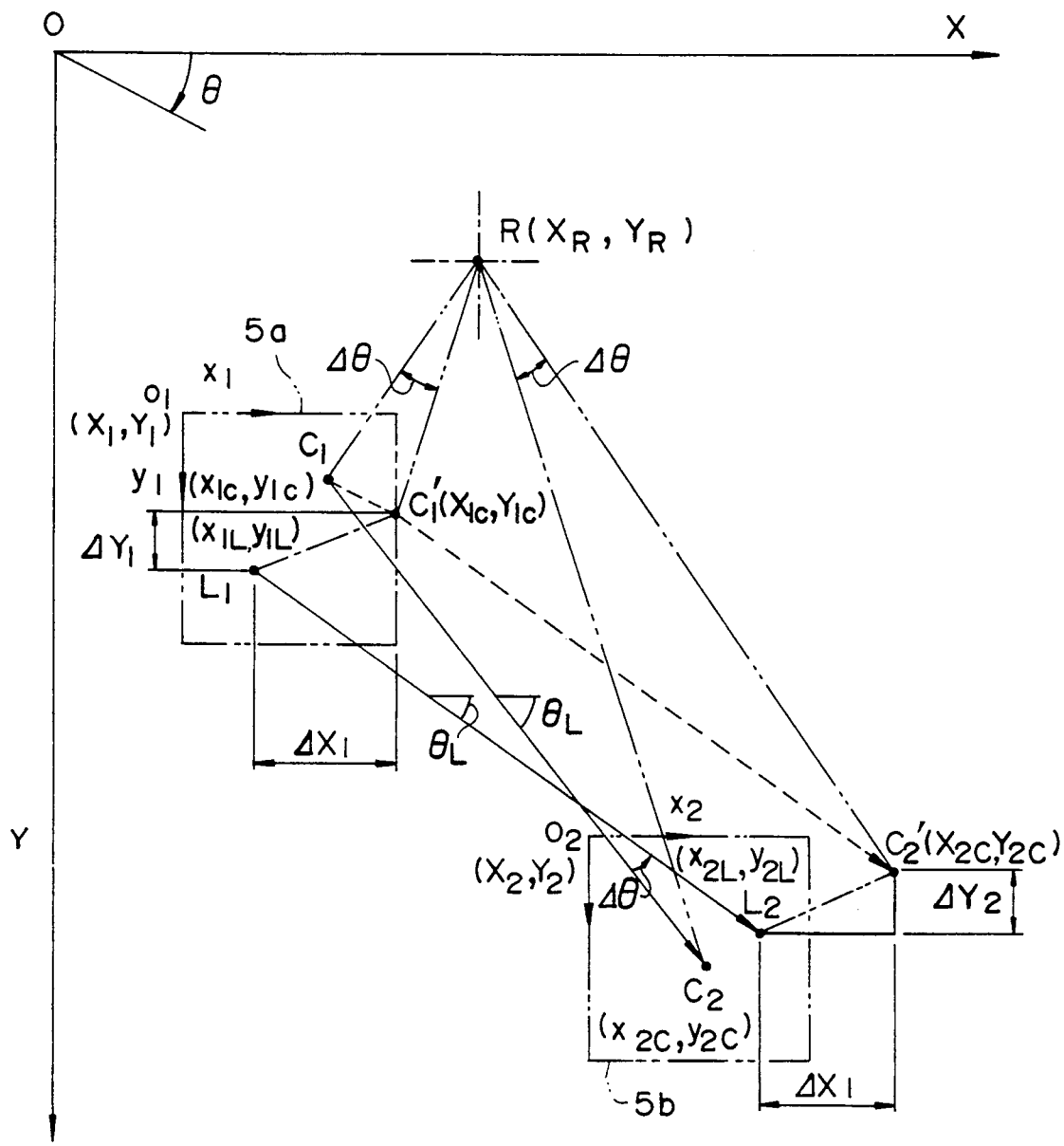
FIG. 12 is a view for explaining a method of determining the amounts of correction for positions in X, Y and $\theta$.

Referring to FIG. 12, explanation will first be made of a procedure in accordance with which the amount of correction for position of the $XY\theta$ stage 36 having the IC chip 4 mounted thereon is calculated by use of the position data of the diagonal corner portions within the two fields of view received by the mechanism controller 46 from the image processor 31. In FIG. 12, XOY represents a coordinate system of the $XY\theta$ stage 36 having the IC chip mounted thereon, $x_1 o_1 y_1$ represents a coordinate system of the field of view 5a detected by the TV camera 29a, and $x_2 o_2 y_2$ represents a coordinate system of the field of view 5b detected by the TV camera 29b. In the figure, the positive direction of $\theta$ is counterclockwise. Symbol R designates a position of the center of rotation of the $XY\theta$ stage 36, and symbols $O_1$ and $O_2$ designate the positions of the fields of view 5a and 5b. Lead positions $L_1$ and $L_2$ and chip positions $C_1$ and $C_2$ in the fields of view are determined by image processing. The lead position $L_1$ and the chip position $C_1$ or the lead position $L_2$ and the chip position $C_2$ are to coincide with each other after alignment. The amount of correction for position of the $XY\theta$ stage 36 is determined as the amounts of movement in X, Y and $\theta$ directions required for making $C_1C_2$ coincident with $L_1L_2$.

First, the coordinates of the above-mentioned positions are defined as follows:

①  $R(X_R, Y_R)$  ② $O_1(X_1, Y_1)$  ③ $O_2(X_2, Y_2)$
④ $L_1(x_{1L}, y_{1L})$ ⑤ $C_1(x_{1C}, y_{1C})$ ⑥ $L_2(x_{2L}, y_{2L})$
⑦ $C_2(x_{2C}, y_{2C})$

①, ② and ③ are the coordinates in the XOY coordinate system, ④ and ⑤ are the coordinates in the $x_1 o_1 y_1$ coordinate system, and ⑥ and ⑦ are the coordinates in the $x_2 o_2 y_2$ coordinate system. The angles $\theta_L$ and $\theta_C$ of $L_1L_2$ and $C_1C_2$ relative to the X-axis are represented as follows:

$$\theta_L = \tan^{-1}\left\{\frac{(Y_2 + y_{2L}) - (Y_1 + y_{1L})}{(X_2 + x_{2L}) - (X_1 + x_{1L})}\right\} \quad (1)$$

$$= \tan^{-1}\left\{\frac{(Y_2 - Y_1) + (y_{2L} + y_{1L})}{(X_2 - X_1) + (x_{2L} - x_{1L})}\right\}$$

$$\theta_C = \tan^{-1}\left\{\frac{(Y_2 + y_{2C}) - (Y_1 + y_{1C})}{(X_2 + x_{2C}) - (X_1 + x_{1C})}\right\} \quad (2)$$

$$= \tan^{-1}\left\{\frac{(Y_2 - Y_1) + (y_{2C} + y_{1C})}{(X_2 - X_1) + (x_{2C} - x_{1C})}\right\}$$

An angle $\Delta\theta$ of correction for the chip position in the $\theta$ direction is determined as follows:

$$\theta_L = \theta_C + \Delta\theta$$

$$\therefore \Delta\theta = \theta_L - \theta_C (=(1)-(2))\ldots \quad (3)$$

When the chip is rotated around the rotation center R by $\Delta\theta$, the chip positions $C_1$ and $C_2$ are moved to $C'_1$ and $C'_2$, respectively. Since the correction in the $\theta$ direction has been made, $C'_1C'_2$ becomes parallel to $L_1L_2$. Provided that the coordinates of $C'_1$ and $C'_2$ are $C'_1(X'_{1C}, Y'_{1C})$ and $C'_2(X'_{2C}, Y'_{2C})$ in a representation using the XOY coordinate system, the coordinate $C'_1$ is determined by the following equation:

$$OC'_1 = OR + f(\Delta\theta) RC_1 \ldots \quad (4)$$

wherein $$f(\theta) = \begin{pmatrix} \cos\theta & -\sin\theta \\ \sin\theta & \cos\theta \end{pmatrix}$$

That is, $$\begin{pmatrix} X'_{1C} \\ Y'_{1C} \end{pmatrix} = \begin{pmatrix} X_R \\ Y_R \end{pmatrix} + \begin{pmatrix} \cos\Delta\theta & -\sin\Delta\theta \\ \sin\Delta\theta & \cos\Delta\theta \end{pmatrix} \begin{pmatrix} (X_1 + x_{1C}) - X_R \\ (Y_1 + y_{1C}) - Y_R \end{pmatrix} \quad (5)$$

Since a relation of $$C_1L_1 = OL_1 - OC_1 \ldots \quad (6)$$

is satisfied, the amounts $\Delta X_1$ and $\Delta Y_1$ of correction in the x and Y directions for making $C'_1$ and $L_1$ coincident with each other are determined by the following equation:

$$\begin{pmatrix} \Delta X_1 \\ \Delta Y_1 \end{pmatrix} = \begin{pmatrix} X_1 + x_{1L} \\ Y_1 + y_{1L} \end{pmatrix} - \left\{ \begin{pmatrix} X_R \\ Y_R \end{pmatrix} + \begin{pmatrix} \cos\Delta\theta & -\sin\Delta\theta \\ \sin\Delta\theta & \cos\Delta\theta \end{pmatrix} \begin{pmatrix} (X_1 + x_{1C}) - X_R \\ (Y_1 + y_{1C}) - Y_R \end{pmatrix} \right\} \quad (7)$$

Similarily, the amounts $\Delta X_2$ and $\Delta Y_2$ of correction in the X and Y directions for the movement of $C_2$ are determined by the following equation:

$$\begin{pmatrix} \Delta X_2 \\ \Delta Y_2 \end{pmatrix} = \begin{pmatrix} X_2 + x_{2L} \\ Y_2 + y_{2L} \end{pmatrix} - \left\{ \begin{pmatrix} X_R \\ Y_R \end{pmatrix} + \begin{pmatrix} \cos \Delta \theta & -\sin \Delta \theta \\ \sin \Delta \theta & \cos \Delta \theta \end{pmatrix} \begin{pmatrix} (X_2 + x_{2C}) - X_R \\ (Y_2 + y_{2C}) - Y_R \end{pmatrix} \right\} \quad (8)$$

Since $C'_1C'_2$ and $L_1L_2$ are parallel to each other, a relation of $$\begin{pmatrix} \Delta X_1 \\ \Delta Y_1 \end{pmatrix} = \begin{pmatrix} \Delta X_2 \\ \Delta Y_2 \end{pmatrix} \quad (9)$$

is satisfied. Accordingly, the chip position can be corrected by using the amounts of movement (or correction) in the X and Y directions determined by the equation (7) or (8).

As has been mentioned above, the amounts of correction for position in the X, Y and $\theta$ directions of the $XY\theta$ stage 36 having the IC chip 4 mounted thereon can be determined from the rotation center position R, the positions $O_1$ and $O_2$ of the fields of view 5a and 5b, and the lead positions L and chip positions C in the respective fields of view. The positions $O_1$ and $O_2$ of the fields of view 5a and 5b are to be preliminarily measured each time the positions of the TV cameras 5a and 5b are moved in conformity with the dimension of the IC chip 4.

Examples of a method of defining the lead position L and the chip position C mentioned above will be explained by use of examples of a pattern in the field of view 5 shown in FIGS. 13, 14 and 15.

A first example will be explained referring to FIG. 13. In the shown example, a chip position C is defined as a point of intersection of straight periphery lines of the chip which cross at a right angle, that is, a chip corner position. A lead position L is defined as a position after a first lead position $l_1$ determined by a pair of leads in horizontal and vertical directions and nearest to a corner of the chip 4 has been corrected by the amounts $\Delta X$ and $\Delta Y$ of correction for the first lead position. The amounts $\Delta X$ and $\Delta Y$ of correction for the first lead position $l_1$ show a difference between the chip corner position C and the first lead position $l_1$ in the state in which the inner leads 2 and the bumps 3 are correctly aligned with each other, as shown in FIG. 14. Accordingly, the lead position L and the chip position C which are defined above are positions which are to coincide with each other after alignment. The amounts $\Delta X$ and $\Delta Y$ of correction for the first lead position are set or determined prior to the execution of alignment.

Figure 15:
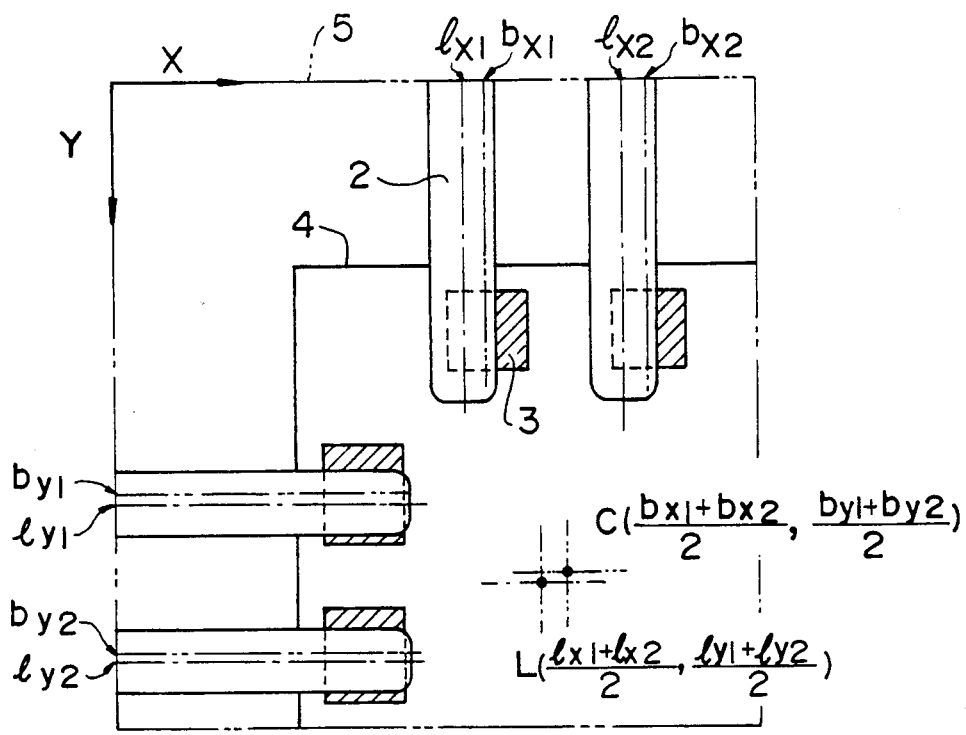

FIG. 15 shows a second example. The definition in this example is made under a condition that an inner lead 2 and a bump 3 to be actually bonded to each other have their overlapping portions and an inner lead 2 and a bump 3 not to be bonded have no overlapping portions. As shown in the figure, a chip position C is defined as an average bump position determined from a plurality of bumps 3 included in the field of view 5. Namely, the chip position C is defined by an X coordinate value determined as an average value of center positions in the X direction of all bumps lying in the X direction and a Y coordinate value determined in a similar manner. Though FIG. 15 shows the case where two bumps are included in each of the horizontal and vertical directions, it is of course that, for example, in the case where six bumps are included in one direction, an average position of the six bumps is used. Similarly, a lead position L is defined as an average lead position determined from a plurality of leads 2 included in the field of view 5.

Figure 13:
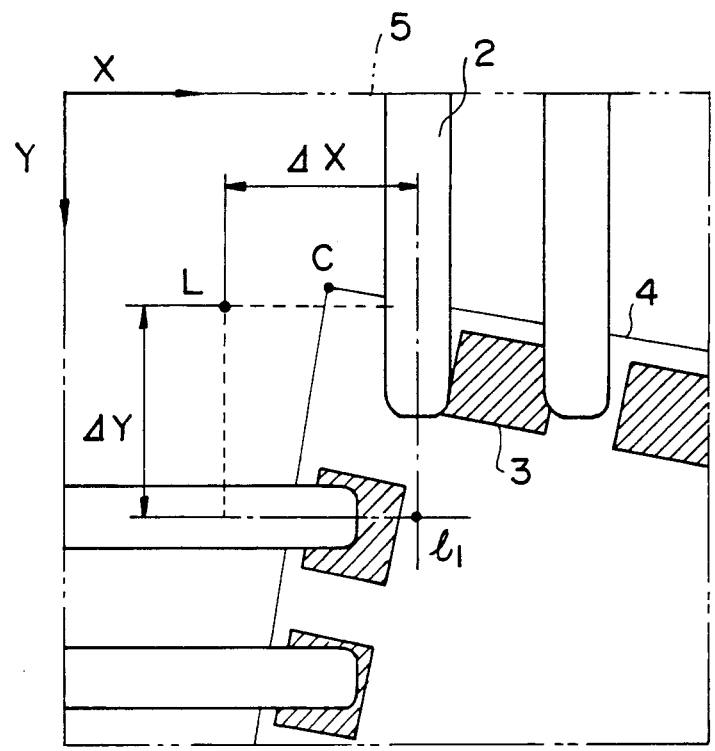
FIGS. 13 to 15 are views for explaining the definition of a lead position and a chip position within a field of view.

In the definition shown in FIG. 13, a condition necessary for alignment is that the chip corner position C and the first lead position $l_1$ is included in the field of view 5. In the method shown in FIG. 15 using the average lead and bump positions, a condition necessary for alignment is that the above condition mentioned in conjunction with FIG. 15 is satisfied by a coarse alignment process carried out by any method.

Next, a method of determining the above-defined lead position L and chip position C from the images 30a and 30b detected by the TV cameras 29a and 29b will be explained by virtue of FIGS. 16 to 19.

Figure 16A:
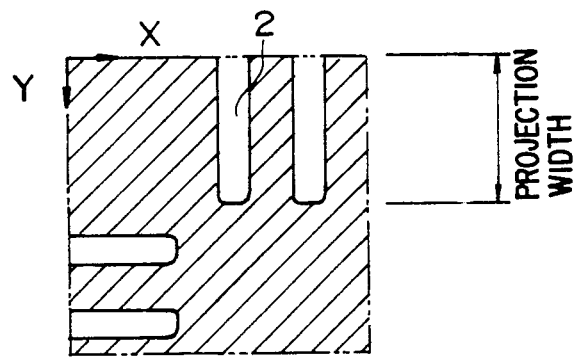
FIGS. 16a and 16b are views for explaining a lead position detecting method.
Figure 16B:
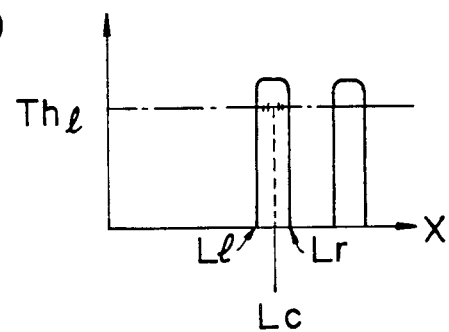

First, a method of detecting positions of inner leads 2 will be explained referring to FIG. 16. In the case where the detection of the lead positions is to be made, oblique illumination is made by opening the shutter 18 of the oblique illumination system shown in FIG. 10 while closing the shutter 11 of the fall-down illumination system. In the oblique illumination, light is derived from the open ends of the fiber 19 disposed on the circular periphery of the ring-like illumination device 20. The diameter of the circular periphery of the device 20 is larger than the outer diameter of the IC chip 4. Therefore, the illumination light impinges upon the surfaces of the inner leads 2 and IC chip 4 obliquely and equally from a plurality of directions. Since the inner leads 2 are formed by etching a cupper foil and hence the lead 2 has a rough or sandy surface so that many diffused reflection components are produced. As a result, the leads 2 are detected with bright appearance. On the other hand, the surface of the IC chip 4 which is smooth in comparison with that of the lead 2, includes less diffused components. As a result, the IC chip 4 is detected with dark appearance. Accordingly, if a state in which the inner leads 2 are superimposed on the IC chip 4 is detected through the oblique illumination, an image is obtained in which the inner leads 2 are brightly conspicuous. By binary-coding such an image, a binary image as shown in FIG. 16a is obtained. In FIG. 16a, a white portion represents "1" and a shaded portion represents "0". A procedure of detecting the positions of leads lying in the X direction on the basis of the binary image is as follows:

(1) The waveform lead-pr(X) (see FIG. 16b) of projection of "1⇌" portion along the Y direction with a projection width shown in FIG. 1a, that is, a waveform representative of the number of "1" picture elements or pixels at the same X coordinate position is produced. In this case, the projection width is selected or determined such that a start point thereof is the upper end of the image and the width thereof equal to the maximum value of lead-pr(X). More particularly, projection processing is performed for the whole of the image and the maximum value of the projection waveform is compared with the projection width. If the maximum value of the projection waveform and the projection width are not equal to each other, the projection processing is repeated using the maximum value as a projection width. In this manner, a projection waveform satisfying the abovementioned condition is automatically obtained.

(2) A lead position $L_c$ is determined as the middle point between the intersections $L_l$ and $L_r$ of lead-pr(X) and a threshold value $Th_l$. A value of the projection width multiplied by a proper ratio $r$ ($0 < r < 1$) is used as $Th_l$.

Positions of leads lying in the Y direction are also detected in accordance with a similar procedure.

Positions of all leads included in the field of view are detected in accordance with the abovementioned procedure. In this manner, the first lead position $l_1$ shown in FIG. 13 and the average lead position L shown in FIG. 15 can be determined.

Figure 17A:
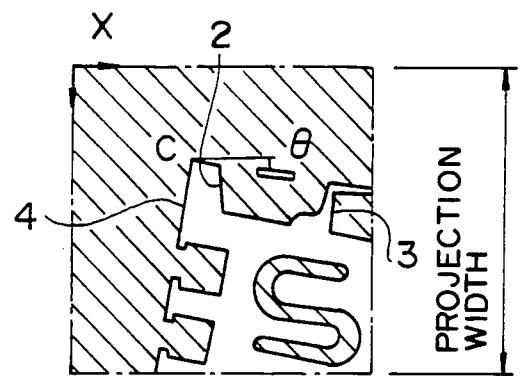
FIGS. 17a to 17e are views for explaining a chip corner position detecting method.
Figure 17B:
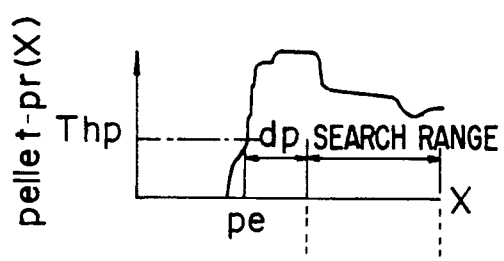

Next, a method of detecting a chip corner position as the chip position C will be explained by virtue of FIG. 17. The detection of the chip corner position is made after the lead position detection as mentioned above has been made. In the case where the detection of the chip corner position is to be made, fall-down illumination is made by opening the shutter 11 of the fall-down illumination system shown in FIG. 10 while closing the shutter 18 of the oblique illumination system. In the fall-down illumination, illumination light impinges upon the surfaces of the inner leads 2 and IC chip 4 from a direction substantially perpendicular thereto. Since the surface of the IC chip 4 is smooth, many regular reflection components are produced though there is the bright and darkness of a circuit pattern. As a result, the IC chip is detected with bright appearance. On the other hand, since the surfaces of the inner leads are rough, many diffused components are produced. As a result, the inner leads 2 are detected with appearance which is dark in comparison with the surface of the IC chip 4. However, since bumps 3 on the IC chip 4 are formed through plating, the surface of the bump 3 is rough. Therefore, the bumps 3 are detected with dark appearance, like the inner leads 2. Accordingly, if a state in which the inner leads 2 are superimposed on the IC chip 4 is detected through the fall-down illumination, an image is obtained in which the inner leads 2 and the bumps 3 are both dark and only the chip surface is bright. By binary-coding such an image, a binary image as shown in FIG. 17a is obtained. In the chip corner position detecting method, two approximate lines of the periphery of the IC chip 4 in the X and Y directions are determined from the binary image shown in FIG. 17a and a chip corner position C is detected as a point of intersection of the two approximate lines. A procedure of linear-approximating the periphery of the chip in the X direction is as follows:

(1) The waveform pellet-pr(X) (see FIG. 17b) of projection of "1" portion along the X direction with a projection width shown in FIG. 17a is produced. A search is made for this projection waveform from the left side by virtue of a threshold value $Th_p$ to find out the first point $p_e$ of intersection of the waveform and the threshold level. A search range as shown in FIG. 17b is established with its start point which is a point advanced from the point $p_e$ by $d_p$. Such a start point is selected in order that a range in which the periphery of the IC chip 4 in the X direction can be correctly searched is established even if the inclination angle 8 of the IC chip 4 is large.

(2) A search is made for the binary image of FIG. 17a in the search range along the Y direction from the upper end of the image to extract points at which the image first changes from "0" (shaded portion) to "1" (white portion). See FIG. 17c.

Figure 17C:
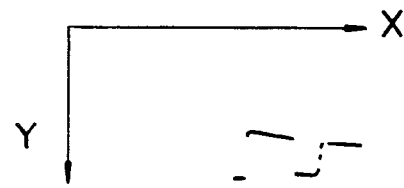

(3) As shown in FIG. 17c, at a portion where the inner lead 2 is superimposed on the IC chip 4, portions other than the chip periphery are extracted. Therefore, extracted points corresponding to the vicinity of the leads are eliminated or masked by use of the lead position data which has already been obtained from the above-mentioned oblique illumination image. See FIG. 17d.

Figure 17D:
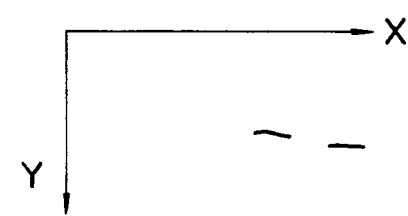
Figure 17E:
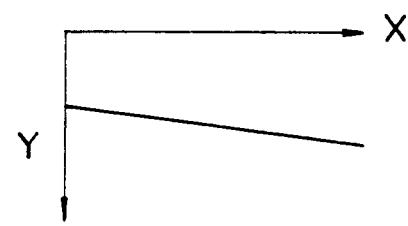

(4) Based on the results of extraction of the chip periphery as shown in FIG. 17d, an approximate line of the periphery of the IC chip 4 in the X direction is determined through the method of least squares. See FIG. 17e.

An approximate line of the periphery of the IC chip 4 in the Y direction is determined in accordance with a similar procedure.

In this manner, the chip corner position C shown in FIG. 13 can be determined as a point of intersection of the approximate lines in the X and Y directions.

Figure 18:
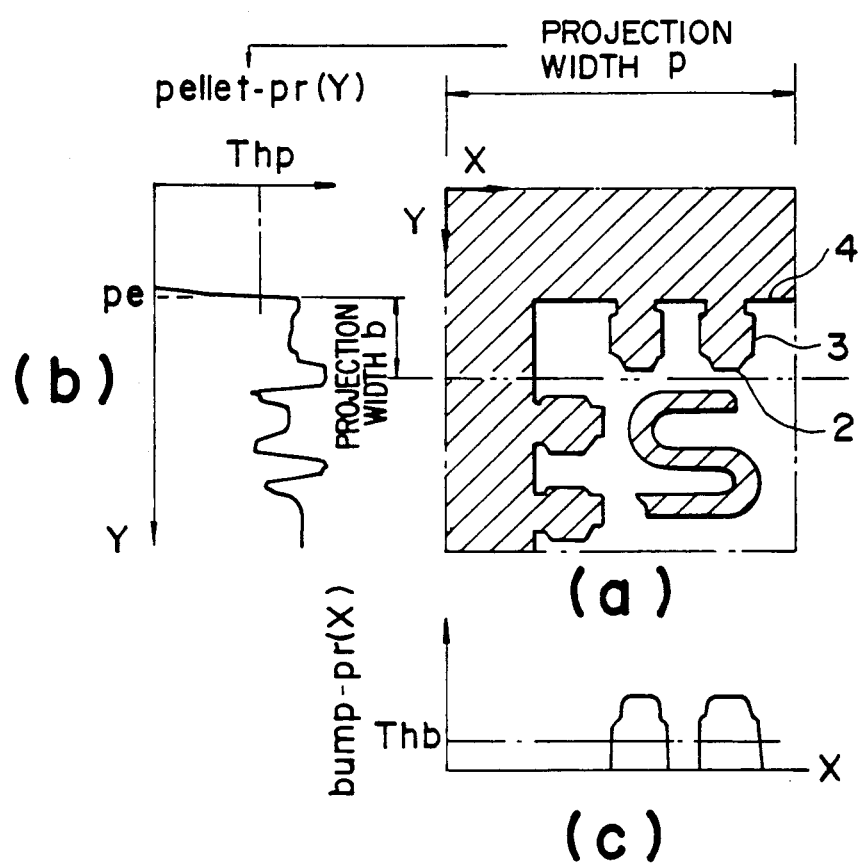

Next, a method of determining an average bump position as the chip position C will be explained by use of FIGS. 18 and 19. Like the above-mentioned chip corner position detection, the detection of bump positions is made after the detection of the lead positions has been made. In the case where the detection of bump positions is to be made, too, an image detected through fall-down illumination is used. A binary image obtained by binary-coding the detected image is shown in (a) of FIG. 18. A procedure of detecting positions of bumps in the binary image lying in the X direction is as follows:

(1) The waveform pellet-pr(y) (see (b) of FIG. 18) of projection of "1" portion along the X direction with a projection width p shown in (a) of FIG. 18 is produced. A search is made for this projection waveform from the upper side by virtue of a threshold value $TH_p$ to find out the first point $p_e$ of intersection of the waveform and the threshold level.

(2) A projection width b is set on the basis of $p_e$ and the waveform bump-pr(x) (see (c) of FIG. 18) of projection of "0" portion along the Y direction by virtue of the projection width b is produced. The projection width b is set such that a range subjected to a search is limited to a peripheral portion of the IC chip 4 at which bumps 3 exist, thereby avoiding any influence of patterns existing at the inner or central portion of the IC chip 4.

(3) A method of determining a bump position from the projection waveform bump-pr(x) shown in (c) of FIG. 18 will now be explained by use of FIG. 19. Depending on the state of alignment of the inner lead 2 and the bump 3, either one of two methods (i) and (ii) is selected which will be explained in below.

Figure 2:
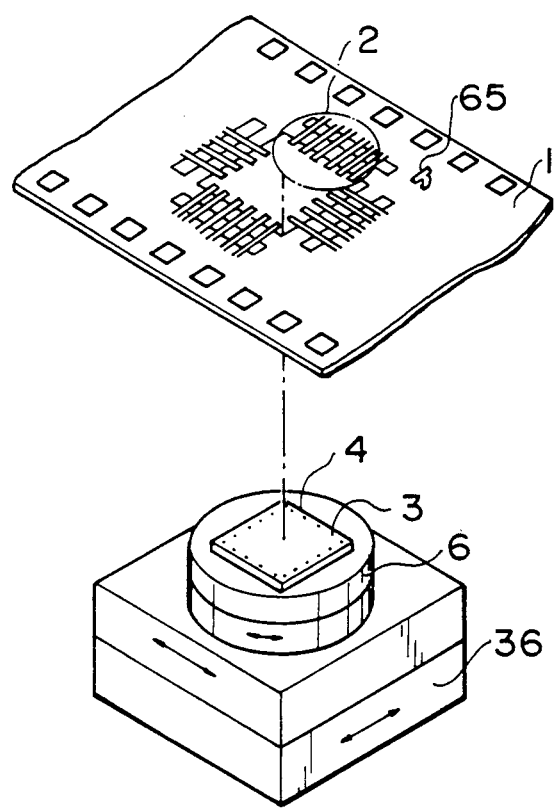
FIG. 2 is a view for explaining the conventional system.

(i) In the case where right and left side edges of the bump 3 appear on both sides of the inner lead 2, respectively (see FIG. 19a-1): A rightward/leftward search in which the lead position $L_c$ known by the lead position detection is taken as a start point (see FIG. 19a-2), is made for the waveform bump-pr(x) by virtue of a threshold value $Th_b$ to determine the respective first points $B_l$ and $B_r$ of intersection of the waveform and the threshold level in the leftward and rightward directions. The middle point of $B_l$ and $B_r$ is determined as a bump position $B_c$. See FIG. 19a-3.

(ii) In the case where one of side edges of the bump 3 disappears lying below the lead 2 (see FIG. 19b-1):

Points B′$_l$ and B′$_r$ of intersection are determined in a manner similar to the case (i). A position returned from one of the two intersection points B′$_l$ and B′$_r$ involving a longer search distance (B′$_l$ in the case of the shown example) by b$_w$/2 (b$_w$: bump width) toward the lead position L$_c$ is determined as a bump position B′$_c$. See FIGS. 19b-2 and 19b-3.

A judgement of whether either the method (i) or (ii) should be used is made using a longer one S of the search distances. More especially, the method (i) is used in the case of $$S \leq b_w - \frac{l_w}{2}$$

(l$_w$: lead width) and the method (ii) is used in the case of $$S > b_w - \frac{l_w}{2}.$$

By searching the positions of bumps in accordance with the above-mentioned procedure on the basis of all lead positions in the X and Y directions which have already been known through the lead position detection, the positions of all bumps in the field of view can be detected. In this manner, the detection of the average bump position as shown in FIG. 15 becomes possible.

Next, one example of the image processor 31 for detecting the above-explained lead position L and chip position C will be explained referring to FIG. 11.

The image processor 31 is composed of a switch 48, an A/D converter 40, a multiple state memory 41, a binary-coding circuit 42, a binary memory 43, a projection processing circuit 44 and a microcomputer 45. The image signals detected by the TV cameras 29a and 29b are alternately processed through change-over thereof by the switch 48. The image signal is A/D converted by the A/D converter 40 and is thereafter stored into the multiple state memory 41 once. The image signal is binary-coded by the binary-coding circuit 42 to obtain a binary image which in turn is stored into the binary memory 43. The microcomputer 45 establishes a projection width for the binary image and a projection waveform is obtained by the projection processing circuit 44. The projection waveform or a one-dimensional waveform is inputted to the microcomputer 45 which in turn processes it to detect the positions of leads, bumps, etc. The microcomputer 45 also controls the opening/closing of the shutters 18 and 11 of the optical detection system to select a method of illumination in accordance with the flow of image processing. Data in each image concerning the lead positions L and chip positions C detected from the images in the two fields of view, are sent from the microcomputer 45 to the mechanism controller 46.

The position detecting method according to the present invention is performed by only the repetition of processing of projection waveform. Therefore, the construction of the image processor 31 is simple and can be made small in size.

Next, an embodiment of the flow of alignment operation in a TAB bonder to which an alignment method according to the present invention is applied, will be explained by virtue of FIG. 20.

The alignment is started after the inner leads 2 and the IC chip 4 before bonding have been brought into the bonding position 39 (see step 48). First, oblique illumination is made to perform a lead position detecting step 49, thereby determining a first lead position. Thereafter, correction for lead position is made (step 50). This correction is carried out for the purpose of bringing the inner leads 2 into a position below a pressing surface of the bonding tool 7 and is made for the X and Y directions. A target position of correction is determined as follows. Namely, since the tool 7 only involves its repetitive movement over constant distances in the Y and Z directions, as shown in FIG. 10, a position of the pressing surface of the tool 7 does not change. Therefore, before actual bonding is made, a thin plate having a polyimide tape or the like sticked thereon is placed on the chip stage 6 and the tool 7 is depressed onto the thin plate in a manner similar to that made upon bonding. As a result, a brand mark is formed on the tape sticked on the thin plate. The position of the pressing surface of the tool 7 can be recognized by observing the brand mark through the TV camera 29a (or 29b) for alignment. Since the dimension of the pressing surface of the tool 7 is substantially equal to that of the IC chip 4, the IC chip 4 is set to or placed on the position of the brand mark. Thereafter, the inner leads 2 are brought into a target position, that is, the first lead position in a state in which the inners lead 2 are aligned with the IC chip 4.

After the positioning of the inner leads 2 for the pressing surface of the tool 7 has been made, a lead position detection is carried out again (step 51). In the subsequent steps, alignment is performed by moving the chip in a state in which the leads are fixed. A first lead position or an average lead position detected through step 51 is a target position in the subsequent alignment operation. Next, a chip corner position or an average bump position is detected through a chip position detecting step 52, depending on a state of alignment of the inner leads 2 and the bumps 3. In step 53, the amount of deviation of the lead position L and the chip position C from each other is checked. If the precision of alignment reaches a target or desired value, bonding is carried out (step 56). On the other hand, if the target precision of alignment is not obtained, the chip position is corrected (step 55) and the chip position detecting step 52 is repeated again.

Figure 21A:
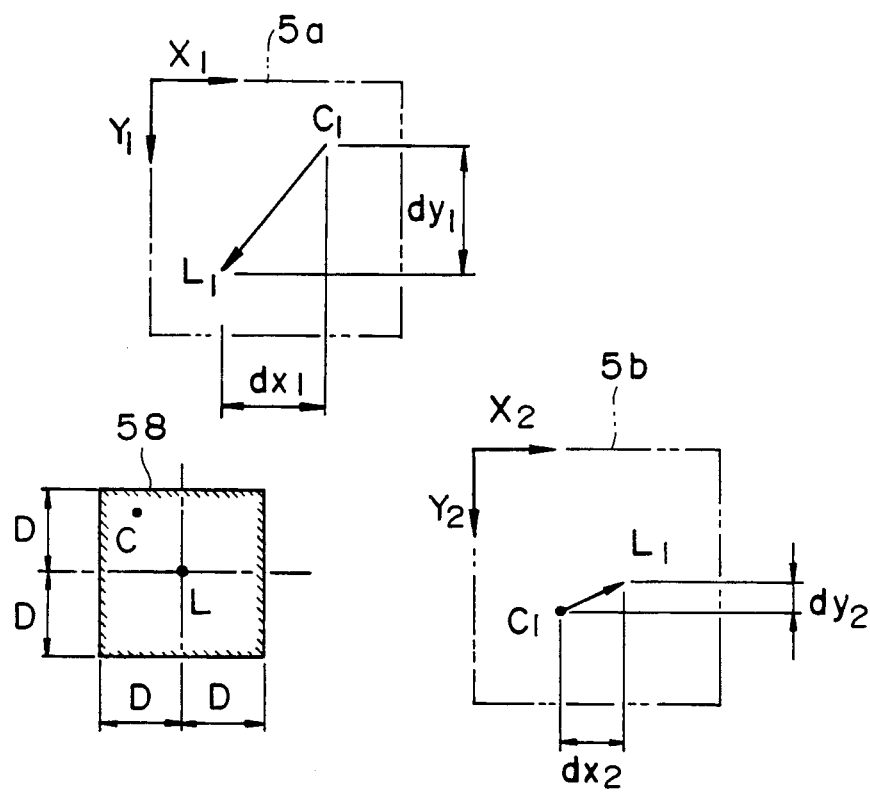
FIGS. 21a and 21b are views for explaining a deviation amount checking method.
Figure 21B:
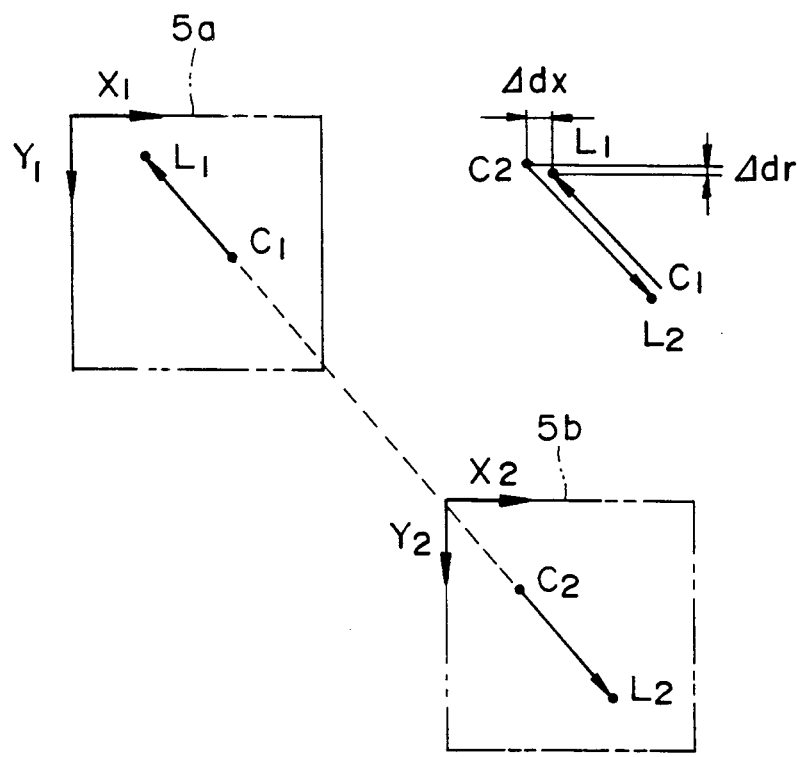

FIG. 21a illustrates the contents of the deviation amount checking step 53. When all the amounts d$_{xl}$, d$_{y1}$ and d$_{x2}$, d$_{y2}$ of deviation of the chip positions C from the lead positions L in the X and Y directions in two fields of view 5a and 5b fall within a target precision D, the alignment operation is terminated. Namely, if the chip position C in each field of view falls within an alignment precision range 58 which has widths of ±D in the X and Y directions centering at the lead position L, the alignment operation is terminated and bonding is made.

Figure 22A:
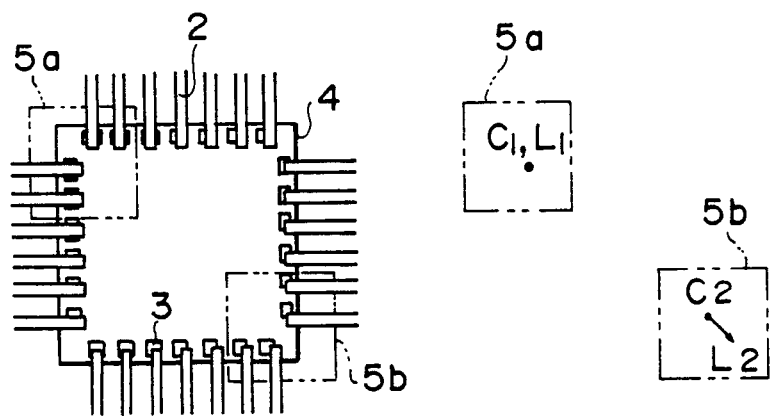
FIGS. 22a to 22c are views for explaining a two-field-of-view averaged alignment method.
Figure 22B:
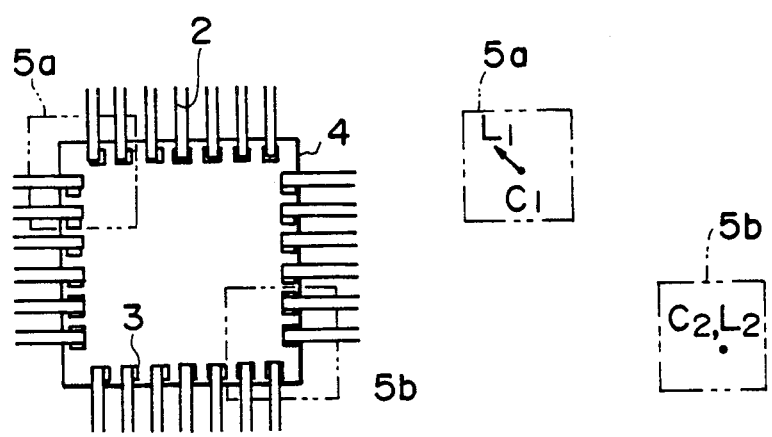
Figure 22C:
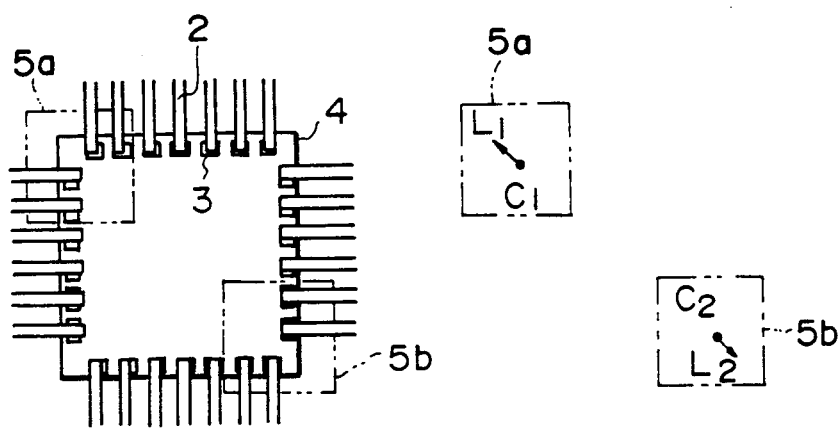

However, there may be the case where even if the alignment is made for an actual product on the basis of only the deviation amount checking method mentioned above, a desired alignment precision cannot be obtained and hence the execution of bonding is impossible. One of the causes thereof is a poor work precision. For example, though a heat-resisting material is selected and used for the tape 1 having the inner leads 2 formed thereon, any thermal distortion of the tape 1 is unavoidable since the tool 7 and the chip stage 6 heated to high temperatures are in proximity to the tape 1. Examples of alignment in the case where the tape is expanded are shown in FIGS. 22a to 22c. According to the present embodiment, alignment is to be effected in principle if the amounts of movement of the XYθ stage 36 in the X and Y directions are determined such that the chip position C coincides with the lead position L. However, in the case where the tape is larger than the IC chip 4 because of the expansion of the tape as shown in FIG. 22, the determination of the amounts of movement in the X and Y directions based on only the field of view 5a results in FIG. 22a. Namely, though satisfactory alignment of the inner leads 2 and the bumps 3 with each other is attained in the field of view 5a, the field of view 5b involves a large deviation in position. Ultimately, if the expansion of the tape is large, a position deviation vector $C_2L_2$ in the field of view 5b becomes large so that th alignment operation cannot be terminated. The same takes place also in the case where attention is directed to only the field of view 5b, as shown in FIG. 22b.

For such circumstances, in another embodiment of determination of the amounts of movement in the X and Y directions in the alignment method of the present invention, average values of the amounts of movement determined by the equations (7) and (8) and under consideration of the respective fields of view are selected as the amounts of movement in the X and Y directions. As a result, alignment is effected which involves the amounts of movement equivalent to each other in both the fields of view 5a and 5b, as shown in FIG. 22c. Thus, even for an object having a poor work precision can be realized optimum alignment adapted to the work precision.

The above-mentioned two-field-of-view averaged alignment method can provide optimum alignment even for an object the work precision of which is poor to a certain extent. However, in the case where the work precision is further deteriorated, an alignment operation cannot be terminated since a desired precision of alignment is not attainable. FIG. 21c shows a state in which the correction in the θ direction and the two-field-of-view averaged correction for position in the X and Y directions have been completed. In the shown example, however, the position deviation vectors $C_1L_1$ and $C_2L_2$ in the fields of view 5a and 5b are substantially equal to each other and each deviation vector is larger than the alignment precision range 58 shown in FIG. 21a. Therefore, so long as one relies on only the above-mentioned deviation amount checking method, it is not possible to terminate an alignment operation. In order to avoid such circumstances, the present invention additionally provides another embodiment of the deviation amount checking method which will now be described. Namely, in the case where there are satisfied all of three conditions, that is, a first condition (1) that the amount of correction in the θ direction is sufficiently small, a second condition (2) that the amount of deviation of position in each of the two fields of view is larger than a target precision and a third condition (3) that a vector ($\Delta d_x$, $\Delta d_y$) of sum of the position deviation vectors $C_1L_1$ and $C_2L_2$ in the two fields of view is smaller than a preset value $\Delta d$ in each of the X and Y directions, the impossibility of attainment of further alignment is determined and bonding is suppressed (see step 57 in FIG. 20).

In the flow of alignment operation shown in FIG. 20, the number of times of alignment is checked after the deviation amount checking step 53 has been completed and before the chip position correcting step 55 is carried out (see step 54 in FIG. 20). Primarily, so long as the determination of the amount of correction for position is correctly made, alignment is to be completed by carrying out the chip position correcting step several times. However, in the case where the convergence of alignment precision is poor due to any cause and hence the number of times of repetition of the chip position correcting step 55 exceeds a predetermined value, bonding is suppressed (see step 57 in FIG. 20).

After the suppression of bonding, an alarm is issued to indicate the occurrence of any trouble such as the inferiority of work or the inferiority of system to an operator of the bonder and the operator takes a necessary action. Such measures are effective for the discovery of a tape with a poor precision at an early stage, the prevention of occurrence of potential defects resulting from forcible bonding to an object or product having a poor work precision, the prevention of deterioration of tact resulting from the endless looping of an alignment operation, etc.

Figure 23A:
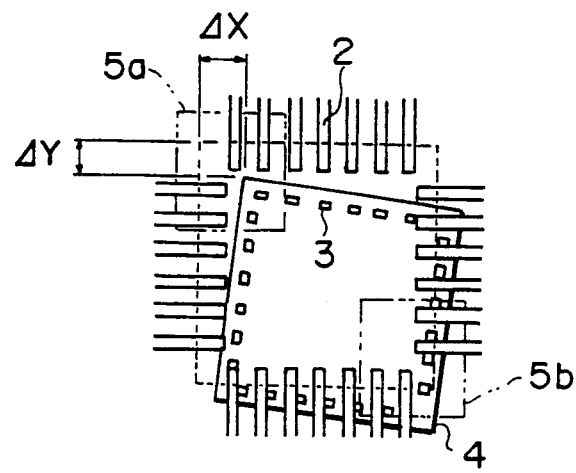
FIGS. 23a to 23c are views for explaining reinstallment from a state in which only one of diagonal corner portions of a chip is detected in either one of two fields of view.
Figure 23B:
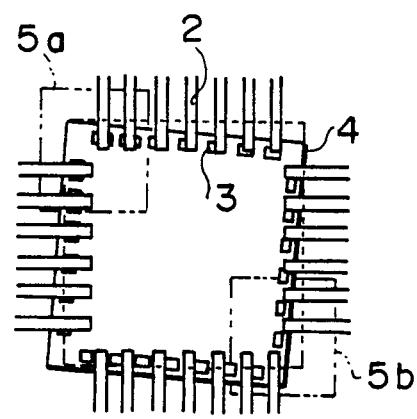
Figure 23C:
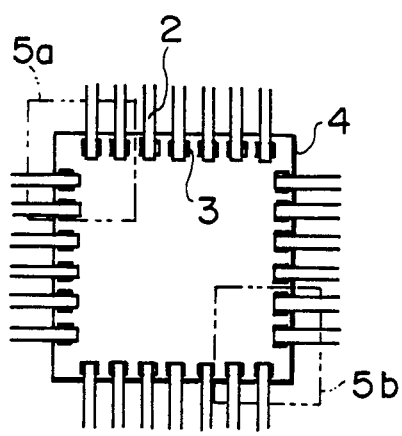

Next, a method of effecting alignment through reinstallment from a state in which only one of diagonal corner portions of the IC chip 4 is detected in either one of two fields of view, will be explained by use of FIGS. 23a to 23c. In the present invention, a state in which the inner leads 2 and a corner portion of the IC chip 4 are detected in each of two fields of view is a prerequisite for the determination of the amounts of correction for position of the XYθ stage 36. As shown by the flow of operation shown in FIG. 20, the lead position detecting step 49 and the lead position correcting step 50 are performed each time the tape 1 is advanced by one pitch. Thereby, it is possible to bring the corner portions of the IC chip 4 into predetermined positions in the two fields of view. On the other hand, the IC chip 4 is brought into the bonding position after it has been mounted onto the chip stage 6 (shown by dotted lines in FIG. 10) from a tray or the like having chips regularly arranged thereon by means of a proper transporting mechanism. If a positioning device or mechanism is provided in the course of transportation, it is easy to realize a state in which corner portions of the IC chip are included in the two fields of view, respectively. The present embodiment provides one example of applications of the alignment method according to the present invention for moderating the precision of supply of IC chip 4 in a bonder which has not such a positioning mechanism. FIG. 23a shows the case where a corner portion of the IC chip 4 is detected in the field of view 5a while any corner portion of the IC chip 4 is not detected in the field of view 5b. In that case, the amounts of correction in the X and Y directions for alignment are determined from only a position detected in the field of view 5a. Namely, the amounts ($\Delta X$, $\Delta Y$) of correction for position are determined from a first lead position and a chip corner position in the field of view 5a. After correction, corner portions of the IC chip are detectable in the two fields of view 5a and 5b, respectively, as shown in FIG. 23b. Subsequently, an alignment operation including the correction for position in the X, Y and θ directions based on position data within the two fields of view is repeated until a state as shown in FIG. 23c is obtained. However, there may be the case where the inclination of the chip is so large that one of diagonal corner portions of the IC chip 4 falls in neither of the two fields of view notwithstanding that the correction for position in the X and Y directions has been made. In such a case, the amount of correction in the θ direction cannot be determined and hence any further alignment is impossible. Therefore, automatic bonding is suppressed and an assistance is requested to an operator of the bonder. According to the present embodiment, any mechanism, device or the like for the exclusive use for the purpose of positioning of the IC chip 4 other than the alignment apparatus according to the present invention is not required and hence the construction of the bonder can be simplified.

The present invention includes several values to be preliminarily set prior to an alignment operation. Embodiments of methods of setting such values will now be explained.

Figure 14:
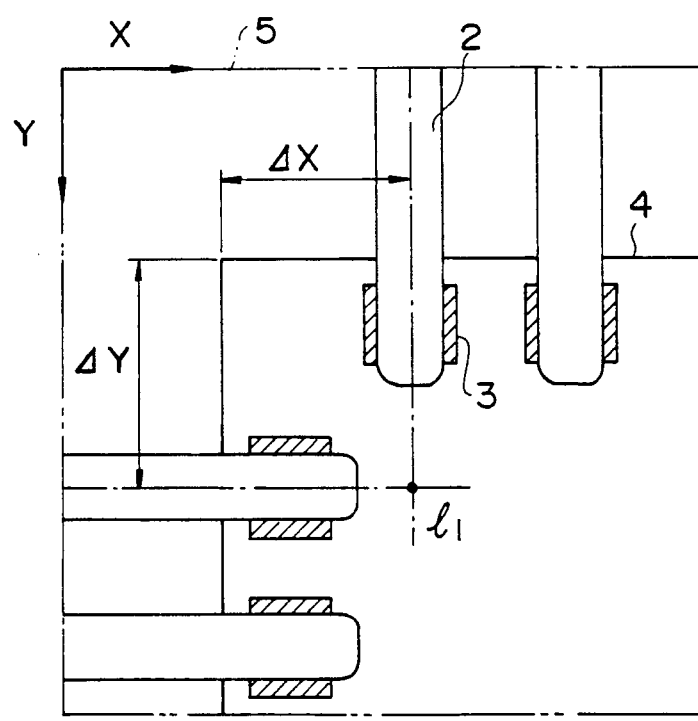

First, a method of setting the amounts $\Delta X$ and $\Delta Y$ of correction for the first lead position as shown in FIG. 14 will be explained. Initially, it is required to obtain a state in which the inner leads 2 and the bumps 3 are aligned with each other in each of two fields of view. Such an aligned state is obtainable by moving the $XY\theta$ stage 36 in a manipulative manner while observing the detection images of the TV cameras 29a and 29b (shown in FIG. 10) through a monitor (not shown). After alignment, the lead position detecting step 51 and the chip position detecting step 52 shown in FIG. 20 are performed to automatically detect the first lead position and the chip corner position in accordance with the algorithm which has already been mentioned. A difference between both the positions is determined as the amount of correction for the first lead position in each field of view. According to the present method, the amount of correction can be determined depending on an appearance state of the peripheral pattern of the IC chip 4. Also, the present method can readily cope with any alteration or modification required for different kinds of IC chips by merely performing a manipulative alignment operation once before bonding. Further, since no design value is used, it is possible to provide the optimum amount of correction even to an object having poor work precision.

Next, a method of setting the positions $O_1$ and $O_2$ of the fields of view 5a and 5b as shown in FIG. 12 will be explained. An alignment mark 60 is provided on the chip stage 6 shown in FIG. 24a. Since the surface of the chip stage 6 having a black coating is detected with dark appearance, the alignment mark 60 is made of a material the surface of which is detectable with bright appearance. The chip stage 6 is constructed such that it is fixed on the 8 stage of the $XY\theta$ stage 36 and the alignment mark 60 coincides with the center of rotation of the $\theta$ stage. In constructing the chip stage 6, the mark 60 is observed while rotating the $\theta$ stage and the direction of eccentricity of the center of rotation of the $\theta$ stage is ascertained on the basis of the movement of the mark 60. By moving the chip stage 6 by means of a fine adjustment mechanism in accordance with the ascertained direction of eccentricity, the eccentricity between the center of rotation of the $\theta$ stage and the mark 60 is eliminated.

Further, the alignment mark 60 is detected within each field of view 5, as shown in FIG. 24b, and the positions $O_1$ and $O_2$ of origins of the two fields of view can be determined in terms of the stage coordinate system on the basis of a position of the detected mark 60 in the field of view and a position of the stage when the detection is made.

Next, an embodiment of means for detecting the position of the alignment mark 60 in the field of view will be explained referring to FIG. 24b. First, the $XY\theta$ stage 36 is moved to bring the alignment mark 60 into the field of view 5. An image of the mark 60 is taken into the TV camera and is binary-coded. Thereafter, the waveform of projection of "1" portion is produced in a manner similar to that made in the case of detecting the lead position. A projection width is selected to be equal to the whole of the image. As for each of the waveforms projected in the X and Y directions, points of intersection of the waveform and a proper threshold level are determined and the middle point of the intersection points is determined as a position of the mark 60 in the field of view.

In another embodiment as shown in FIG. 24c, a binary image of the alignment mark 60 is stored in a reference pattern memory area 59 and a position of the mark 60 is determined by subjecting the stored binary image and an image of the field of view 5 inclusive of the detected mark 60 to a well-known pattern matching process.

In a further embodiment, a position of the mark 60 is determined by circumscribing a cursor or the like about the outer periphery of the mark 60 detected in an image of the field of view 5.

Next, an embodiment of an inner lead bonding method making the best use of a feature of the alignment method according to the present invention that the inner lead 2 and the bumps 3 are simultaneously detected at the bonding position 39, will be explained by virtue of FIGS. 25a to 25e.

Figure 25A:
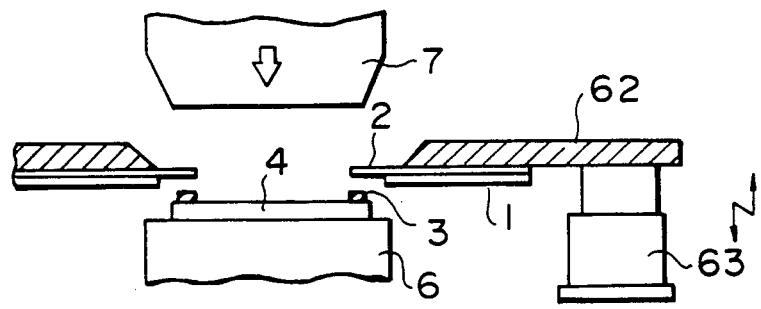
FIGS. 25a to 25e are views for explaining bonding after leads and bumps are brought into proximity to each other.
Figure 25B:
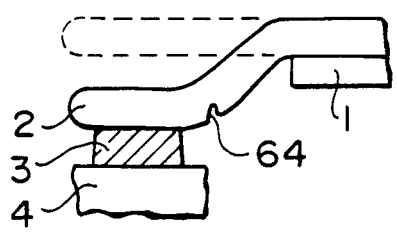
Figure 25C:
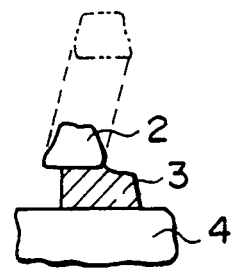

In FIG. 25a showing a construction around objects to be bonded to each other, reference numeral 62 designates a tape guide for guiding the tape 1, and numeral 63 designates a Z stage for tape connected to the tape guide 62. Alignment is effected by moving the IC chip 4 so that the bumps 3 are aligned with the inner leads 2 which are held in a fixed state. For that purpose, a small gap is provided between the inner leads 2 and the bumps 3. However, if thermocompression bonding by the tool 7 is carried out after the alignment has been made and in a state the above-mentioned gap is kept, a crack 64 is liable to generate at a bent portion of the inner lead 2, as shown in FIG. 25b. Also, there may be a possibility that the inner lead 2 shifts sideways during depression of the tool 7, as shown in FIG. 25c, thereby deteriorating the precision of alignment after the thermocompression bonding. The sideways shift may be caused by the inferiority of parallelity of the pressing surface of the tool 7 relative to the surface of the IC chip 4 or the deviation of a direction of depression of the tool 7 from a direction perpendicular to the IC chip 4.

Figure 25D:
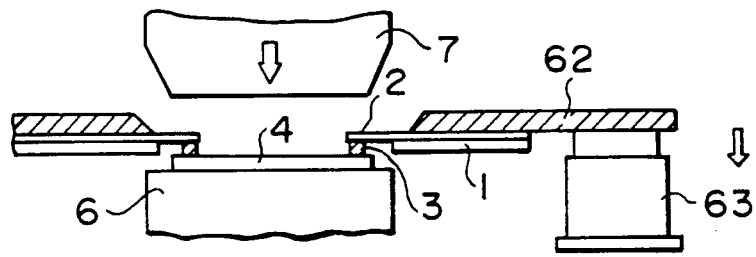
Figure 25E:
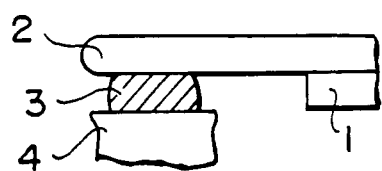

In order to solve the above-mentioned problems, the present embodiment includes lowering the Z stage 63 for tape after the completion of alignment to bring the inner lead 2 into proximity to the bump 3, as shown in FIG. 25d, and thereafter performing thermocompression bonding. As a result, the bonding can be effected without bending the inner lead 2, as shown in FIG. 25e, thereby preventing the generation of the crack 64. Also, the sideways shift of the inner lead upon depression of the tool 7 does not almost generate. However, since the Z stage 63 for tape is driven or moved after alignment, a sideways shift as shown in FIG. 25c may be produced if the direction of movement of the Z stage 63 is inclined with respect to the IC chip 4. This problem can be solved by offset alignment since such a sideways shift is a reproducible phenomenon. Namely, the amount of deviation of the lead 2 caused by the movement of the Z stage 63 for tape is added as an offset to the lead position L (see FIG. 21a) in each field of view which is a target position for alignment, and the alignment of the inner leads 2 and the bumps 3 is made while taking the offset lead position as a new target position. According to this method, the inner leads 2 and the bumps 3 are aligned in a shifted state. If the Z stage 63 for tape is lowered after such alignment, the inner lead shifts sideways by a constant distance so that bonding with correct alignment of the inner lead 2 and the bump as shown in FIG. 25d can be made.

The amount of deviation of the lead 2 caused by the movement of the Z stage 63 for tape can be determined by detecting positions of the lead 2 before and after the lowering of the Z stage 63, respectively, to determine a difference therebetween.

In the shown embodiment, two diagonal corner portions of the IC chip 4 having been detected However, the present invention is not limited to the detection of the diagonal corner portions so long as two any corner portions are detected. Also, though two fields of view have been simultaneously detected by use of two heads, a one-head detection system may be used in such a manner that it is moved to detect the two fields of view. Further, it is of course that the position detecting method mentioned in conjunction with the shown embodiment is applicable to the case where only one field of view is involved and is also applicable to alignment in two (X and Y) directions. If the shown embodiment is used together with a chip/tape position detecting method utilizing a well-known pattern matching technique, it is applicable to any object where highly precise alignment is required. Though the ring-like illumination device 20 has been used for the oblique illumination in the shown embodiment, any device such as an illumination device composed of a plurality of glass fibers can be alternatively used so long as it has a function of illuminating an object uniformly or equally from oblique directions. Light for the fall-down illumination in the shown embodiment has been conducted through the objective lens 14. However, the fall-down illumination light may be introduced from a path between the objective lens 14 and an object to be illuminated.

In the present invention, alignment in X, Y and $\theta$ directions is realized in a non-contact manner after the supply of the LC chip 4. Therefore, the occurrence of any inferiority upon alignment including the cracking of the chip or the breakage of the edge thereof can be prevented.

Next, an embodiment of a pressing mechanism used in the present invention will be explained.

Figure 26A:
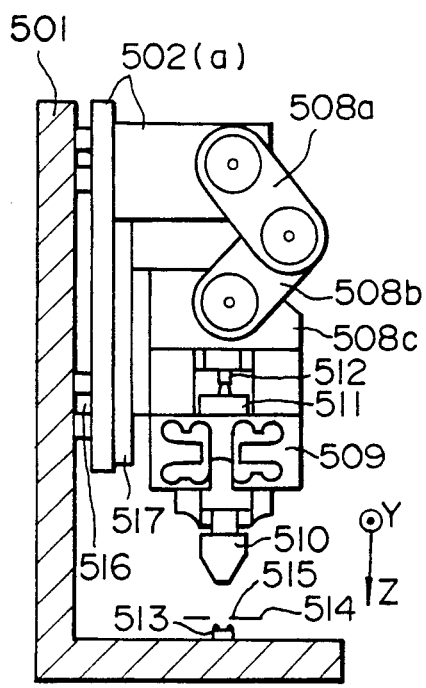
FIGS. 26a and 26b are front and side views of a bonding tool raising and lowering (upward/downward movement) mechanism.
Figure 26B:
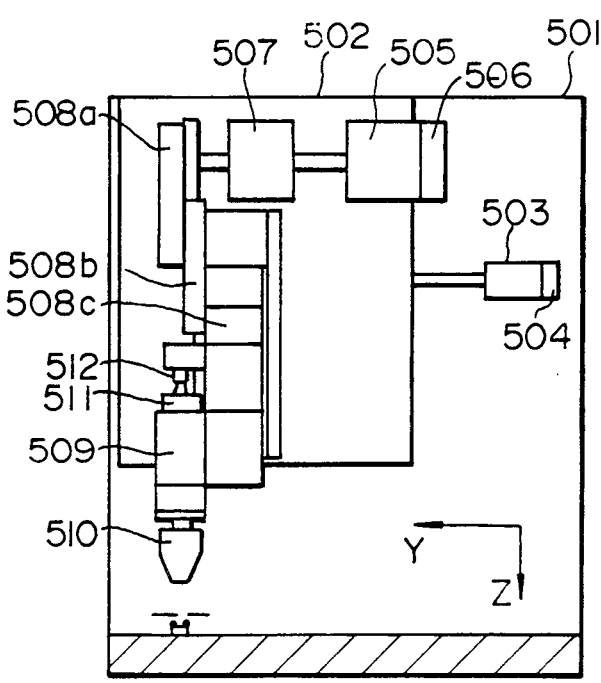
Figure 27:
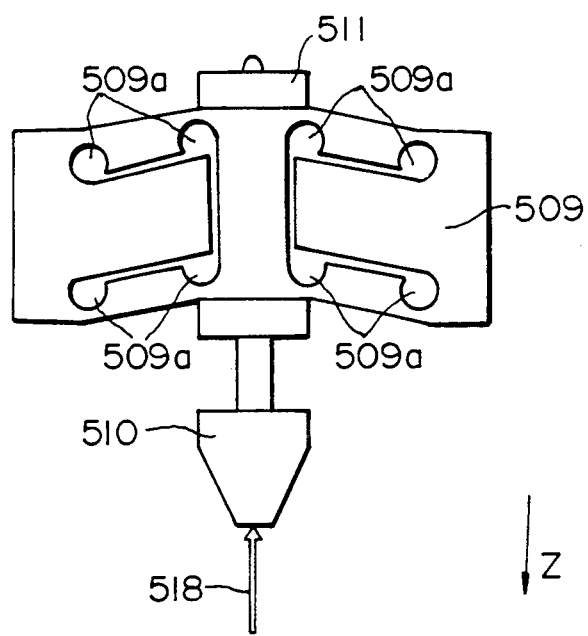
FIG. 27 is a view showing the main part of the bonding tool raising and lowering mechanism shown in FIGS. 26a and 26b.

FIGS. 26a and 26b are front and side views of a tool upward/downward movement mechanism for raising and lowering the bonding tool according to the present invention. A tool stage 502 mounted slidably in the Y direction relative to a base 501 is driven by a permanent magnet type of D.C. servo motor 503. A permanent magnet type of D.C. servo motor 505 is provided on the tool stage 502 for driving a tool 510 to change the angle of an input link 508a of a link mechanism 508 through a harmonic drive 507 for deceleration. An output link 508c of the link mechanism 508 is movable upward and downward along a slide guide mechanism 517 so that a tool support 509 and the tool 510 coupled to the output link 508c move upward and downward. The tool support 509 is provided with notches 509a (see FIG. 27). Therefore, if a force component 518 in the Z direction is applied to the tip of the tool, the tool support 509 elastically deforms so that an upper surface of the tool support 509 is pressed against a load cell 511, as shown in FIG. 27. The load cell 511 generates a strain signal in accordance with the contact or pressure force. A gap or distance between the load cell 511 and the upper surface of the tool support 509 is changeable through fine adjustment of a screw 512. Initial adjustment of the gap is made by turning the screw 512 up to a position at which a contact force generates between the load cell 511 and the screw 512 in a state in which any external force corresponding to the force 518 shown in FIG. 27 does not act on the tool 510.

Figure 28:
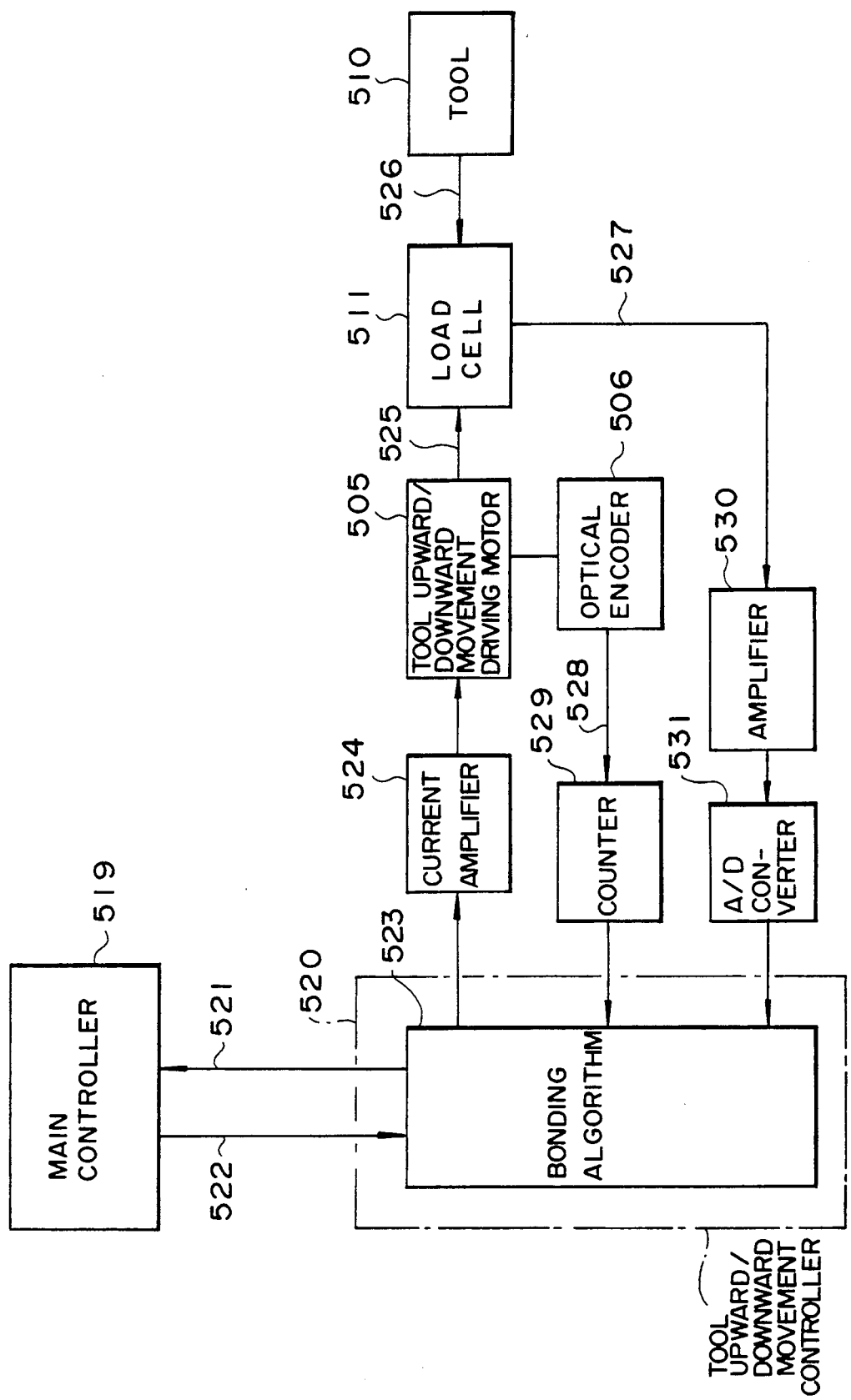
FIG. 28 is a circuit block diagram for performing a tool drive control.

FIG. 28 shows a block diagram of a system. In FIG. 28, reference numeral 519 designates a main controller for managing the whole of the bonding apparatus, and a box 520 shown by one-dotted lines represents a tool upward/downward movement controller. A bonding command 522 issued from the main controller 519 is processed by a bonding algorithm 523 to effect a tool drive control Upon completion of bonding, the bonding algorithm 523 analyzes data concerning the bonding and sends the results 521 of analysis to the main controller 519.

The contents of the bonding algorithm will be explained later in detail.

The tool upward/downward movement controller 520 receives the output of a counter 529 inputted with an output pulse signal 528 of an optical encoder 506 coupled to the tool upward/downward movement driving motor 505 to detect a position of the tool in the Z direction. The controller 520 also receives as a digital quantity a force detection value 527 of the load cell 511 determined by the displacement 525 of the rotation angle of the motor 505 and the displacement 526 of the tool 510 through an amplifier 530 and an A/D converter 531. The detection of the tool position in the Z direction and the detection of the force are carried out at the same intervals of time. The bonding algorithm 523 performs a predetermined operation based on the results of detection within each interval of time to determine a current value (or output current command valve) to be outputted to the motor 505 through a current amplifier 524.

Now, an operation of the tool upward/downward movement driving mechanism will be explained along a flow chart shown in FIGS. 29 and 30.

Figure 29:
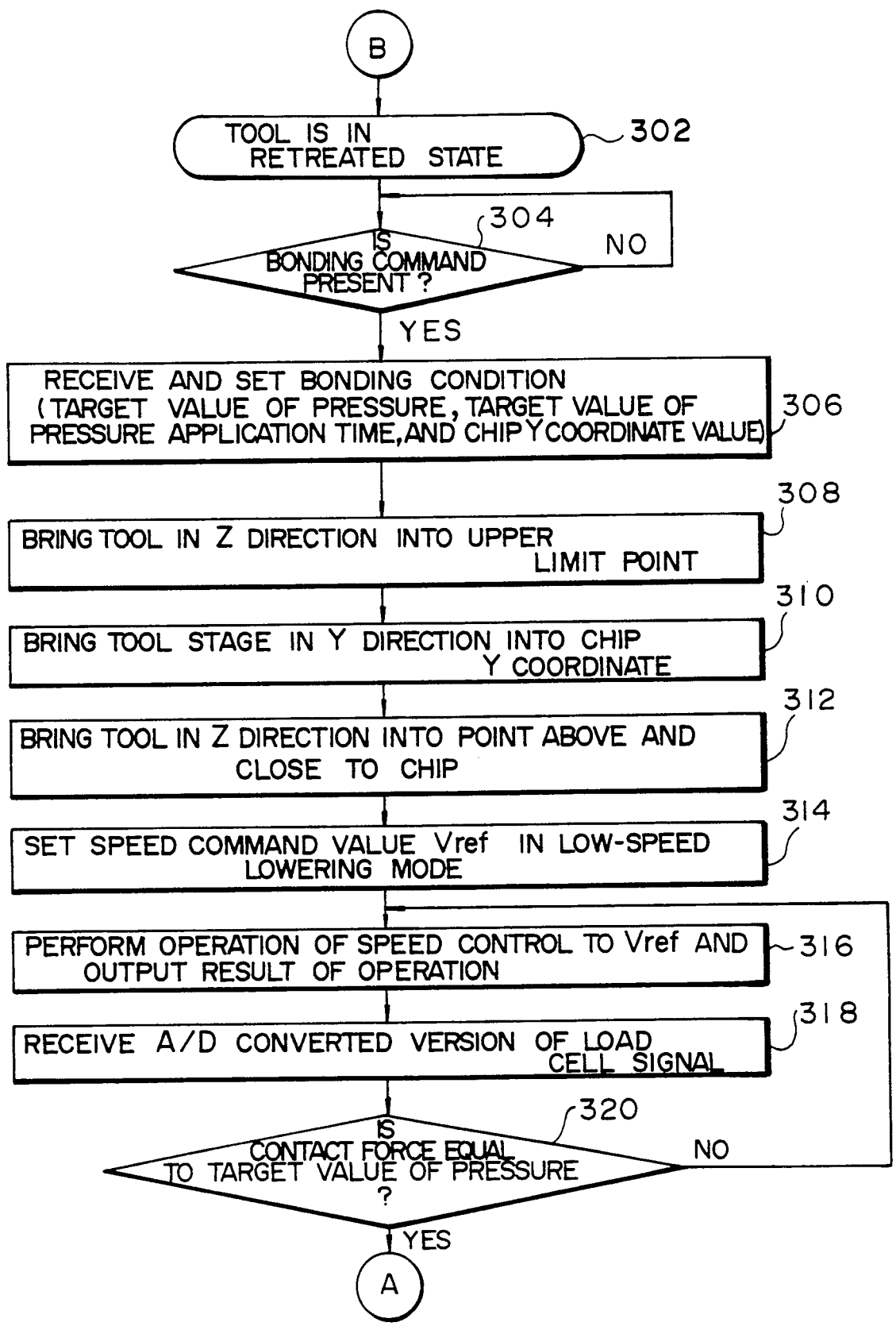
FIGS. 29 and 30 show as a whole a flow chart of the operation of a tool upward/downward movement driving mechanism.
Figure 30:
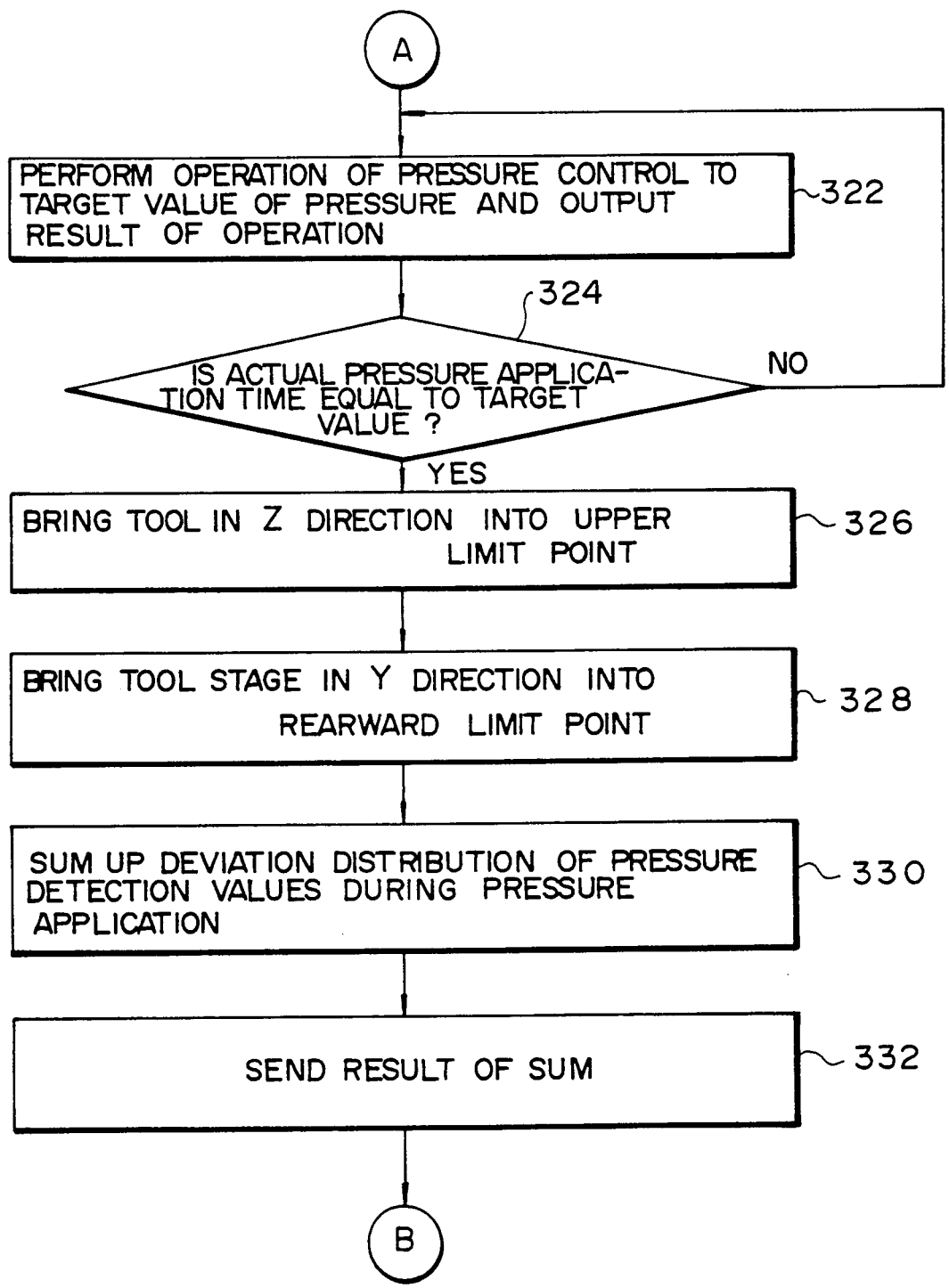

Before each bonding operation is started, the tool stage is in a state in which it is retreated and is awaiting the completion of alignment of the chip and the leads (see 302 in FIG. 29). In this state, any communication from the main controller 519 is always monitored to judge the presence or absence of a bonding command (step 304). After the alignment has been completed, the main controller 519 delivers in a block form the bonding command and data including a Y coordinate value $T_y$ of the chip position, a target value $F_B$ of pressure to be applied and a target value $T_B$ of pressure application time. The bonding command and the data are received by the tool upward/downward movement controller 520 which in turn stores respective data as variables of a control program and thereafter goes into a state in which it controls the driving of the tool upward/downward movement mechanism (see step 306).

First, the tool is moved in the Z direction into an upper limit point and is stopped thereat (step 308). Next, the tool stage is moved forward in the Y direction and is stopped at the chip position $T_y$ (step 310). Thereafter, the tool is moved in the Z direction to a preestimated point $A_z$ at which a distance between the tip of the tool and the chip takes a predetermined value, and is stopped thereat (step 312). Next, a predetermined speed command value $V_{ref}$ is introduced or set into a control algorithm (step 314) and the tool is brought into a position close to the chip and the leads while maintaining the speed of the tool in the Z direction by use of a speed control algorithm (step 316). At the same time, the value of a signal from the load cell is monitored to judge the presence or absence of contact between the tool and the chip (step 318). The steps 316 and 318 are repeated until the value of the signal detected by the load cell becomes equal to a value corresponding to the target value $F_B$ of pressure to be applied (step 320).

A feedback control is made for the detection signal value of the load cell corresponding to the target value of pressure to be applied (step 322). At a point of time when an actual time consumed for the feedback control of the pressure becomes equal to the target value of pressure application time (see step 324), the tool is moved in the Z direction into the upper limit point and is stopped thereat (see step 326). Further, after the tool stage is moved in the Y direction into a rearward limit point and is stopped thereat (step 328), the deviation distribution of detection values of pressure during pressure application is summed up (step 330) and the result of sum is sent to the main controller, thereby terminating one cycle (step 332).

Figure 31A:
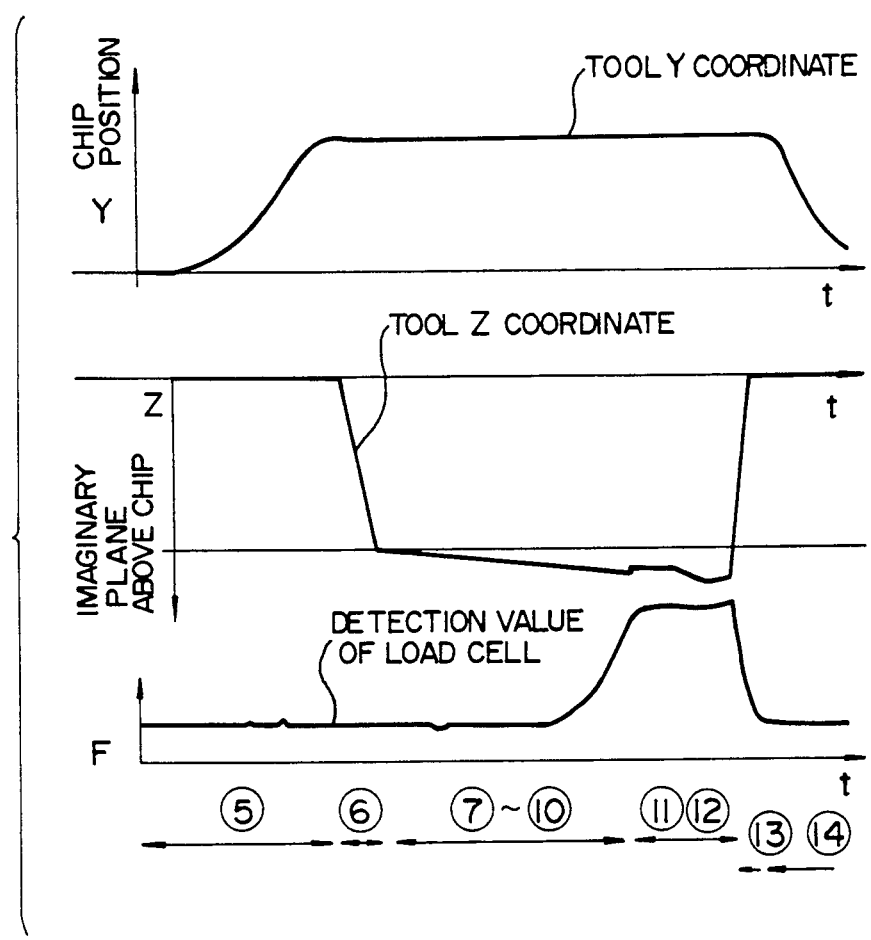
FIGS. 31a and 31b are views which typically illustrate the movement of a tool.
Figure 31B:
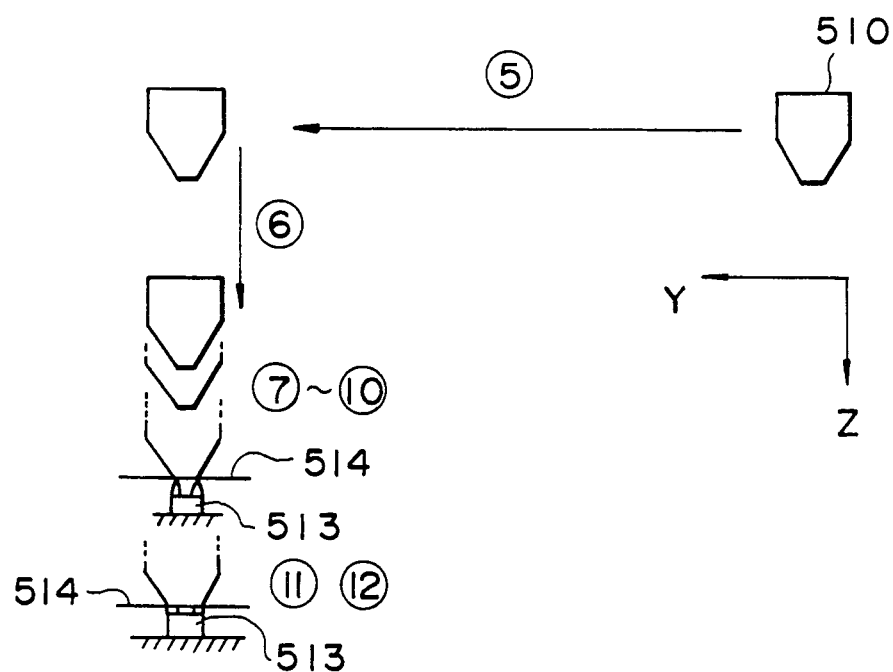

FIGS. 31a and 31b typically illustrate the movement of the tool according to the present invention. FIG. 31a shows the change of coordinate values of the tool with respect to time and FIG. 31b shows the special movement of the tool. ⑤ and ⑥ represent modes in which positioning is made, ⑦ to ①⓪ represent modes in which the detection of a pressure or contact force is continued while lowering the tool at a low speed, and ①① and ①② represent modes in which a feedback control is made on the basis of the detected pressure to hold the actual pressure at the target value.

Figure 32A:
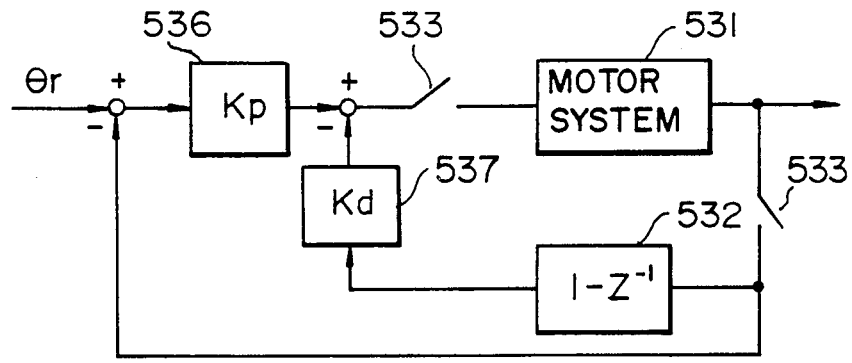
FIGS. 32 a to 32c are block diagrams showing control operation systems in modes shown in FIGS. 31a and 31b.
Figure 32B:
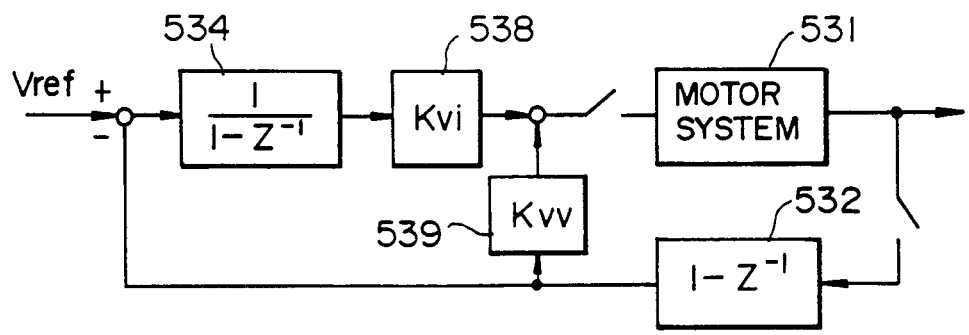
Figure 32C:
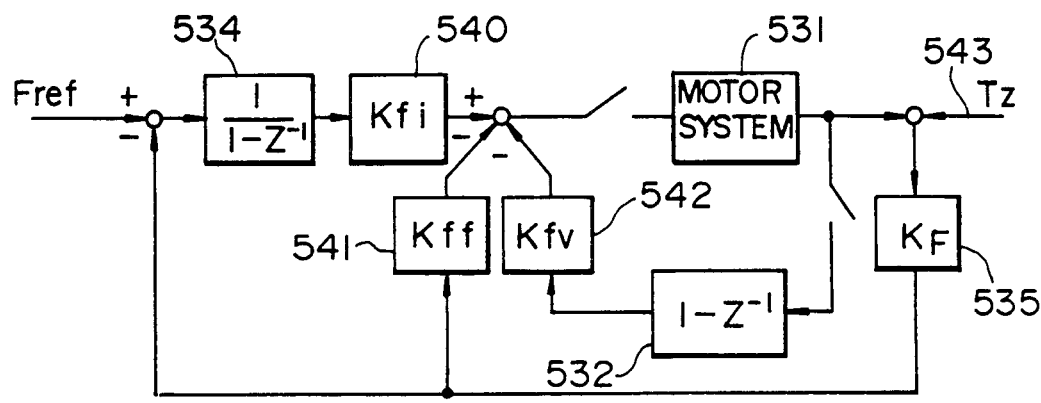

Control operation systems in the respective modes are shown by block diagrams of FIGS. 32a to 32c. In the figures, reference numeral 531 represents a synthetic block of the current amplifier 524, motor 505 and optical encoder 506 shown in FIG. 28 and is hereinafter referred to as motor system. Numeral 532 represents a differential element for producing a difference between two consecutive components of a time series signal, more especially, a mechanism for making approximate differentiation of the motor output shaft rotation angle as the output of the motor system 531 to obtain an angular speed of rotation as a digital quantity. Numeral 533 represents a sample/hold element, and numeral 534 represents an element having a function inverse to the differential element 532, that is, an integrator for making approximate integration. Symbol Z represents a Z convertion factor.

In the respective modes, a time series m(K) (K=1, 2, —) of output m to the motor system is operated as follows:

$$m(K) = K_p\{\theta_4(K) - \theta(K)\} - K_v\{\theta(K) - \theta(K-1)\} \quad (a)$$

In this mode, $\theta_r$ is not a constant value but is division values between a given position and a target position.

$$i(K) = i(K-1) + K_{vi}\{v_{ref} - (\theta(K) - \theta(K-1))\}; i(\theta) = 0 \quad (b)$$

$$m(K) = i(K) - K_{vv}\{\theta(K) - \theta(K-1)\}$$

In this mode, $v_{ref}$ is a constant value, as has been mentioned above.

$$i(K) = i(K-1) + K_{fi}\{F_{ref} - K_f(\theta(K) - T_Z(K))\} \quad (c)$$

$$m(K) = i(K) - K_{ff}\{F_{ref} - K_F(\theta(K) - T_Z(K))\}$$

In this mode, $F_{ref}$ is a constant.

Figure 33:
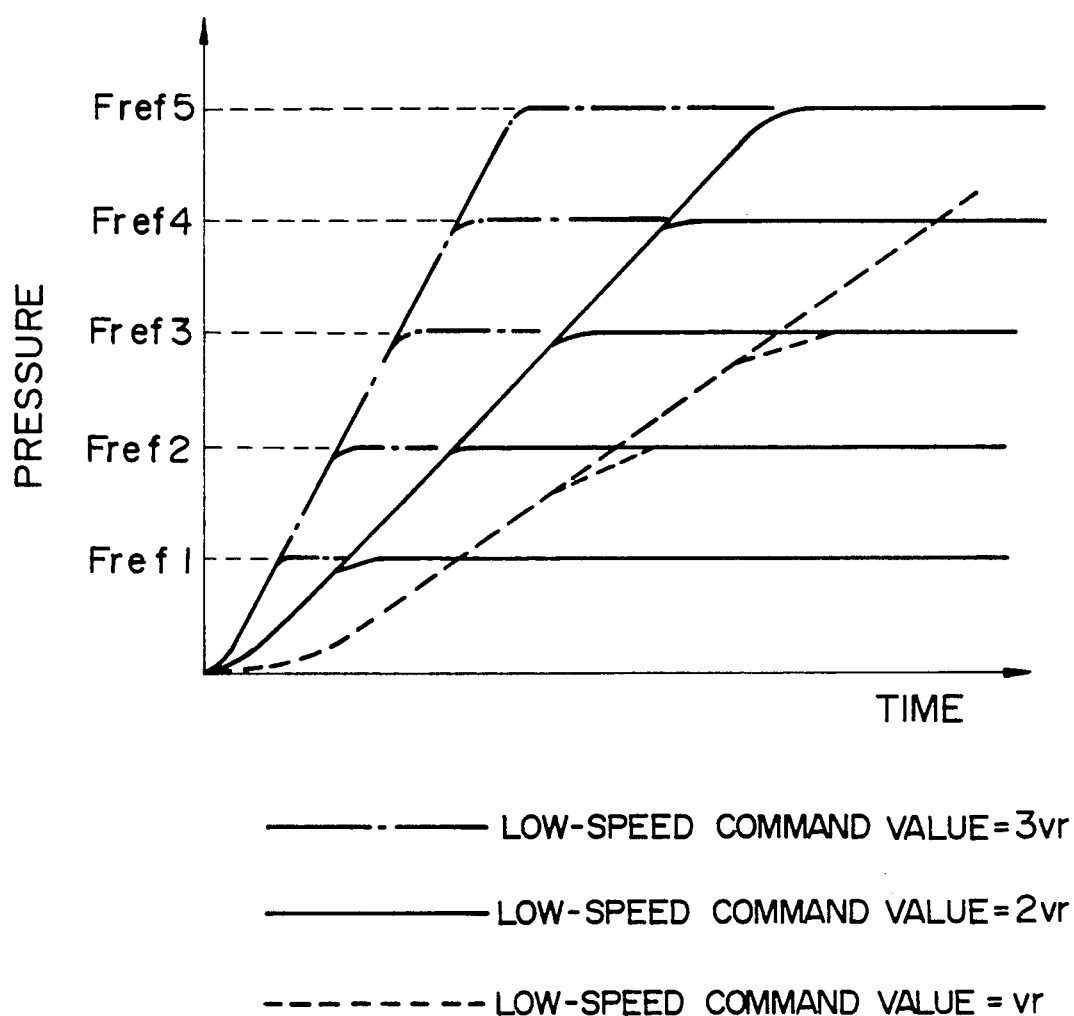
FIG. 33 is a view for explaining the conditioning of a tool upward/downward movement mechanism.

When bonding is made by the tool upward/downward movement mechanism, such a conditioning as shown in FIG. 33 can be realized. First, the speed of increase in a pressure or the gradient of a curve shown in FIG. 33 is substantially by $K_F \cdot v_{ref}$, depending on a repulsive characteristic $K_F$ of an object which the tool contacts. Accordingly, it is possible to obtain an arbitrary gradient of a pressure in rise thereof by arbitrarily changing a low-speed command value which is a parameter the setting of which is possible. The target value $F_{ref}$ of a pressure to be applied is also changeable since it may be one variable in a program.

Figure 34:
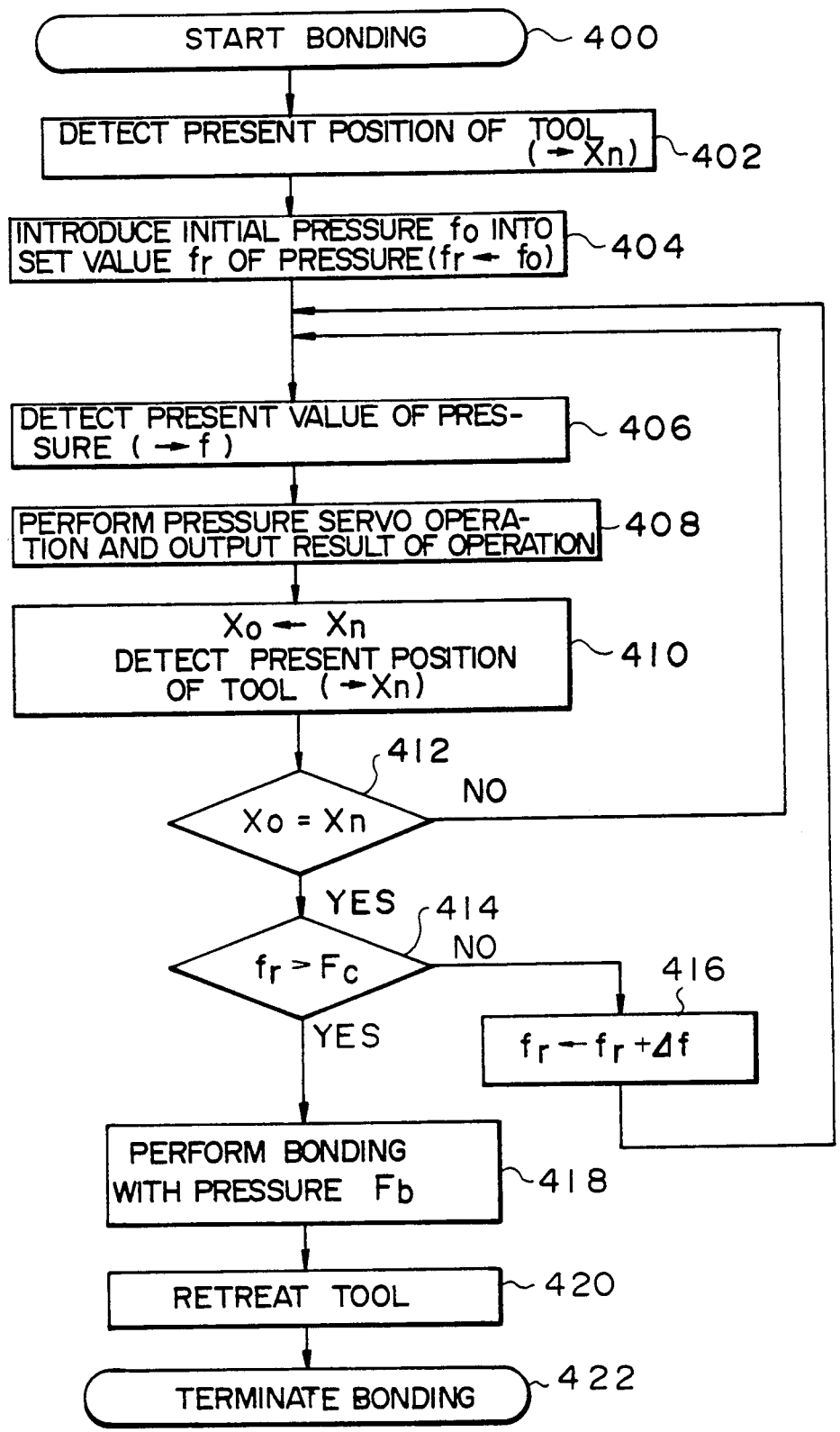
FIG. 34 is a flow chart showing an example of applications of a pressure application control.

Next, explanation will be made of one example of applications of the present embodiment capable coping with the case where any variation or difference in height of bumps on the chip to which bonding is to be made. FIG. 34 shows a flow chart of this application and FIGS. 35a to 35e show behaviours of the tool and the bumps in this application.

At an initial stage, the tool is in a state in which it is away from a pellet (or IC chip) and the leads (see step 400 in FIG. 34). In response to a bonding start command, the controller detects the amount of movement of the tool so that it is stored as a present value into a memory (step 402). Subsequently, an initial pressure $f_o$ is introduced into a set value $f_r$ of pressure to be applied (step 404) and the process goes to the repetitive execution of a tool drive control program.

First, the pressure is detected (step 406). And, a servo operation for the set value $f_r$ of pressure to be applied is performed and the result of operation is outputted to means which changes a tool driving force (step 408). Subsequently, the amount $x_n$ of movement of the tool is detected and is compared with a preceding detection value $x_o$ (steps 410 and 412). If $x_o$ and $x_n$ are not equal to each other and the tool is moving, the process is returned to the step 406 while maintaining the set value $f_r$ of pressure to be applied as it is. This corresponds to a state in which the tool is not in contact with the pellet or a state in which the tool is pressing down the bumps with a pressure not larger than the initial pressure $f_o$.

In the case where $x_o$ and $x_n$ becomes equal to each other and there is no movement of the tool, the set value $f_r$ of pressure is increased by an increment $\Delta f$ and the process is returned to the step 406 (steps 414 and 416). This corresponds to a state in which the tool and the bumps are kept in an equilibrium with the bumps being pressed by the tool.

After the repetition of the steps 406 to 414 has been continued until the set value $f_r$ of pressure becomes larger than a value $F_c$ with which the start of bonding is possible, a bonding operation is performed taking a predetermined bonding load $F_b$ as the set value of pressure (step 418). Thereafter, the tool is retreated, thereby terminating the bonding operation (steps 420 and 422). The value of $F_c$ is experimentally determined so as to satisfy a condition that sufficiently many bumps are brought into contact with the tool.

FIGS. 35a to 35e illustrate a change of contact states of the tool 7 and bumps 3a and 3b along the progression of the above-mentioned algorithm. For the provision of easy understanding, the shown bumps 3 are limited two bumps, that is, one 3a which earliest contacts the tool 7 and the other 3b which latest contacts the tool 7 before the set value $f_r$ of pressure becomes larger than $F_c$.

Figure 35A:
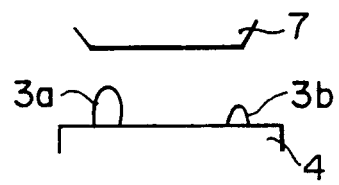
FIGS. 35a to 35e are views showing the behaviours of a tool and bumps in FIG. 34.
Figure 35B:
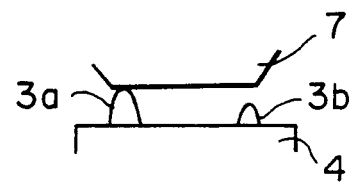
Figure 35C:
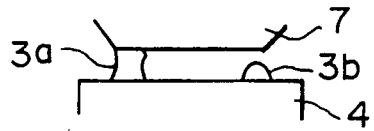
Figure 35D:
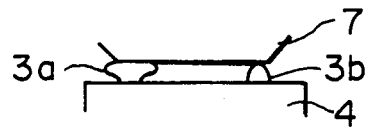
Figure 35E:

FIG. 35a corresponds to a state in which the tool 7 contacts none of the bumps 3 and is descending or being lowered with the initial pressure $f_o$ taken as the set value of pressure. FIG. 35b shows a state in which the tool 7 contacts the bump 3a in an equilibrium condition with the pressure $f_o$. FIG. 35c shows a state in which the tool 7 is being lowered while pressing down or crushing the bump 3a with a gradually increased pressure. Since the pressure applied assumes the minimum value necessary for continued crush of the bump 3a, no impact force or excess pressure is imposed on the bump 3a. FIG. 3d shows a state immediately before the tool 7 further lowered contacts the bump 3b. In this state, a predetermined number of bumps including the bump 3a have been pressed down by a pressure of $F_c - \Delta f$. FIG. 35e shows a state in which the tool 7 contacts the bump 3b and the set value of pressure is larger than $F_c$. Normal bonding starts from this state by use of a bonding load set to a predetermined value $F_b$.

The above-mentioned application example provides an effect that even if a difference in height of bumps 3 exists in each IC chip (or pellet) 4, any impact load imposed upon contact of the tool 7 with the bumps 3 can be suppressed to a value not larger than the predetermined initial pressure. Further, there is provided an effect that any excess pressure can be prevented from being applied onto a small number of bumps 3 at an initial stage of bonding.

According to the present embodiment, since parameters concerning a pressure to be applied are changeable during bonding, the setting of conditions conformable to characteristics or peculiarities of an object to which bonding is to be made and the alteration of algorithm are possible, which is effective for the reduction of damages to the chip.

Next, a method of heating the bonding tool used in the present invention will be explained.

Figure 36A:
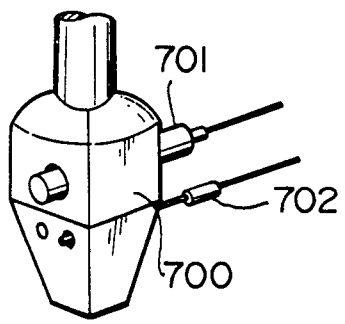
FIGS. 36a, 36b, 37a–37c and 38 are views showing structures for heating a bonding tool.

The conventional bonding tool 700 is usually made of Inconel and has a structure of FIG. 36a in which sintered diamond is disposed on a bonding portion.

Figure 36B:
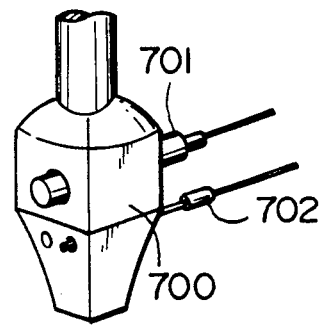
Figure 37A:
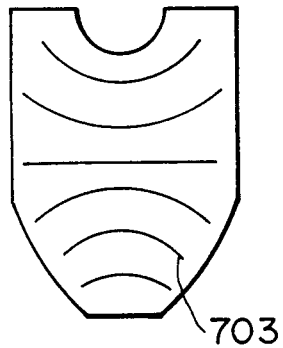
Figure 37B:
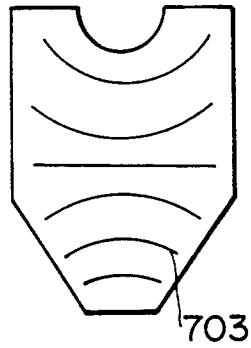
Figure 37C:
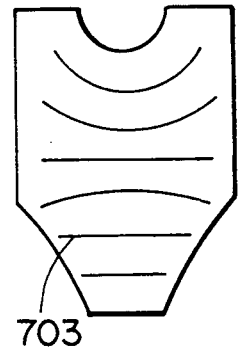

In order to improve the quality of bonding, it is required that the temperature of a bonding surface of the tip of the tool 7 is uniform. FIGS. 37a, 37b and 37c show the results of simulation of tool temperature distribution when various tool shapes are assumed. A concave tool shape shown in FIG. 37c exhibits the most uniform temperature distribution in tool. Therefore, the present inventors have manufactured a tool having such a shape shown in FIG. 36b for trial. The results of experiment have demonstrated that the temperature distribution in a bonding surface of the tool manufactured for trial is within $\pm 2°$ C. Accordingly, the quality of bonding can be improved by employing the tool shape shown in FIG. 36b.

In FIGS. 36 and 37, reference numeral 700 designates a bonding tool, numeral 701 a heater, numeral 702 a thermocouple, and numeral 703 an isotherm.

Figure 38:
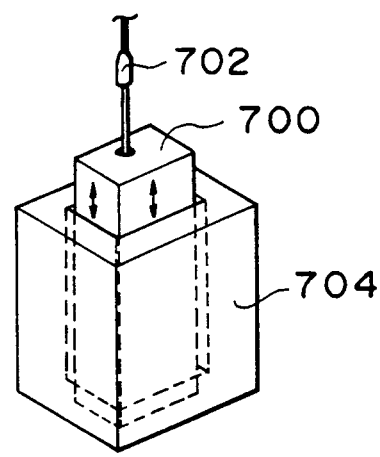

With the conventional tool shape, the tool 700 is heated by the buried heater 700 above the tool 700 as shown in FIG. 36a. The supply of heat to the bonding surface of the tool relies on thermal conduction through the Inconel tool 700. Therefore, the temperature distribution in tool results in one shown in FIG. 37b due to thermal loss by radiation from the tool surface, thereby making it difficult to make the temperature of the bonding portion uniform. Also, in the case where consecutive bonding is carried out, the decrease of the tool temperature takes place every bonding and several seconds are required for recovery, thereby resulting in the increase of a bonding tact time and the decrease of through-put. These problems can be solved by providing a structure as shown in FIG. 38 in which heat is supplied from a heater block 704 enclosing the tool 700 to make the temperature of the bonding portion uniform.

Figure 39A:
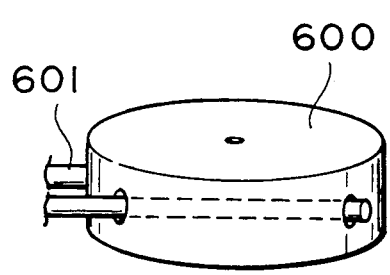
FIGS. 39a, 39b, 40a and 40b are views showing structures for heating and cooling a chip stage.

On the other hand, a TAB inner bonder has a problem that a thermal impact imposed on the chip is very large since the bonding temperature is as high as 450° to 550° C. More especially, because of the heating system involving the application of pressure, problems including damages of chips and deformation of tape by bonding become more severe as the size of a chip as well as the number of pins are increased. Therefore, the most of the conventional inner lead bonding apparatuses are designed such that a heater 601 having a bar shape or another shape is inserted through a stage 600, as shown in FIG. 39a, to allow pre-heating at about 250° C. However, this structure has one problem that almost no consideration is paid to the uniformity of the temperature distribution of the stage 600 and another problem that pressing upon bonding usually made with 3 to 10 Kgf may bring about the breakage of the heater 601.

Figure 39B:
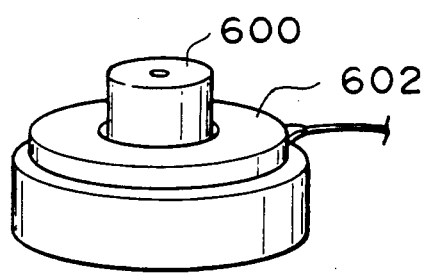

For such circumstances, an embodiment of the present invention proposes a structure in which a support stage 600 of the tool has a circular shape and is enclosed by a ring-like heater 602, as shown in FIG. 39b. With such a structure, a substantially uniform temperature distribution can be obtained on the stage. Further, since a load due to pressing upon bonding is not conducted to the heater 602, it is possible to prevent the heater 602 from being broken.

Figure 40A:
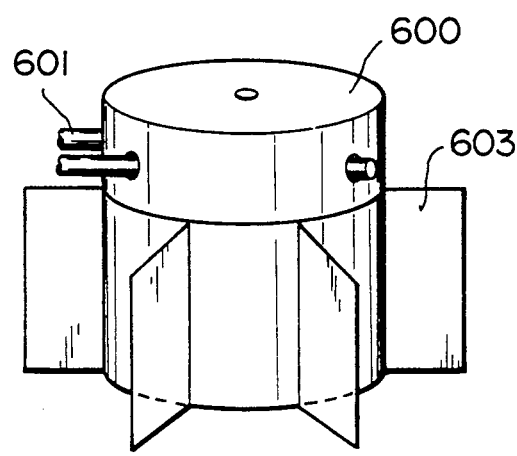

The stage of the conventional inner bonder is usually constructed such that the whole of the stage is placed on an $XY\theta$ table. Taking the generation of heat from the bonding tool or heat resulting from pre-heating into consideration, a cooling/adiabatic structure is employed for the stage 600, thereby preventing the deterioration of the precision of the $XY\theta$ table. Especially, in the case where pre-heating accompanied by the generation of a large amount of heat is positively made, there exists a structure in which a fan 603 or the like for heat dissipation is attached around the stage 603, as shown in FIG. 40a. In a multi-pin (more than 200 pins) inner lead bonder, this heat-dissipating structure is particularly important since extremely high precision is required for the alignment of leads and bumps.

Figure 40B:
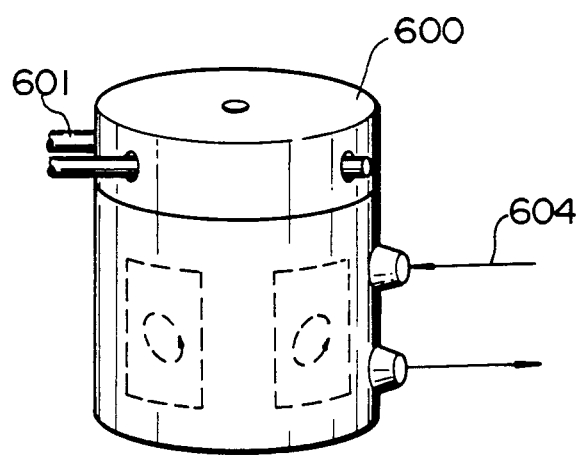

In order to provide more effective heat dissipation, an embodiment of the present invention proposes a water-cooled structure in which a cooling water path 604 is bored in a stage 600, as shown in FIG. 40b. With such a structure, the use of a pre-heating temperature higher than temperatures which have hitherto been used is possible and pre-heating up to 300° C. can be attained without substantially raising the temperature of a $XY\theta$ table.

Figure 41A:
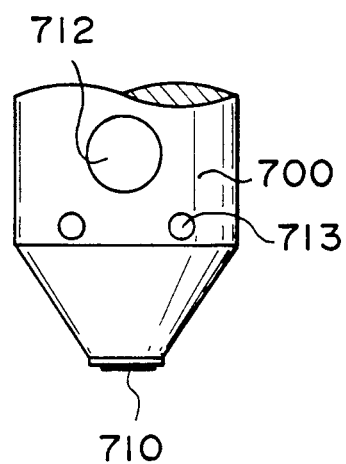
FIG. 41a is a view showing the structure of a tool in which sintered diamond is disposed on a bonding surface of the tool.

The conventional bonding tool 700 has a structure in which sintered diamond 710 is sticked or disposed on a bonding surface, as shown in FIG. 41a, in order to make the temperature in the bonding surface uniform and to minimize the adhesion of oxide from Sn-plated lead or the like. However, since the sintered diamond 710 is formed using Co as an auxiliary agent or assistant for sintering, Co atoms remain at grain boundaries of the sintered surface, etc. in a concentrated form and the oxide or the like may adhere to the Co atoms. Therefore, it is necessary to polish the sintered diamond surface every 10 to 50 IC's. The results of analysis have revealed that the adhered substances are mainly composed of $SnO_2$ with Co atoms as nuclei.

Figure 41B:
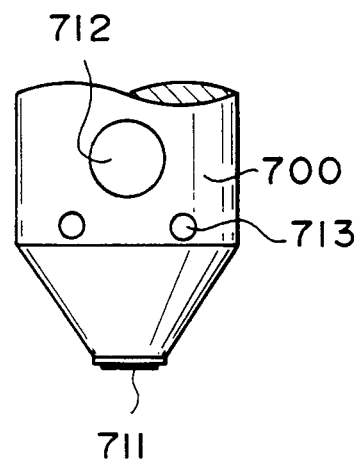
FIG. 41b is a view showing the structure of a tool in which a thin diamond film is disposed on a bonding surface of the tool.

For such circumstances and paying attention to the fact that a thin film of diamond can be formed through plasma CVD or the like, an embodiment of the present invention proposes a structure in which a diamond film 711 having a thickness of about 15 μm is formed on the bonding surface of a tool 700, as shown in FIG. 41b. The effectiveness of such a structure has been confirmed by the experiments of bonding. Namely, it has been found that the amount of substances adhereing to the surface of the tool is very little even if bonding is made for 100 IC's and that the polishing of the diamond film surface is very easy.

In FIGS. 41a and 41b, reference numeral 712 designates a hole for heater, and numeral 713 designates a hole for thermocouple.

In the conventional bonding stage, a material such as ceramic or stainless steel having a high rigidity is used as the stage material. Therefore, there is a problem that even if the parallelity between the bonding surface of the tool 700 and the chip involves a small deviation, the inferiority of bonding may be frequently generated due to the contact of only one side of the bonding surface of the tool 7 with the chip. This problem is remarkable as the size of the chip and the number of pins are increased. In other words, there is a problem that not only a long time is required for the adjustment of parallelity before the start of bonding but also trial bonding is required, thereby lowering the bonding yield. Also, in the conventional bonding system, since the chip, the stage and the tool are rigid, a very large impact force to give any damage to the chip may be generated the moment the tool contacts the chip.

Figure 42A:
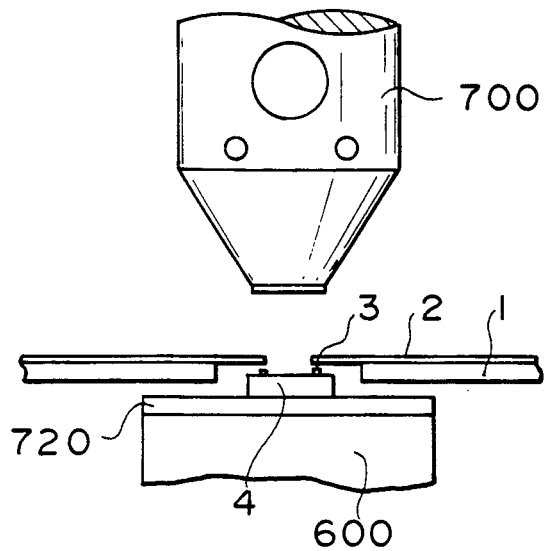
FIGS. 42a and 42b are views showing the structure of a stage on which an elastomer is disposed.
Figure 42B:
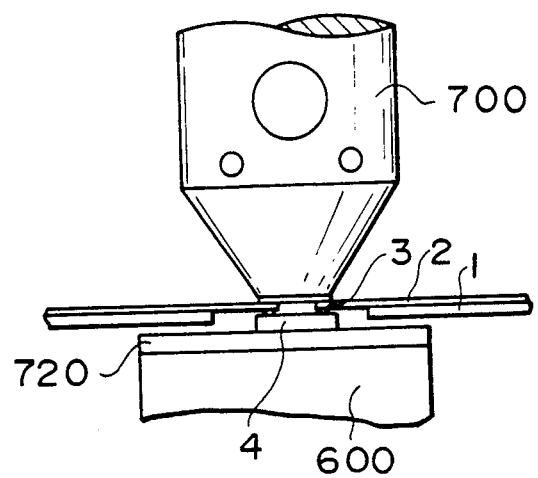

According to an embodiment of the present invention shown in FIGS. 42a and 42b, an elastomer 720 such as Tefron, silicone rubber or polyimide is disposed on a stage 600, thereby effectively absorbing a small deviation of the parallelity between the bonding surface of the tool 700 and the chip 4 as well as a possible impact force. The present inventors have confirmed an effect of the present embodiment by making experiments by use of a simplified structure in which a polyimide tape 157 μm thick is sticked on a ceramic stage. Namely, it has been confirmed that a bonding yield equivalent to that obtained by use of the conventional structure can be attained with a parallelity adjustment time of only 30 minutes though about three hours have hitherto been required for the adjustment of parallelity. FIG. 42a shows a state before bonding and FIG. 42b shows a state upon bonding.

Basically, the conventional stage has no structure for absorbing a deviation of parallelity between the bonding surface of the tool 700 and the chip 4. Even if the stage is provided with such a structure, the structure employed is limited to a mechanical spring structure. The spring structure is not sufficient to absorb the deviation of parallelity and an impact load upon bonding.

Figure 43:
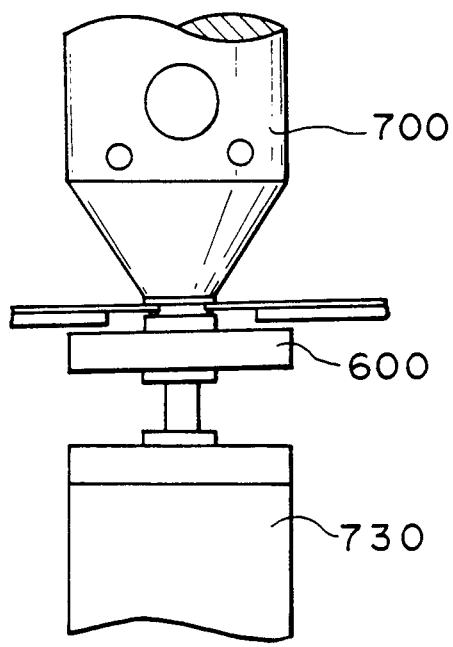
FIG. 43 is a view showing the structure of a stage to which a damper is attached.

The above problem can be solved by an embodiment of the present invention as shown in FIG. 43 made paying attention to viscous and tensile behaviours of a fluid such as water or oil. In the shown embodiment, a damper 730 utilizing a cylinder structure is attached below the stage 600. With such a construction, it has been found that a small deviation of parallelity (−2 μm/unit chip area) which may practically give rise to trouble can be absorbed and a bonding yield equivalent to that obtained by the conventional structure can be attained with a parallelity adjustment time of only 30 minutes though about three hours have hitherto been required. Further, it has been found that under the same condition, the occurrence of chip damages can be reduced to 1/10 or less as compared with the case of the conventional structure.

According to the present invention, highly precise alignment is possible and the precision attained upon alignment is maintained upon bonding as it is, thereby making it possible to improving the yield at an inner lead bonding process. Also, even if there is any difference or variation in height between bumps, no excess pressure and/or impact force are imposed on leads and/or bumps, thereby preventing the occurrence of bonding inferiority including the cracking of chips, the breakage of leads and the peeling-off of leads. Further, effective thermocompression bonding is attainable, for example, by making the temperature distribution of a tool uniform.

We claim:

1. A TAB inner lead bonding method comprising the steps of:
    detecting a position of inner leads formed on a carrier tape at a bonding station;
    disposing the inner leads and an IC chip having bumps formed on a surface thereof opposite to each other at the bonding station;
    aligning the inner leads and the IC chip with each other at the bonding station;
    bonding the inner leads and the IC chip to each other after the alignment of the inner leads and the IC chip with each other has been made; and further
    detecting a position of the inner leads and bringing the inner leads into a pressing surface of a bonding tool; and
    thereafter detecting the positions of the inner leads again and aligning the IC chip with the inner leads with the detected lead position taken as a target position.

2. A TAB inner lead bonding method comprising the steps of:
    disposing an IC chip having bumps formed on a surface thereof and inner leads formed on a carrier tape opposite to each other at a bonding station;
    detecting a position of the IC chip on a stage through the inner leads at the bonding station to determine the amount of correction for position of the stage so that the inner leads and the IC chip are aligned with each other;
    bonding the inner leads and the IC chip to each other after the alignment of the inner leads and the IC chip with each other has been made; and further
    performing fall-down illumination which is perpendicular to the surfaces of the IC chip and the carrier tape; and
    determining the position of the IC chip on the basis of an image detected by the fall-down illumination;
    wherein a bump position is determined as the chip position by searching an edge of the bump of the IC chip from a waveform of projection of the detected image in horizontal and vertical directions with a preliminary determined lead position taken as a search start point.

3. A TAB inner lead bonding method comprising the steps of:
   disposing an IC chip having bumps formed on a surface thereof and inner leads formed on a carrier tape opposite to each other at a bonding station;
   detecting a position of the IC chip on a stage through the inner leads at the bonding station to determine the amount of correction for position of the stage so that the inner leads and the IC chip are aligned with each other;
   bonding the inner leads and the IC chip to each other after the alignment of the inner leads and the IC chip with each other has been made; and further performing fall-down illumination which is perpendicular to the surfaces of the IC chip and the carrier tape; and
   determining the position of the IC chip on the basis of an image detected by the fall-down illumination;
   wherein a plurality of points corresponding to straight line portions of the periphery of the IC chip in horizontal and vertical directions are extracted from the detected image while masking, portions which disappear lying below the inner leads, by use of preliminarily determined inner lead position data, and a chip corner position is detected as the chip position from a point of intersection of approximate lines of the extracted point in the horizontal and vertical directions.

4. A TAB inner lead bonding method comprising the steps of:
   disposing an IC chip having bumps formed on a surface thereof an inner leads formed on a carrier tape opposite to each other at a bonding station;
   detecting a position of the IC chip on a stage through the inner leads at the bonding station to determine the amount of correction for position of the stage so that the inner leads and the IC chip are aligned with each other;
   bonding the inner leads and the IC chip to each other after the alignment of the inner leads and the IC chip with each other has been made; and further establishing two fields of view at two corner portions of the IC chip, respectively;
   determining a position of the inner leads and a position of the IC chip in each of the two fields of view;
   determining the amounts of correction for position in X, Y and $\theta$ directions on the basis of position data of the inner leads and the IC chip in the two fields of view, positions of the two fields of view, and a position of the center of rotation of an XY$\theta$ stage on which the IC ship is placed; and
   aligning the inner leads and the IC chip with each other in accordance with the determined amounts of correction;
   wherein the amounts of correction for position in the X, Y and $\theta$ directions are determined using as said position data in the fields of view a lead position determined from a pair of inner leads in each of the fields of view in horizontal and vertical directions, a chip corner position corresponding to a point of intersection of straight line portions of the periphery of the IC chip, and a difference between said lead position and said chip position in a state in which the inner leads and the IC chip are aligned with each other.

5. A TAB inner lead bonding method comprising the steps of:
   disposing an IC chip having bumps formed on a surface thereof and inner leads formed on a carrier tape opposite to each other at a bonding station;
   detecting a position of the IC chip on a stage through the inner leads at the bonding station to determine the amount of correction for position of the stage so that the inner leads and the IC chip are aligned with each other;
   bonding the inner leads and the IC chip to each other after the alignment of the inner leads and the IC chip with each other has been made; and further establishing two fields of view at two corner portions of the IC chip, respectively;
   determining a position of the inner leads and a position of the IC chip in each of the two fields of view;
   determining the amounts of correction for position in X, Y and $\theta$ directions on the basis of position data of the inner leads and the IC chip in the two fields of view, positions of the two fields of view, and a position of the center of rotation of an XY$\theta$ stage on which the IC chip is placed; and
   aligning the inner leads and the IC chip with each other in accordance with the determined amounts of correction;
   wherein two amounts of correction for position in the X, Y and $\theta$ directions are determined using, as said position data in the fields of view, average positions of inner leads in each of the fields of view in horizontal and vertical directions and average positions of bumps in each of the fields of view in the horizontal and vertical directions.

6. A TAB inner lead bonding method comprising the steps of:
   disposing an IC chip having bumps formed on a surface thereof and inner leads formed on a carrier tape opposite to each other at a bonding station;
   detecting a position of the IC chip on a stage through the inner leads at the bonding station to determine the amount of correction for position of the stage so that the inner leads and the IC chip are aligned with each other;
   bonding the inner leads and the IC chip to each other after the alignment of the inner leads and the IC chip with each other has been made; and further establishing two fields of view at two corner portions of the IC chip, respectively;
   determining a position of the inner leads and a position of the IC chip in each of the two fields of view;
   determining the amounts of correction for position in X, Y and $\theta$ directions on the basis of position data of the inner leads and the IC chip in the two fields of view, positions of the two fields of view, and a position of the center of rotation of an XY$\theta$ stage on which the IC chip is placed; and
   aligning the inner leads and the IC chip with each other in accordance with the determined amounts of correction;
   wherein the amounts of correction for position in the X and Y directions determined paying attention to the positions of the inner leads and the position of the chip in one of the two fields of view are determined in the two fields of view, respectively, and average values of the amounts of correction in the X and Y directions determined in the two fields of view are used as the amounts of correction for position of the XY$\theta$ stage having the IC chip placed thereon to perform the alignment.

7. An alignment method according to claim 6, wherein when each of the amounts of correction for position in the X and Y directions is smaller than a resolution of the XYθ stage in the θ direction and the amount of deviation in position between the inner leads and the chip in each of the fields of view is larger than a target alignment precision, a position deviation vector directed from the chip position to the lead position in each of the fields of view is determined, and when each of X and Y components of a vector of sum of the position deviation vectors in the fields of view is smaller than a preset value, the impossibility of alignment is determined and the bonding is suppressed.

8. A TAB inner lead bonding method comprising the steps of:

disposing an IC chip having bumps formed on a surface thereof and inner leads formed on a carrier tape opposite to each other at a bonding station;

detecting a position of the IC chip on a stage through the inner leads at the bonding station to determine the amount of correction for position of the stage so that the inner leads and the IC chip are aligned with each other:

bonding the inner leads and the IC chip to each other after the alignment of the inner leads and the IC chip with each other has been made; and further establishing two fields of view at two corner portions of the IC chip, respectively;

determining a position of the inner leads and a position of the IC chip in each of the two fields of view;

determining the amounts of correction for position in X, Y and θ directions on the basis of position data of the inner leads and the IC chip in the two fields of view, positions of the two fields of view, and a position of the center of rotation of an XYθ stage on which the IC chip is placed; and aligning the inner leads and the IC chip with each other in accordance with the determined amounts of correction;

wherein when one of the two diagonal corner portions of the IC chip is not detectable in either one of the two fields of view, the positions of the IC chip is corrected in only the X and Y directions except the θ direction by use of the position data in the field of view in which the other diagonal corner portion of the IC chip is detectable, and after the correction has been made, a position of the IC chip is detected again to stop the alignment in the case where one of the two diagonal corner portions of the IC chip is not detectable in either one of the two fields of view and to perform the alignment in the case where the two diagonal corner portions are detected in the two fields of view, respectively.

9. An alignment method according to claim 4, wherein before automatic alignment is performed, the IC chip and the inner leads are aligned with each other in a manipulative manner, and position data in the fields of view to be used for the automatic alignment, that is, the lead position determined from a pair of inner leads in each of the fields of view in the horizontal and vertical directions and the chip corner position corresponding to a point of intersection of straight line portions of the periphery of the IC chip are determined in a state the manipulative alignment has been made, so that a difference between said lead position and said chip corner position is automatically determined.

10. A TAB inner lead bonding method comprising the steps of:

disposing an IC chip having bumps formed on a surface thereof and inner leads formed on a carrier tape opposite to each other at a bonding station;

detecting a position of the IC chip on a stage through the inner leads at the bonding station to determine the amount of correction for position of the stage so that the inner leads and the IC chip are aligned with each other;

bonding the inner leads and the IC chip to each other after the alignment of the inner leads and the IC chip with each other has been made; and further wherein after the alignment has been completed, the carrier tape is lowered to bring the inner leads on the carrier tape into contact with the bumps on the IC chip, and thereafter the bonding is performed, and in which after the completion of the alignment, the IC chip and the inner leads are aligned in a shifted state to compensate for the shifts of the inner leads in the X and Y directions which may generate upon lowering of the carrier tape due to any mechanical factor.

11. A TAB inner lead bonding method comprising the steps of:

disposing an IC chip having bumps formed on a surface thereof and inner leads formed on a carrier tape opposite to each other bonding station;

detecting a position of the IC chip on a stage through the inner leads at the bonding station to determine the amount of correction for position of the stage so that the inner leads and the IC chip are aligned with each other;

bonding the inner leads and the IC chip to each other after the alignment of the inner leads and the IC chip with each other has been made; and further wherein after the alignment has been completed, the carrier tape is lowered to bring the inner leads on the carrier tap into contact wit the bumps on the IC chip, and thereafter the bonding is performed, and further detecting a position of the inner leads again in a state in which the inner leads on the carrier tape are in contact with the bumps on the IC chip by the lowering of the carrier tape after the completion of the alignment; and comprising the detected position of the inner leads with a position of the inner leads before the lowering of the carrier tape to automatically measure the amounts of shift of the inner leads in the X and Y directions which may generate upon lowering of the carrier tape due to any mechanical factor.

12. A TAB inner lead bonding method comprising the steps of:

disposing an IC chip having bumps formed on a surface thereof an inner leads formed on a carrier tape opposite to each other at a bonding station;

detecting a position of the IC chip on a stage through the inner leads at the bonding station to determine the amount of correction for position of the stage so that the inner leads and the IC chip are aligned with each other;

bonding the inner leads and the IC chip to each other after the alignment of the inner leads and the IC chip with each other has been made; and further r wherein the bonding of the inner leads and the IC chip after the alignment thereof is made through compression by a bonding tool in a state in which a positional relationship between the inner leads and the IC chip is fixed, wherein after the alignment has been completed, a bonding tool is disposed opposite to said inner leads and the IC chip, and the approach of said bonding tool to the inner leads and the IC chip, the contact of said bonding tool with the inner leads and the IC chip and the pressure application by said bonding tool to the inner leads and the IC chip are carried out while measuring a pressure which acts between said bonding tool and the IC chip through the inner leads and the bumps, and wherein a value for the measured pressure is continuously compared with a predetermined value, a driving force for effecting the approach of said bonding tool to the inner leads and the IC chip, the contact of said bonding tool with the inner leads and the IC chip and the pressure application by said bonding tool to the inner leads and the IC chip is continuously changed by use of a result of the comparison.

13. A TAB inner lead bonding method in which the alignment of bumps of an IC chip with inner leads provided on a tape in A TAB inner lead bonding apparatus is carried out in a state in which the center axis of rotation of a chip stage is aligned with the optical axis of an optical system for detecting a position of the inner leads and the center of a bonding hole of a sprocket and a guide for holding the tape is aligned with the optical axis of said optical system, the center of a bonding surface of a bonding tool is aligned with a reference position after the completion of the alignment of the inner leads and the bumps, and said bonding tool is lowered toward the IC chip while detecting a repulsive force of said bonding tool, thereby imposing a predetermined load on the IC chip to compress-bond the inner leads and the bumps to each other.

14. A TAB lead bonding method comprising the steps of:
disposing an IC chip having bumps formed on a surface thereof and inner leads formed on a carrier tape opposite to each other at a bonding station;
detecting a position of the IC chip on a stage through the inner leads at the bonding station to determine the amount of correction for position of the stage so that the inner leads and the IC chip are aligned with each other;
bonding the inner leads and the IC chip to each other after the alignment of the inner leads and the IC chip with each other has been made; and further
wherein the bonding of the inner leads and the IC chip after the alignment thereof is made through compression by a bonding tool in a state in which a positional relationship between the inner leads and the IC chip is fixed,
wherein said bonding tool is maintained at a predetermined temperature by a heater block which encloses said bonding tool, and said bonding tool is disengaged from said heater block and is moved to a predetermined location when the inner leads and the IC chip being bonded to each other through thermocompression by said bonding tool.

15. A TAB inner lead bonding method in which alignment and bonding of an IC chip and inner leads formed on a carrier tape are performed on one and the same stage, the method comprising the steps of:
disposing an IC chip having bumps formed on a surface thereof and inner leads formed on a carrier tape so that they overlap each other on a stage;
illuminating the IC chip and the inner leads with different illuminating systems;
optically detecting positions of the IC chip and the inner leads to determine an amount of correction;
correcting the position of the IC chip by use of the amount of correction to align the IC chip and the inner leads with each other; and
bonding the inner leads and the IC chip to each other.

16. A TAB inner lead bonding method according to claim 15, wherein the inner leads and the IC chip are bonded to each other through thermocompression in such a manner that a stage on which the IC chip is placed is heated by a heater having an annular shape.

17. A TAB inner lead bonding method according to claim 16, wherein the stage is cooled in a water-cooled manner.

18. A TAB inner lead bonding method according to claim 15, wherein said stage on which the IC chip is placed is held by means of a fluid pressure and the inner leads and the IC chip are compress-bonded to each other on said stage.

19. A TAB lead bonding method according to claim 15, in which the different illuminating systems include a fall-down illumination system and an oblique illumination system.

20. A TAB inner lead bonding method according to claim 19, in which the fall-down illumination system is used to detect positions of the bumps of the IC chip.

21. A TAB lead bonding method according to claim 20, in which the oblique illumination system is used to detect positions of the inner leads on the carrier tape.

* * * * *